(12) United States Patent
Yonehara et al.

(10) Patent No.: US 6,468,923 B1
(45) Date of Patent: Oct. 22, 2002

(54) METHOD OF PRODUCING SEMICONDUCTOR MEMBER

(75) Inventors: Takao Yonehara, Atsugi; Kunio Watanabe, Kawasaki; Tetsuya Shimada, Zama; Kazuaki Ohmi; Kiyofumi Sakaguchi, both of Yokohama, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/534,340

(22) Filed: Mar. 24, 2000

(30) Foreign Application Priority Data

Mar. 26, 1999 (JP) .................................. 11-084613
Mar. 26, 1999 (JP) .................................. 11-084646
Mar. 24, 2000 (JP) .................................. 2000-085019

(51) Int. Cl.$^7$ ................................................ H01L 21/31
(52) U.S. Cl. ..................................... 438/761; 438/455
(58) Field of Search ........................... 438/761, 762, 438/455, 458

(56) References Cited

U.S. PATENT DOCUMENTS

| | | | |
|---|---|---|---|
| 5,371,037 A | 12/1994 | Yonehara | 437/86 |
| 5,374,564 A | 12/1994 | Bruel | 437/24 |
| 5,458,755 A | 10/1995 | Fujiyama et al. | 204/224 R |
| 5,726,464 A | 3/1998 | Kumomi et al. | 257/103 |
| 5,811,348 A | * 9/1998 | Matsushita et al. | |
| 5,856,229 A | 1/1999 | Sakaguchi et al. | 438/406 |
| 5,966,620 A | 10/1999 | Sakaguchi et al. | 438/455 |
| 6,107,213 A | * 8/2000 | Tayanaka | |

FOREIGN PATENT DOCUMENTS

| | | | |
|---|---|---|---|
| EP | 793263 | * | 9/1997 |
| JP | 5-211128 | | 8/1993 |
| JP | 7-302889 | | 11/1995 |
| JP | 8-213645 | | 8/1996 |
| JP | 2608351 | | 2/1997 |
| JP | 10-200080 | | 7/1998 |
| JP | 10-233352 | | 9/1998 |
| WO | 98/52216 | | 11/1998 |
| WO | WO98/52216 | * | 11/1998 |
| WO | 99/06110 | | 2/1999 |

OTHER PUBLICATIONS

William G. En et al.; "The Genesis Process™: A New SOI wafer fabrication method"; Proceedings 1998 IEEE International SOI Conference, Oct. 1998.

* cited by examiner

*Primary Examiner*—Caridad Everhart
(74) *Attorney, Agent, or Firm*—Fitzpatrick, Cella, Harper & Scinto

(57) ABSTRACT

A method of producing a semiconductor member comprises a first step of preparing a first member having a non-porous layer on a semiconductor substrate, and a second step of transferring the non-porous layer from the first member onto a second member, wherein use of the semiconductor substrate from which the non-porous layer is separated in the second step as a constituent material of the first member in the first step is conducted (n-1) times ("n" is a natural number not less than 2), the first and second steps are repeated n times, the semiconductor substrate is separated in n-th use in the second step and the separated semiconductor substrate is used for an use other than that of the first and second steps.

41 Claims, 18 Drawing Sheets

ONE SHEET OF EP-WAFER n SHEETS OF SOI WAFER

METHOD OF PRODUCING SEMICONDUCTOR MEMBER

BACKGROUND OR THE INVENTION

1. Field of the Invention

The present invention relates to a method of producing a semiconductor member and a method of utilizing it. Specifically, the present invention relates to a method of producing semiconductor wafers which are used for production of semiconductor devices such as micro processors, memories, logic circuits, system LSIs, solar cells, image sensors, light-emitting elements, display elements, etc., or which are monitor wafers to be used for film thickness monitoring at the time of film formation, etched-depth monitoring at the time of etching, particle monitoring to be used for detection of foreign matter particles as well as measurement of the number thereof, etc., dummy wafers to be disposed in treatment apparatuses for use in order to make good various treatment conditions such as film forming, heat treatment, doping, etching, etc.; and a method of using the wafers as well as a method of utilizing the wafers. Further, the present invention relates to a system of producing two kind of semiconductor wafers, a method of controlling production of the semiconductor wafers and a method of utilizing a deposited-film forming apparatus.

2. Related Background Art

Semiconductor wafers include wafers having layers of various semiconductor materials such as Si, GaAs, InP, GaN, etc. Among others, an SOI wafer which has a semiconductor layer on a supporting substrate having an insulating surface catches attention as a wafer appropriate for production of semiconductor devices capable of high speed operation with low power consumption.

The SOI wafers include known SIMOX wafers subjected to an oxygen ion implanting step and a heat treatment step, bonding wafers subjected to a hydrogen ion implanting step and a peeling step which are described in Japanese Patent Application Laid-Open No. 5-211128 (U.S. Pat. No. 5,374, 564) and Japanese Patent Application Laid-Open No. 10-200080 (U.S. Pat. No. 5,966,620), and bonding wafers using plasma etching described in International Application Publication No. WO98/52216,etc. In addition, as a production method for excellent SOI wafers, a method of transferring an epitaxial layer another supporting substrate material is proposed in Japanese Patent Application Laid-Open No. 2608351 (U.S. Pat. No. 5,371,037).

Moreover, an improved method for transferring an epitaxial layer is proposed in Japanese Patent Application Laid-Open No. 7-302889 (U.S. Pat. No. 5,856,229). This method will be specifically described below.

FIGS. 19A to 19E are schematic views showing a method of transferring an epitaxial layer which is described in Japanese Patent Application Laid-Open No. 7-302889.

Firstly, as shown in FIG. 19A, an Si wafer 1 is prepared as a first wafer (which in some cases is called as prime wafer, bond wafer, device wafer, seed wafer, donor wafer, etc.), and a surface layer thereof subjected to anodization and made porous to form a porous layer 4.

Next, as shown in FIG. 19B, a CVD method, etc. is applied to epitaxially grow a non-porous single-crystalline semiconductor layer 5 on the porous layer 4.

Moreover, as shown in FIG. 19C, a surface of the non-porous single-crystalline semiconductor layer 5 is oxidized to form an insulating layer 6. The insulating layer 6 is bonded onto a surface of a separately prepared second wafer 2 (Si wafer or silica glass, etc.). Thus a multilayer structure 100 having the non-porous single-crystalline semiconductor layer 5 inside is obtained.

As shown in FIG. 19D, when a wedge is struck into a side surface of this multilayer structure 100 or when external force or internal stress is applied so as to separate the multilayer structure, the multilayer structure 100 is divided at a porous layer portion (reference numerals 41 and 42 in FIG. 19D denote separated porous layers).

A porous layer 42 left on a surface of the non-porous single-crystalline semiconductor layer 5, i.e., an epitaxial layer which is transferred onto the above-described second wafer 2 (which are referred to as a handle wafer or a base wafer, etc., in some cases) is subjected to wet etching with a mixed liquid of fluoric acid and hydrogen peroxide solution to be removed.

In addition, as shown in FIG. 19E, an exposed surface of the epitaxial layer is flattened by hydrogen annealing, etc. to complete an SOI wafer.

On the other hand, since a separated Si wafer 1 maintains its shape as a wafer, a porous layer left on its separation surface is etched with the above-described mixed liquid, etc. and polished, and the separated wafer can be used so as to produce another SOI wafer as the first wafer shown in FIG. 19A again.

Alternatively, the separated wafer can be used as a second wafer 2 shown in FIG. 19B so as to produce another SOI wafer.

As described above, the above-described Japanese Patent Application Laid-Open No. 7-302889 describes that the peeled Si wafer 1 is used as the first wafer shown in FIG. 19A or the second wafer 2 shown in FIG. 19B.

However, the above-described method has several potential problems to be solved.

That is, it is desirable that a number of SOI wafers are produced using less sheets of wafer as much as possible, but one wafer subjected to a plurality of uses in production steps of SOI wafers is finally discarded. This will not be adjusted to industry in the near future when decrease of wastes generation and efficient use of resources will be expected.

In addition, in the case where an Si wafer is reused some times as the first wafer, the first wafer loses its film thickness every time of reuse due to a step of making a wafer porous and a step of removing a porous layer after separation. Accordingly, in the case where the,wafer is reused some times, difference in thickness of a wafer not reused and the above-described reused wafer becomes remarkable. In such a case where the, wafer is subjected to a treatment step depending on thickness of wafers again as in step of making a wafer porous, significant difference in thickness for respective wafers will presumably make setting or adjustment of various treatment conditions time-consuming.

In addition, when a multilayer structure is formed, the thickness of the first wafer sensitively affects wrap of the multilayer structure in some cases.

Further, it is considered that damages stored due to the repeated separation steps adversely affect the subsequent step of making a wafer porous and the like, whereby SOI wafers having desired characteristics are not obtained.

That is, in conventional reuse method, it is only considered that a reusable first wafer obtainable by SOI wafer-producing steps is repeatedly used in the same SOI wafer producing steps, and therefore the above-described problems are considered.

SUMMARY OF THE INVENTION

An object of the present invention is to provide a method of producing semiconductor wafers having efficient and economical application mode of wafers.

In addition, another object of the present invention is to provide a semiconductor wafer-producing system which enables efficient and economical application of semiconductor wafers.

A method of producing a semiconductor wafer according to the present invention comprises a first step of forming a first member having a non-porous layer on a semiconductor substrate, and a second step of separating the non-porous layer from the first member and transferring the non-porous layer onto a second member, wherein use of the semiconductor substrate from which the non-porous layer is separated in the second step as a constituent material of the first member in the first step is conducted (n−1) times ("n" is a natural number not less than 2), the first and second steps are repeated n times, the semiconductor substrate is separated in n-th use in the second step and the separated semiconductor substrate is used for an use other than that of the first and second steps. The first member can be formed the non-porous layer on the semiconductor substrate through a separation layer.

A method of producing a semiconductor member according to the present invention comprises a first step of preparing a first member having a non-porous layer on a semiconductor substrate, and a second step of transferring the non-porous layer from the first member onto a second member, wherein use of the semiconductor substrate from which the non-porous layer is separated in the second step as a constituent material of the first member in the first step is conducted (n−1) times ("n" is a natural number not less than 2), the first and second steps are repeated n times, the semiconductor substrate is separated in n-th use in the second step and the separated semiconductor substrate is used for an use other than that of the first and second steps.

Particularly, in the present invention, the first member has the non-porous layer on the semiconductor substrate through a separation layer, and the second step includes a step of bonding the first and second members to each other with positioning the-non-porous layer inside to form a multilayer structure and separating the multilayer structure at the separation layer.

In the present invention, the purpose other than the first and second steps can be to sale the semiconductor substrate separated in the n-th use in the second step and to produce an epitaxial wafer using the semiconductor substrate and sale it.

The above-described separation layer can be a layer formed by anodization or an ion-implanted layer formed by implanting ions such as hydrogen ions into a layer.

In the method of the present invention, the step of preparing the first member can include: a step of forming a first epitaxial semiconductor layer on the semiconductor substrate; a step of making at least a part of the first epitaxial semiconductor layer porous to a porous layer; and a step of forming the non-porous layer on the porous layer, thereby preparing the first member.

In the method of the present invention, the step of preparing the first member can include: a step of forming, on the semiconductor substrate, a first semiconductor layer which is an epitaxial layer, a second semiconductor layer different in impurity concentration or conductivity type from the first semiconductor layer in this order from the semiconductor substrate side; a step of making at least a part of the first and second semiconductor layers porous to form a porous layer; and a step of forming the non-porous layer on the porous layer, thereby preparing the first member.

In the method of the present invention, the semiconductor substrate can be a p-type semiconductor substrate, the first semiconductor layer can have a concentration of an impurity for controlling a p-type conductivity smaller than that of the semiconductor substrate, and the second semiconductor layer can have a concentration of an impurity for controlling a p-type conductivity larger than that of the first semiconductor layer.

In the method of the present invention, the step of preparing the first member can include: a step of forming a first epitaxial semiconductor layer on the semiconductor substrate; and a step of forming an ion-implanted layer inside the first epitaxial semiconductor layer, thereby preparing the first member.

In the method of the present invention, the step of preparing the first member can include: a step of forming, on the semiconductor substrate, a first semiconductor layer which is an epitaxial layer, a second semiconductor layer different in impurity concentration or conductivity type from the first semiconductor layer in this order from the semiconductor substrate side; and a step of forming an ion-implanted layer inside the first semiconductor layer and/or the second semiconductor layer, thereby preparing the first member.

The second member can have an insulating layer on a surface thereof.

The second step can comprises flattening the surface of the semiconductor substrate obtained by separating the non-porous layer from the first member in the second step.

The flattening is conducted by surface-polishing, etching and heat-treating of the semiconductor substrate.

The method of the present invention further comprises a inspection step of conducting at least one of surface foreign matter particle density inspection, thickness distribution, defect density inspection, surface shape inspection or edge inspection, after the surface flattening treatment of the semiconductor substrate used n times in production of the semiconductor member.

In the method of the present invention, n can be determined by subjecting the semiconductor substrate, which is obtained by separating the non-porous layer from the first member in the second step, to a inspection step of conducting at least one of surface foreign matter particle density inspection, thickness distribution, defect density inspection, surface shape inspection or edge inspection.

In the method of the present invention, the semiconductor member can be an SOI wafer, and after the semiconductor substrate is used in the first and second steps two times or more, the semiconductor substrate can be used to produce an epitaxial wafer for an use other than that of the method of producing the semiconductor member.

In the method of the present invention, the use other than that of the first and second steps is production of an epitaxial wafer, and the above-described value n can be defined corresponding to the number of ordered sheets of epitaxial wafer which is recorded in a computer.

The method of utilizing a semiconductor substrate according to the present invention comprises applying a semiconductor substrate used plural times in production steps of a bonding SOI wafer to an use other than that of the production steps of the bonding SOI wafer.

The use other than that of the production steps of the bonding SOI wafer includes sale of the semiconductor substrate used plural times.

The use other than that of the production steps of the bonding SOI wafer includes production of an epitaxial wafer by using the semiconductor substrate used plural times and sale of the epitaxial wafer.

The system of producing a semiconductor member according to the present invention is a system of producing two kinds of semiconductor members, which comprises a step of using a semiconductor member obtained from SOI substrate production steps utilizing a bonding method in the SOI substrate production steps n times (n24 2), and a step of producing an epitaxial wafer for an use other than that of the SOI substrate production steps by using the semiconductor member used plural times.

The method of controlling the production of a semiconductor member according to the present invention, which comprises using a semiconductor substrate in bonding SOI wafer production steps n times (n>2) to produce n sheets of SOI wafer, utilizing the semiconductor substrate as an epitaxial wafer for an use other than that of the bonding SOI substrate production steps, and controlling use times n to adjust the production amounts of the SOI wafer and the epitaxial wafer.

The method of utilizing a deposited film-forming apparatus according to the present invention comprises commonly using a deposited film-forming apparatus for forming an epitaxial wafer having an epitaxial layer on a semiconductor substrate for use in production steps of a plurality of sheets of bonding SOI wafer and a deposited film-forming apparatus for forming an epitaxial wafer in which the semiconductor substrate is applied to an use other than that of the production steps of the SOI wafer.

The production method of the present invention further comprises a step of heat-treating the multilayer structure in an oxidizing atmosphere.

DESCRIPTION OF THE PREFERRED EMBODIMENTS

Figure 1:
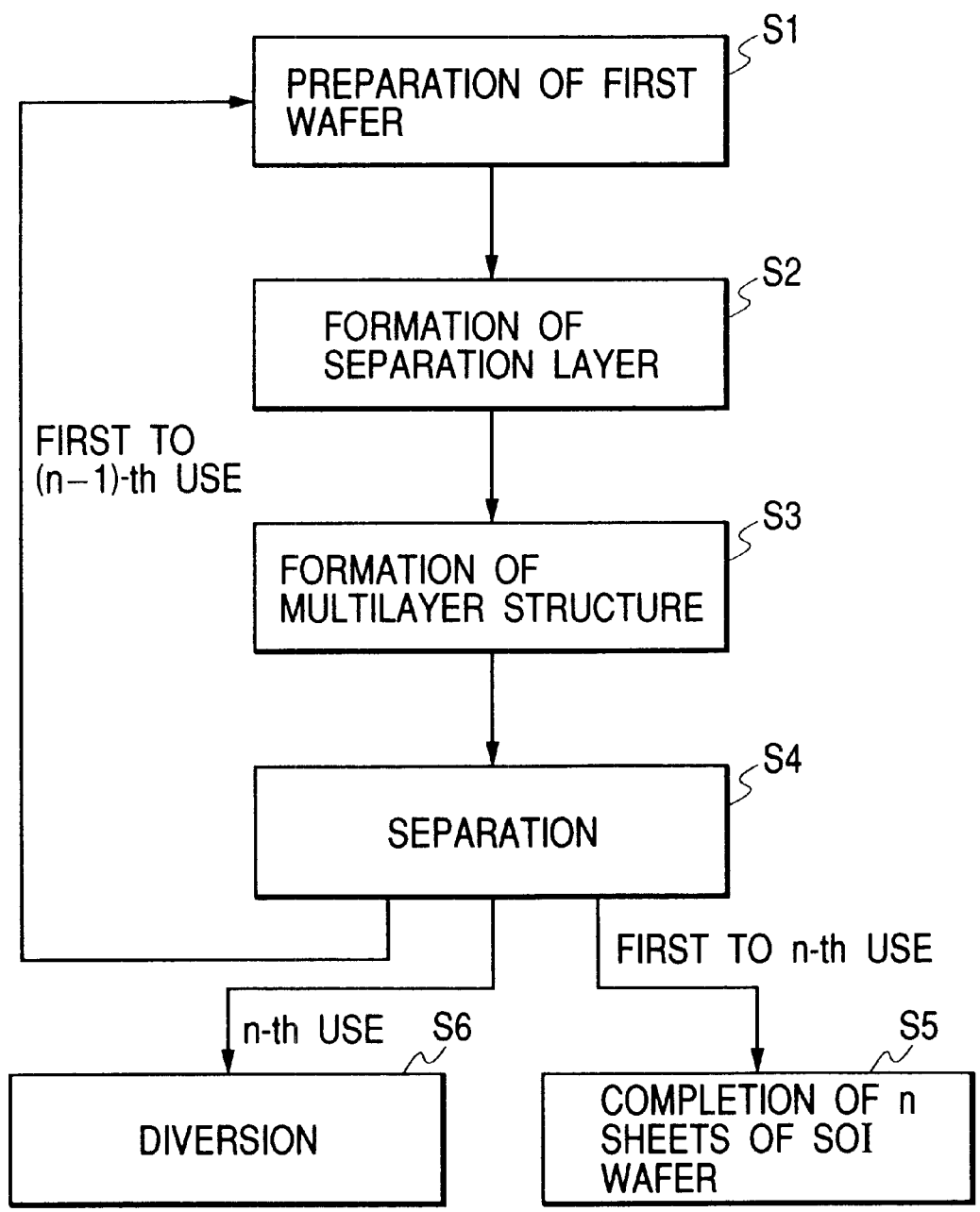
FIG. 1 is a flow chart showing a method of producing a semiconductor member according to a basic embodiment of the present invention.

FIG. 1 shows a flow chart on a method of producing semiconductor wafers according to a basic embodiment of the present invention.

Firstly, a semiconductor wafer is prepared as a first wafer as shown in a step S1 in FIG. 1. As the semiconductor wafer, SOI wafer as well as non-SOI wafer can be used without raising any questions, and especially, non-SOI wafers such as CZ wafers, MCZ wafers, FZ wafers, epitaxial wafers, wafers treated with hydrogen annealing, intrinsic gettering (IG) wafers, etc. are preferably used.

Next, as in a step S2, a separation layer is formed in the semiconductor wafer, and a first member having a single-crystalline semiconductor layer through the separation layer on the semiconductor substrate is formed.

The method of forming the separation layer is roughly divided into two kinds, and one is a method in which a porous layer is formed and thereafter a non-porous layer is formed on a surface thereof. The non-porous layer is formed by a method in which epitaxial growth is conducted on a porous layer and a method in which a surface of a porous layer is heat-treated under an atmosphere containing hydrogen, and the like.

The other separation layer forming method is a method in which a layer including microcavities generated by implanting heteroelements such hydrogen ions, rare gas ions, and nitrogen ions, etc. into the first wafer or a layer including potential microcavities which can generate microcavities by a subsequent heat treatment is formed at a predetermined-depth position distant from a surface of the first wafer.

In any case, prior to formation of the separation layer, a single-crystalline semiconductor layer having a predetermined thickness may be formed on a surface of the semiconductor wafer so that the separation layer is formed inside the semiconductor layer.

A layer on the separation layer is selected from a single-crystalline semiconductor layer, a polycrystalline semiconductor layer, or an amorphus semiconductor layer, etc. Specifically, Si, Ge, SiGe, SiC, C, GaAs, GaN, AlGaAs, InGaAs, InP, and InAs, etc. are included. Moreover, the surfaces of these semiconductor layers may be subjected to thermal oxidation, CVD, and spattering, etc. so as that an insulating layer of silicon oxide, silicon nitride, and silicon nitride-oxide, etc. is formed thereon.

Incidentally, in the case where any separation layer is not formed in advance, as described later, after a multilayer structure is formed and is cut at an appropriate position, or a boundary face for generating a stress is formed to give rise to stress and separation is conducted at the boundary face. That is, the steps may follow in the order of the step S1→the step S3→the step S4.

Thereafter, in step S3, a portion functioning as a supporting base member is formed in the semiconductor wafer in which the separation layer is formed to obtain the multilayer structure.

The method of forming this portion functioning as the supporting base member is roughly divided into two kinds, and one is a method in which a base member such as a second wafer separately prepared is bonded to the first wafer in which the separation layer is formed.

The other method is a method in which the supporting base member is formed by depositing materials such as polycrystalline silicon or amorphous silicon on the first wafer comparatively more thickly.

As the second wafer, CZ wafers, MCZ wafers, FZ wafers, epitaxial wafers, wafers treated with hydrogen annealing, etc., which are the same structure as of the first wafer, can be used.

In addition, the first wafer may be bonded directly onto a semiconductor surface of these wafers, or may be bonded with interposition of an insulating layer and/or an adhesive layer between the first wafer and the supporting base member.

Instead of a second wafer, insulating transparent base materials such as quartz glass and plastics, etc., conductive base materials made of flexible film, metals such as aluminum, stainless steel, etc., and also ceramics, etc., can be used. The first wafer may be bonded onto these directly or through an insulating layer and/or an adhesive layer. Of course, in step S2, when the single-crystalline semiconductor layer formed on the first wafer can be peeled off, the supporting base member is not necessarily required.

Next, in step S4, in the separation layer, the multilayer structure is separated. The method for separation is roughly divided into two kinds. One is a method in which a multilayer structure is heated from outside or is irradiated with light to absorb the light, whereby energy for separating is generated inside the multilayer structure.

Specifically, a layer including microcavities or a layer including potential microcavities formed by implanting hydrogen ions, rare gas ions, nitrogen ions or the like at a predetermined-depth position of the first wafer receives thermal energy so that the microcavities become bigger and the density of the separation layer decreases. This causes peeling phenomena of the multilayer structure. This is a method of generating an energy for separation inside the multilayer structure. In addition, such a method may be conducted that the separation layer and/or its vicinity is heat-treated so that a side surface thereof is oxidized to separate the multilayer structure by utilizing a stress generated by oxide film growth.

The other one is a method in which the energy for separation is directly given to the multilayer structure from outside. Specifically, the separation method includes a method in which a wedge is inserted into a side surface of a multilayer structure for separation, a method in which a fluid made from liquids and/or gasses is jetted to a side surface of a multilayer structure for separation, a method in which a tension in a mutually opposite direction is applied onto a front surface as well as a rear surface of a multilayer structure for separation, a method in which a pushing pressure in a mutually opposite direction is applied onto a front surface as well as a rear surface of a multilayer structure for destroying a separation layer to be separated, a method in which a shearing force is applied onto a side surface of a multilayer structure for destroying a separation layer to be separated, a method of using an inside peripheral blade and a wire saw for slicing, a method in which ultrasonic vibrations are given to destroy a separation layer, and the like. Water and nitrogen gas, etc., are used as a fluid to be jetted. Incidently, a position where the wedge is inserted or where the fluid is jetted is on the side surface of the multilayer structure, preferably in the vicinity of the separation layer.

Of course, the above-described separation methods may be used in combination. Incidentally, a portion where the fluid is jetted is mainly a side surface of a separation layer formed by anodization or implantation with hydrogen ions or the like, but this portion is not limited.

One wafer thus obtained will become an SOI wafer, etc. which is an extremely highly value-added wafer (step S5), and this can be used so that a semiconductor device is produced. A produced semiconductor device will become an excellent semiconductor device which can operate with a high speed and with low power consumption.

On the other hand, the separated first wafer (a semiconductor substrate) is utilized as a first wafer in the above-described step again or a second wafer.

This recycling is conducted (n−1) times ("n" is a natural number not less than 2). Accordingly, a manufacturing process of SOI wafers is conducted "n" times, and n sheets of SOI wafer are produced. In addition, a first wafer separated in the separation step S4 for the n-th use is not be used as a first wafer or a second wafer in the above-described step again, but if necessary, its surface is flattened, and the wafer is used as a non-SOI wafer, and this is utilized to produce a normal semiconductor device.

Further, the wafer can be diverted as an epitaxial wafer, a monitor wafer or a dummy wafer (step S6). In this case, the monitor wafer includes a wafer for controlling the steps in use of checking quality levels in each step of the process. The dummy wafer includes a wafer for maintaining uniformity in start-up and device characteristics. In addition, by utilizing processes disclosed in Japanese Patent Application Laid-Open No. 8-213645, Japanese Patent Application Laid-Open No. 10-233352, and Japanese Patent Application Laid-Open No. 10-270361, the wafer can be diverted for producing a solar cell. That is, the first wafer separated in the separation step S4 for the n-th use is diverted to a wafer to be used for a processes other than the SOI production process.

The number of times for use of the first wafer in the SOI manufacturing process, that is, the above-described "n" can be determined based on the following standards (1) through (3). Incidentally, also in order to reduce manufacturing costs for SOI wafers, it is desirable to establish a manufacturing system so that two or more SOI wafers can be obtained from one first wafer. That is, $n \geq 2$ is desirable.

(1) Adjustment of Production

When SOI wafers are ordered much, the number of times of repetitious use of the first wafer obtained by separation in the SOI manufacturing process is increased. On the other hand, when demand of diversions is much, a diversion is conducted at an earlier stage (step S6).

(2) Step Control

The number of times of repetitious use of the first wafer obtained after the separation step (step S4) in the SOI manufacturing process is set in advance, and when the number of repetitious times reaches the set number of times, the wafer is diverted (step S6).

(3) Classification by Way of Inspection

Usage destination of a wafer is classified by way of inspection. For example, when the first wafer is judged from surface qualities and wafer shape and the like thereof to be endurable for use in the SOI manufacturing process, reuse in the SOI manufacturing process is repeated. When the wafer is judged to be no longer endurable for use in the SOI manufacturing process, diversion (step S6) is conducted. Here, "no longer endurable for use in the SOI manufacturing process" denotes cases including that a manufactured SOI wafer does not satisfy the desired specifications.

Figure 9:
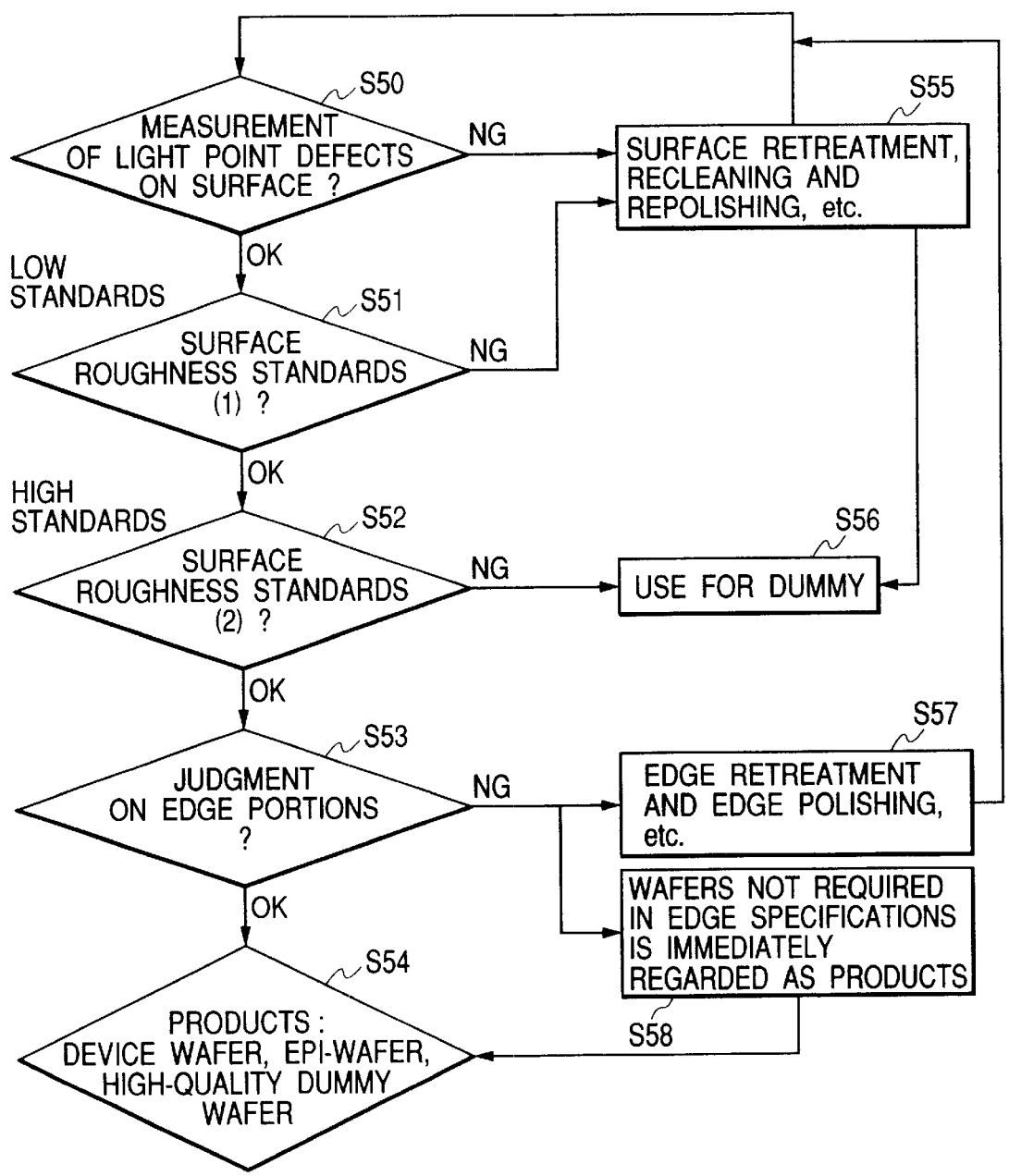
FIG. 9 is a flow chart showing an inspection step according to the present invention.

Incidently, the inspection stated here includes measurements of light point defects, surface roughness, etc., as shown in FIG. 9.

Of course, "n" can be determined in accordance with required specifications (flatness of the SOI layer surface, lattice defect density of the SOI layer, etc.) of SOI wafers, or "n" can be also determined in accordance with a price offered by a customer.

In addition, in the case where the SOI manufacturing process includes a manufacturing system in which one silicon wafer is used a plurality of times (n times) as a first wafer and thereafter the wafer is diverted into an epitaxial wafer, the above-described "n" can be determined in accordance with needs for SOI wafers and epitaxial wafers in a market.

That is, "n" can be determined based on a number of ordered SOI wafers and a number of ordered epitaxial wafers from customers.

For example, in case of a relationship of $\alpha_{SOI} \leq 3\alpha_{epi}$ wherein $\alpha_{SOI}$ is a number of ordered SOI and $\alpha_{epi}$ is a number of ordered epitaxial wafers during a period, "n=3" and the like is determined.

It is also preferable that an ordered number of sheets is recorded with a computer, and "n" is determined based on the recorded contents.

A diversion step conducted in step S6 preferably causes among others epitaxial wafers to be formed.

For manufacturing epitaxial wafers, an atmospheric pressure CVD System, a low pressure CVD system, a plasma enhanced CVD system, a photo assisted CVD system, a PVD system, etc. are suitably used.

In the present invention, the first wafer used in the bonding SOI wafer production steps can be used to produce an epitaxial wafer for use of an use other than the SOI wafer production steps.

A suitable temperature for epitaxial growth, which depends on growth methods, is approximately not lower than 500° C. and not higher than a melting point of a material constituting a wafer. In the case where a temperature is applied to wafers of single-crystalline silicon, the lowest limit of the temperature is 600° C., or more preferably 800° C., and the upper limit of the temperature is a melting point of silicon, or more preferably 1400° C., or further preferably 1200° C.

In the case where epitaxial growth is conducted with CVD method or sputtering method, suitable atmosphere may be either of the atmospheric pressure and low pressure, but not more than the atmospheric pressure and not less than 3.9× $10^{-4}$ Pa, and more preferably not more than the atmospheric pressure and not less than 1.3 Pa.

A gas to provide with an atmosphere for epitaxial growth is at least one kind of gas selected from silanes such as $SiH_4$, $SiCl_3H$, $SiCl_2H_2$, $SiCl_4$, $Si_2H_6$, $SiF_4$, etc. For a purpose of doping an impurity thereto, a gas containing an acceptor such as $B_2H_6$, $BF_3$, $BBr_3$, etc. and a gas containing a donor such as $PH_3$, $ASH_3$, etc. may be doped.

Moreover, in addition thereto, hydrochloric acid, chlorine or the like may be doped, or hydrogen or a rare gas may be doped. Normally, a hydrogen gas is used as a carrier gas.

Incidentally, when SOI wafers are repeatedly manufactured using a $P^+$ wafer as a first wafer and the first wafer is diverted after separation, an epitaxial layer is caused to grow on a surface of the first wafer so that an epitaxial wafer is produced, which is preferable. The produced epitaxial wafer is suitable for producing integrated circuits such as a memory, a logic circuit, analog signal processing circuit, analog-digital hybrid circuit, etc. or for producing semiconductor functional elements such as CCD and solar cells, etc.

In addition, in a series of production steps, both of a plurality of SOI wafers and epitaxial wafer can be manufactured, and comprehensive material costs can be reduced.

Here, an epitaxial wafer will be described.

The section 3.3.2 Analogue-digital consolidated substrate separation technology in "Low power consumption, high-speed LSI technology" (Realize Corporation) discusses about $P^-$ epitaxial layer/$P^+$ substrate as one of substrate structures to reduce digital noises.

In addition, according to Section 1 of Chapter 5 of "Silicon science" (edited by UCS Semiconductor Substrate Technology Research Institute, published by Realize Corporation), when MOSLSIs are manufactured with epi-wafers, most of them employ the structure of a substrate having a P-type epitaxial layer on a $P^+$ substrate (hereinafter referred to as "P-type epi-/$P^+$ substrate"). The greatest factor of using an epi-wafer is a point that software error and latch up can be improved. In addition, in Section 4 of the Chapter 5, an epitaxial wafer of P-type epi-/$P^+$ substrate is stated to be superior to bulk Si wafers of CZ in terms of TDDB characteristics in oxide film-dielectric breakdown characteristics of MOS structure, and to show a strong gettering effect in a boron high-concentration region of the substrate.

Moreover, the same Section as described above discusses about a price of epitaxial wafer, and describes that price difference between epitaxial wafer and CZ wafer will become smaller when diameter is proceeded to become bigger. In addition, it describes that, if super-highly quality Si crystal is needed toward a gigabit era, price rates (against price for an epi-wafer) of a CZ crystal in accordance with greater diameter will be increased, and therefore an era of mass use of epitaxial wafers will come.

Thus, it is preferable, from a point of view to construct an economic process for producing semiconductors as well as to improve utilization efficiency of wafers, that the first wafer is used for a plurality of times for process for producing SOI wafers, and thereafter epitaxial wafers are manufactured by using the first wafers.

Incidentally, it is also preferable that after manufacturing SOI wafers by using the first wafer, and prior to conducting the diversion step (S6) by using the first wafer, a surface of the first wafer is subjected to a flattening/smoothing step.

For the purpose of surface-flattening/smoothing, the separated first wafer can be subjected to at least one of polishing, etching, heat treatment, etc.

Among others, a method (hydrogen anneal) of heat-treating a separated first wafer under the reducing atmosphere containing hydrogen is a preferable method since surface smoothing becomes possible while decrease in wafer thickness is inhibited, and simultaneously impurity such as boron, etc. contained in a surface layer of a wafer, after separation can be diffused outward so that density of impurity can be decreased.

Temperature suitable for hydrogen annealing is not less than 300° C. and not more than a fusion point of a material constituting a wafer, but in the case where it is applied to a single-crystalline silicon wafer, the lower limit of temperature is 800° C. or more preferably is 1000° C., and the upper limit of temperature is the fusion point of silicon, or more preferably is 1400° C., and further preferably 1200° C.

The reducing atmosphere suitable for hydrogen anneal may be any of high pressure, the atmospheric pressure, and low pressure, but not more than the atmospheric pressure and not less than $3.9 \times 10^{-4}$ Pa, and more preferably not more than the atmospheric pressure and not less than 1.3 Pa.

Treatment time for hydrogen annealing is appropriately selected in accordance with necessary characteristics, and therefore there are no particular limitation thereon, but around one minute to 10 hours is a reasonable range.

As a gas for providing with a reducing atmosphere containing hydrogen, 100% hydrogen gas or a mixed gas of hydrogen and an inert gas can be used.

A first wafer after peeling obtained by such hydrogen annealing falls in the same standards as a wafer treated with hydrogen annealing treatment on the market, and will become suitable for producing semiconductor devices such as LSIs, etc.

Smoothing by way of polishing is an excellent method, and chemical and mechanical polishing (CMP) is a one. If surface abnormality could take place, it can be almost removed by polishing. This treatment can be conducted by the same method as in polishing of normal Si wafers, and is excellent in mass production. Incidentally, the surface abnormality means defects or particles detected by observation of a wafer surface.

Figure 10:
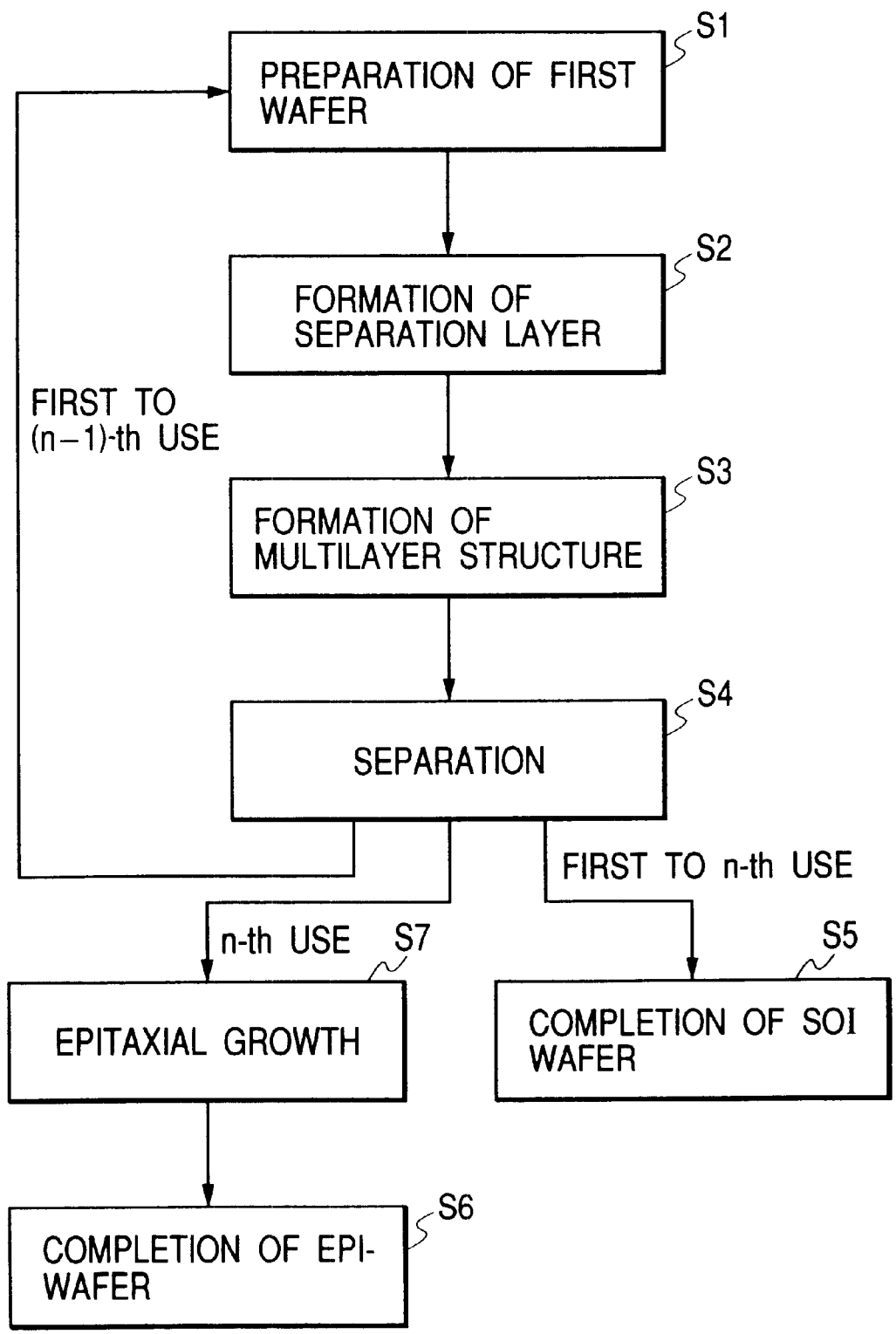
FIG. 10 is a flow chart showing a method of producing a semiconductor member according to a basic embodiment of the present invention.

Incidentally, in the present invention, when especially a high-concentration P-type semiconductor wafer is preferably used as a first wafer so that as shown in FIG. 10, the first semiconductor wafers such as SOI wafers, etc are formed in the separation step S4 in n-th use (Step S5), and the high-concentration P-type semiconductor wafers separated in the n-th separation step are flattened in accordance with necessity so that a P⁻ layer, an N layer, or the like is preferably caused to epitaxially grow (Step S7). Thus, an epitaxial wafer in which P⁻ layer, N layer, or the like is formed on a high-concentration P-type semiconductor wafer can be produced (Step S6). As described above, the mode of P⁻ epi-/P⁺ substrate is most widely used among wafers in current use. Incidentally, a surface of the first wafer after peeling may be subjected to epitaxial growth treatment after flattening once, but can be subjected to epitaxial growth treatment after only cleaning without polishing, etching, or heat treatment after peeling.

In addition, when a first wafer which is a wafer obtained by forming an epitaxial semiconductor layer (P⁻ layer, N layer or the like) on a high-concentration P-type semiconductor wafer, the separation step S4 produces SOI wafers (Step S5), and P⁻ layer or N layer or the like is formed on the separated high-concentration P-type semiconductor wafer, and therefore without new epitaxial growth, an epitaxial wafer can be produced (step S6). That is, as an epitaxial semiconductor layer is already formed in step S1, it is not necessary to prepare a new epitaxial semiconductor layer in step S7 as shown in FIG. 10.

Formation of a porous layer can be conducted with an N-type semiconductor in accordance with conditions, but P-type semiconductors are desirably used. Unagami, et al. researched on dissolution reaction of Si in anodization, and confirmed that anodic reaction needs positive holes in a HF solution (T. Unagami, J. Electrochem. Soc., vol. 127, 476 (1980)). High-concentration P-type semiconductor is desirably used so as to conduct formation of a porous layer, and an impurity concentration range thereof is generally a range of $5.0 \times 10^{16}/cm^3$ to $5.0 \times 10^{20}/cm^3$, preferably a range of $1.0 \times 10^{17}/cm^3$ to $2.0 \times 10^{20}/cm^3$, and further preferably a range of $5.0 \times 10^{17}/cm^3$ to $10 \times 10^{20}/cm^3$.

As the first wafer, a high-concentration P+ wafer is used and a process for producing SOIs is conducted repeatedly, and thereafter the separated high-concentration P⁺ wafers (semiconductor substrates) are diverted as substrates for P⁻ epitaxial without discard of the P⁺ wafers, whereby SOI wafers and epitaxial wafers can be manufactured.

Accordingly toward mass consumption of epitaxial wafers as described above, a commercially advantageous semiconductor production system can be constructed.

Incidentally, in the case where a P⁻ wafer is used as a first wafer, the wafer can become a wafer suitable for producing the above-described integrated circuit or semiconductor function element only by smoothing a surface of the wafer without undergoing epitaxial treatment.

Of course, when a higher quality layer is demanded as a layer for producing an integrated circuit or a semiconductor function elements, an epitaxial layer may be further formed on the smoothed surface. The separated first wafer (semiconductor substrate) is utilized and diverted, then it can be resold at approximately the same price as or cheaper than the original wafer, and further adding additional value (e.g., producing an epitaxial wafer), the wafer can be resold at a higher price, a commercially advantageous semiconductor production system can be constructed.

Figure 11:
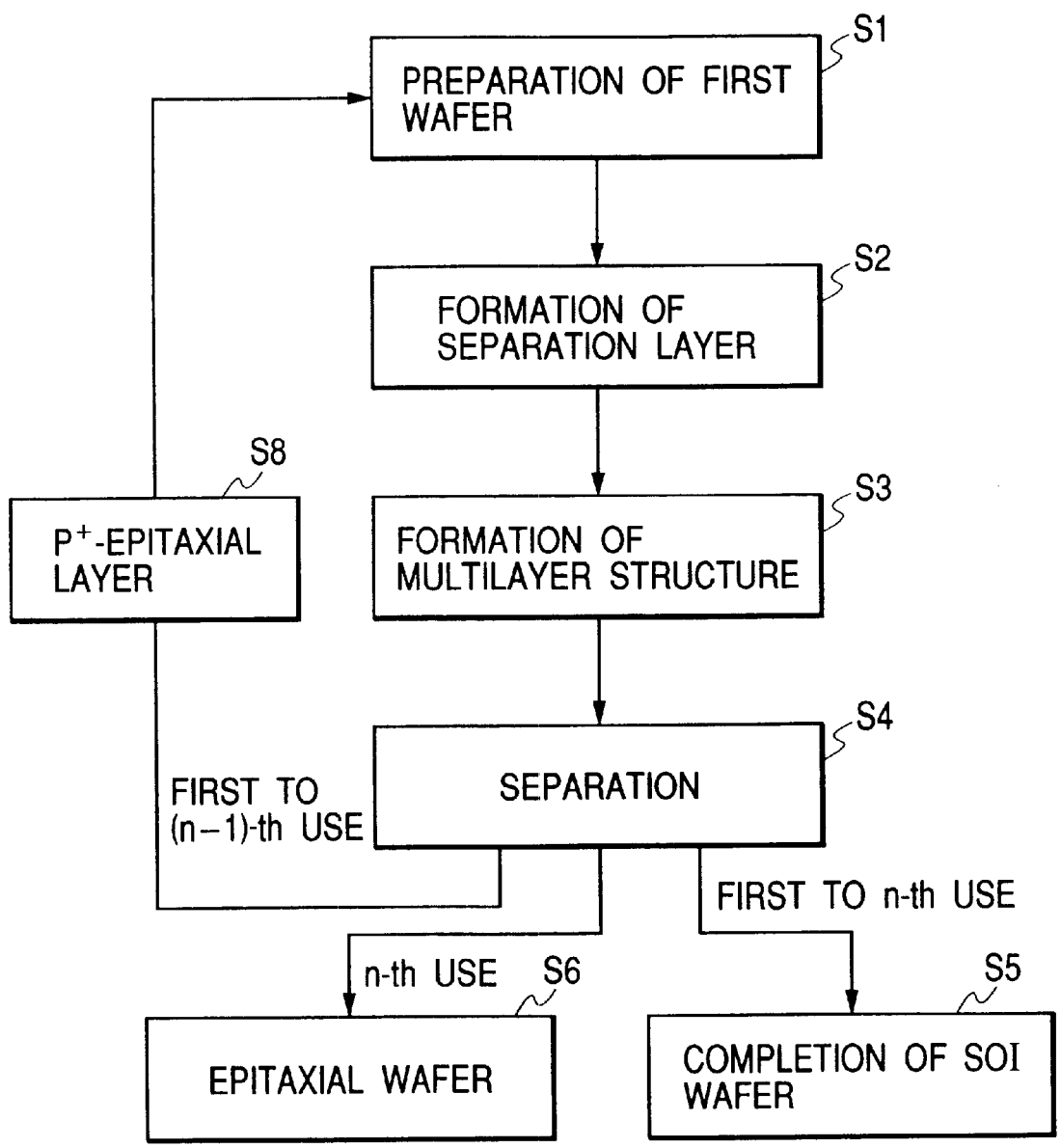
FIG. 11 is a flow chart showing a method of producing a semiconductor member according to a basic embodiment of the present invention.

In addition, such a mode of manufacturing a plurality of sheets of SOI wafer and one sheet of epi-wafer as shown in FIG. 11 can be taken.

As shown in step S1 in FIG. 11, a first wafer is prepared.
The above-described semiconductor wafer is suitably used as the first wafer.

Next, as in step S2, a separation layer is formed in the semiconductor wafer, and a first member having a single-crystalline semiconductor layer on the semiconductor substrate through the separation layer is formed. As a forming method for a separation layer, a method in which a porous layer is formed and thereafter a non-porous layer is formed on a surface thereof is adopted. A non-porous layer can be formed by a method of conducting epitaxial growth on a porous layer or a method of heat-treating a surface of the porous layer under an atmosphere containing hydrogen.

In this case, a single-crystalline semiconductor layer having a predetermined thickness is formed on a semiconductor wafer prior to formation of a separation layer, and a separation layer is formed inside the semiconductor layer.

Here, the single-crystalline semiconductor layer is consisted of at least two layers having different impurity concentrations. For example, on the semiconductor wafer is formed from the semiconductor wafer side, a first single-crystalline semiconductor layer and a second semiconductor layer with an impurity concentration higher than that of the first single-crystalline semiconductor layer. When the single-semiconductor layer is made porous, a region with a low-concentration impurity has a porosity higher than that of a region with a high-concentration impurity to become vulnerable. Accordingly, a separation position can be defined more strictly.

Incidentally, formation of a porous layer is implemented so that the region with a low-concentration impurity is left.

Incidentally, the separation layer can also be implemented by implanting ions such as later-described hydrogen and nitrogen, etc.

Thereafter, in step S3, a portion to become a supporting substrate (second member) is formed in a semiconductor wafer in which the separation layer is formed, and a multilayer structure is formed. A method for forming this portion to become a supporting substrate is as described above.

Subsequently, in step S4, the multilayer structure is separated at the separation layer. As a method for separation, the above described method is adopted.

Thus obtained one wafer becomes a wafer with extremely highly-value added wafer such as an SOI wafer, and by using this, a semiconductor device can be formed (Step S5). The produced semiconductor device can become an excellent semiconductor device capable of high-speed operation with low power consumption.

On the other hand, the separated first wafer is utilized again as a first wafer or a second wafer in the above-described step. In accordance with necessity, an epitaxial layer (e.g., $P^+$ epitaxial layer) is formed on the separated first wafer (Step S8). Incidentally, as already described, since formation of a porous layer is implemented so that a region with a low-concentration impurity is left, an epitaxial layer is left on the semiconductor wafer, and in the case where this epitaxial layer can provide with SOI wafers with a desired quality and a sufficient thickness of the epitaxial layer, it is not necessary to form the epitaxial layer in step S8.

Figure 12:
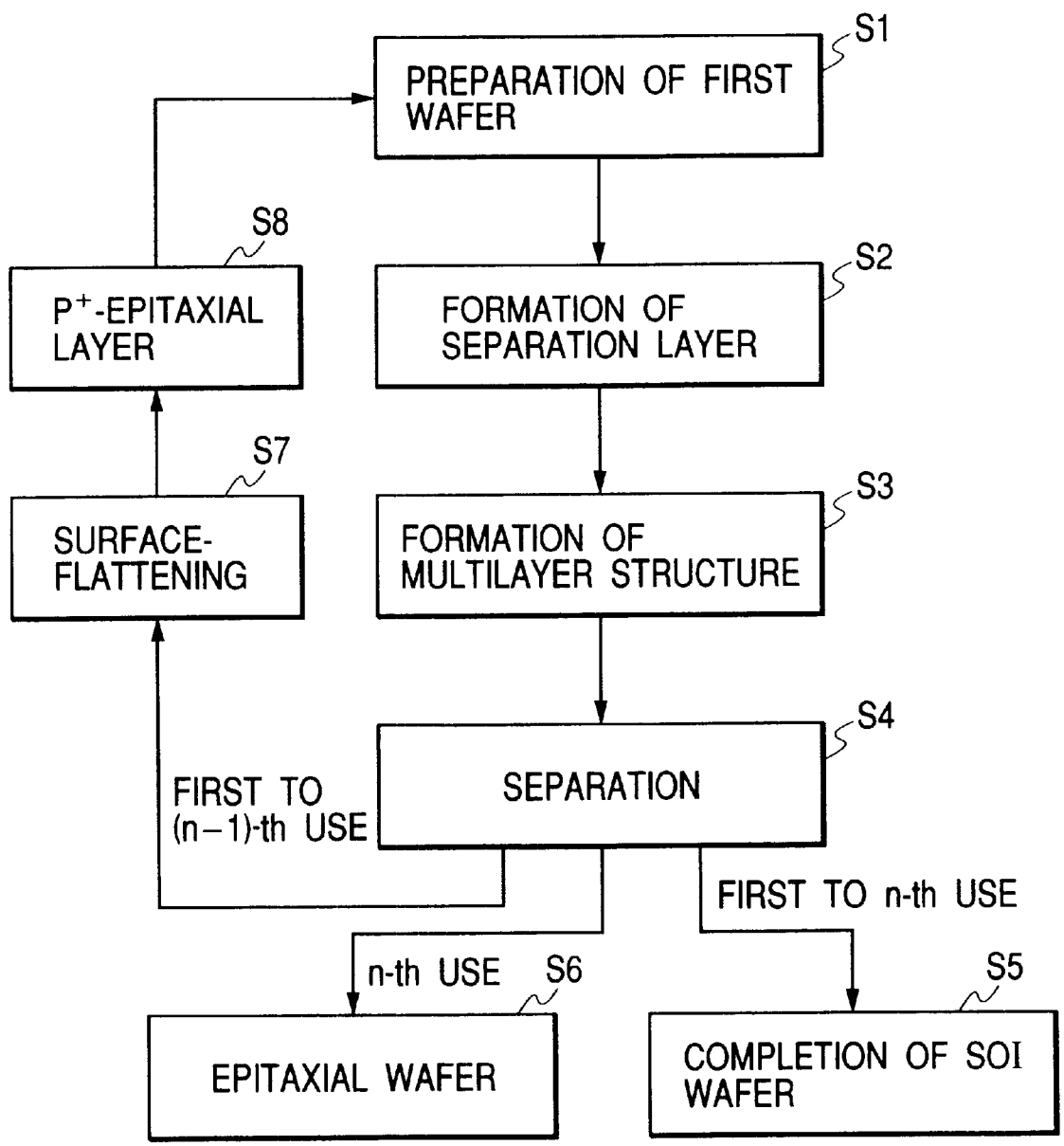
FIG. 12 is a flow chart showing a method of producing a semiconductor member according to a basic embodiment of the present invention.

In the case where the wafer is introduced as a first wafer, the above-described separation layer can be formed in the epitaxial layer. Incidentally, it is preferable that a surface of a first wafer after peeling is smoothed once and thereafter subjected to epitaxial growth (Step S7 in FIG. 12). Of course, without undergoing polishing, etching, and heat treatment, the wafer can be subjected to epitaxial growth treatment (Step S8) only by cleaning after peeling.

Recycling of the above-described first wafer takes place (n−1) times ("n" is a natural number not less than 2). Accordingly, a manufacturing process of SOI wafers is implemented "n" times, and n sheets of SOI wafer are produced. In addition, a first wafer separated in the separation step S4 in the n-th use is not used as a first wafer or a second wafer in the above-described step again, but, in accordance with necessary, its surface is smoothed, and the wafer is used as a non-SOI wafer (for example, an epitaxial wafer in which a $P^-$ layer is disposed on a high-concentration P-type semiconductor wafer in the case where the high-concentration P-type semiconductor wafer is used as the first wafer) (Step S6).

The wafer can be also diverted as a monitor wafer or a dummy wafer. In addition, by using processes disclosed in Japanese Patent Application Laid-Open No. 8-213645, Japanese Patent Application Laid-Open No. 10-23352, and Japanese Patent Application Laid-Open No. 10-270361, the wafer can be diverted for producing a solar cell. The above-described "n" can be determined by using the already described standards, etc.

The embodiments of the present invention will be described further in detail with reference to drawings as follows.

Embodiment 1

Figure 2:
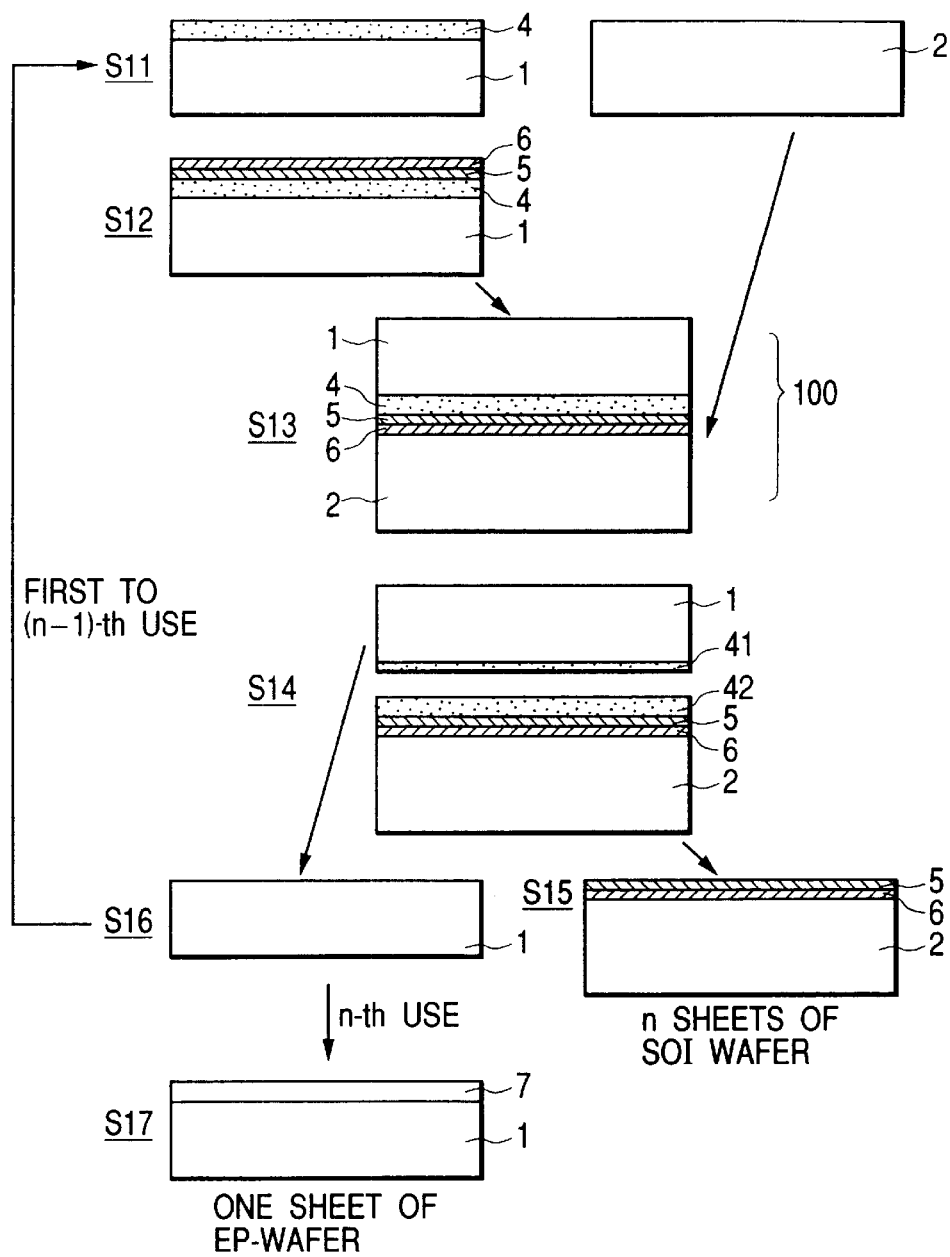
FIG. 2 is a schematically cross-sectional view showing the steps of producing a semiconductor member according to a basic embodiment of the present invention.

FIG. 2 is a flow chart showing the steps of a process for producing wafers according to the first embodiment of the present invention.

At first, in step S11, a first wafer 1 made of CZ silicon wafer, FZ silicon wafer, epitaxial silicon wafer or silicon wafer treated with hydrogen annealing, etc., and a second wafer 2 to become a second member are prepared. Among these, a surface of the first wafer 1 is anodized and made porous to form a porous layer 4. The second wafer 2 may be a wafer from which a semiconductor is exposed or may be one on a surface of which an insulating film is formed, or in stead of the second wafer, an insulating light-transmissive substrate such as quartz silica glass may be used.

Subsequently, in step S12, a non-porous layer 5 is formed on a porous layer 4 so that the first member is formed. As a forming method of the non-porous layer 5, there is a method in which pores of the porous layer 4 are closed by hydrogen annealing so as to give rise to non-porous structure in the surface layer, or a method in which a non-porous single-crystalline layer is formed by epitaxial growth.

A suitable temperature for epitaxial growth, which depends on growth methods, is approximately not lower than 500° C. and not higher than a melting point of a material constituting a wafer. In the case where a temperature is applied to wafers of single-crystalline silicon, the lowest limit of the temperature is 600° C., or more preferably 800° C., and the upper limit of the temperature is a melting point of silicon, or more preferably 1400° C., or further preferably 1200° C.

In addition, in accordance with necessity a surface of the non-porous layer 5 is oxidized and the like so that an insulating layer 6 is formed on the non-porous layer 5. In stead of oxidizing, the insulating layer 6 may be formed by CVD and sputtering, etc. Incidentally, in the present embodiment, the porous layer 4 becomes a separation layer.

In step S13, a multilayer structure 100 is formed by bonding a surface of the insulating layer 6 of the first wafer 1 and a surface of the second wafer 2. Of course, an insulating layer may be formed on the second wafer so that the insulating layers respectively on the first wafer and the second wafer are bonded together. Moreover, an insulating layer may be formed only on the second wafer without an insulating layer being formed on the first wafer 1 so that the insulating layer and the non-porous layer are bonded. At the time of bonding, the both wafers may be caused to come in contact at room temperature, and thereafter undergo heat treatment to increase bonding intensity, or may be bonded by anodic bonding. In addition, contact may coincide with heat treatment. Moreover, in the bonding step, heat treatment, etc. may be implemented while the both wafers are placed under high pressure so as to come in tighter contact. Heat treatment is preferably implemented under oxidized atmosphere or inert gas atmosphere ($N_2$, Ar, etc.).

In addition, it is also preferable that any of a pair of bonding surfaces undergoes plasma treatment with oxygen, nitrogen, silicon, hydrogen, a rare gas (Ar, Ne), ammonia, water vapor, etc. so that the bonding surface is activated in advance.

Moreover, bonding may take place by displacing a adhesive layer to intermediate them. As an adhesive for forming the adhesive layer, epoxy and polyimide, etc. can be used.

In addition, in step S14, at the separation layer (porous layer 4), a multilayer structure is separated by the aforementioned method (reference numerals 41 and 42 denote separated porous layers). The non-porous portion of the peeled or separated first wafer maintains a wafer shape, and in some cases there exists a residual portion 41 of the porous layer on the separation surface. On the other hand, onto the second wafer 2, the non-porous layer 5 together with the insulating layer 6 are trasnferred from the first wafer, and have the residual portion 42 of the porous layer on its separation surface of couse, when the multilayer structure is separated at either of an upper and a lower interfaces of the porous layer 4, the residual portion is not left on the non-porous layer 5 or the first wafer.

In step S15, in accordance with necessity the residual portion 42 of the porous layer is removed. In the case where the thickness of the residual portion 42 is comparatively thick, the residual portion 42 undergoes wet etching to selectively removed by using a mixed liquid of fluoric acid, hydrogen peroxide and/or alcohol as etchant, and thereafter a surface is smoothed by hydrogen annealing.

In the case where the thickness of the residual portion 42 is thin, or little portion remains, the portion may undergo hydrogen annealing for smoothing treatment simultaneously with removal of the residual portion 42 without conducting wet etching. Thus, highly value-added SOI wafers can be obtained. Of course, for removal of the residual portion 42, dry etching (radical dry etching) such as RIE, etc. can be employed.

In step S16, the residual portion 41 on the wafer 1 after peeling is removed by polishing, wet etching, hydrogen annealing, etc., and is smoothed.

Thus, a bulk wafer is obtained. This bulk wafer is used as a first wafer 1 in step S11, and again a process for producing SOI wafers in step S11 through step S15 is implemented. Reintroduction of the bulk wafer obtainable in step S16 takes place (n−1) times and step S11 through S15 are repeated "n" times and "n" SOI wafers are obtained. The number of times of repetition is determined based on results of inspections such as the aforementioned adjustment of production, the step control, the surface conditions of wafer, etc. as standards. Of course, the bulk wafer obtained in step S16 may be used as a second wafer in step S11.

In step S16 for the "n"-th use, the residual portion 41 on the wafer 1 (semiconductor substrate) after peeling is removed by polishing, wet etching, hydrogen annealing, etc., and is smoothed to obtain a bulk wafer. The thus obtained bulk wafer is used in a process for producing non-SOIs. The wafer can be used for a wafer for forming devices as well as dummy wafers, etc. Incidentally, the surface may be subjected to only removal of the residual portion 41 and needs not to undergo smoothing. This is becouse epitaxial growth taking place as in step S17 can coincide with surface smoothing to a certain extent.

Moreover, in accordance with necessity, as shown in step S17, a surface of the wafer 1 after peeling may undergo epitaxial growth treatment to cause the epitaxial layer 7 made of non-porous P-type single-crystaline semiconductor to be formed. Thus, an epitaxial wafer is obtained. In FIG. 2, an epi-wafer is exemplified in step S17, and however it is not always limited thereto.

Incidentally, as described above, a high-concentration P-type semiconductor wafer is used as a first wafer, which will become suitable to give rise to porous structure, and an epitaxial wafer obtained in step S17 will become a wafer in which an epitaxial layer is formed on a $P^+$ wafer. If the wafer is provided with $P^-$ epitaxial layer, it will be capable of becoming a suitable epi-wafer.

When a surface of the first wafer 1 is anodized and made porous, currency density or anodization solution may be changed to have two or more porous layers having mutually different porosity.

Among others, the porous layer 4 preferably comprises from the side of the non-porous layer 5, a first porous layer having a first porosity, and a second porousilayer having a second porosity which is greater than the first porosity, in this order. Such a configuration makes it possible to form a non-porous layer (e.g., non-porous single-crystalline silicon layer) with less defects, etc. on the first porous layer. In addition, the second porous layer can be caused to function as a layer for separation.

The first porosity of the first porous layer is preferably 10% to 30%, and more preferably 15% to 25%.

In addition, the second porosity of the second porous layer is preferably 35% to 70%, and more preferably 40% to 60%.

As the solution for anodization, a solution containing hydrogen fluoride, a solution containing hydrogen fluoride and ethanol, a solution containing hydrogen fluoride and isopropyl alcohol, a solution containing hydrogen fluoride and hydrogen peroxide, a solution containing hydrogen fluoride and a chelate compound, and a solution containing hydrogen fluoride and surface active agent, etc. can be used.

Here, prior to forming a non-porous layer 5 onto the porous layer 4, at least one of steps (1) through (4) described below can also be added. A series of steps of preferably (1)→(2), more preferably (1)→(2)→(3) or (1)→(2)→(4), and further preferably (1)→(2)→(3)→(4) are implemented.

(1) Step of Forming Protection Film onto Wall Having Pores

A protection film such as oxide film or nitride film, etc. may be provided onto walls of a porous layer having pores so that roughing of pores due to heat treatment is prevented. For example, heat treatment (at 200° C. to 700° C.) is implemented under an oxidizing atmosphere. At that occasion, the oxide film, etc. formed on a surface of the porous layer may be removed (for example, by exposing the surface onto a solution containing HF).

(2) Hydrogen Baking Step

A porous layer undergoes heat treatment at 800° C. to 1200° C. in a reducing atmosphere containing hydrogen so that pores existing on a layer surface of the porous layer are sealed to a certain extent.

(3) Minute Amount-raw Material Supplying Step

In the case where the above described hydrogen baking step can not complete sealing, a raw material of non-porous layer 5 is supplied in minute quantity so that pores on the layer surface are sealed to a further extent.

In particular, the raw material supply is controlled so that growth rate becomes not more than 20 nm/min., preferably not more than 10 nm/min., and more preferably not more than 2 nm/min.

(4) High Temperature Baking Step

Heat treatment is implemented at a treatment temperature higher than in the aforementioned hydrogen baking step and/or minute amount-raw material supply step, and in a reducing atmosphere containing hydrogen.

This will make it possible to cause the porous layer surface to undergo sufficient sealing as well as smoothing.

A method of separating the multilayer structure 100, the method includes a method in which stretching force, compressing force, and shearing force, etc. are applied and a fluid is jetted.

As a fluid to be used, water, organic solvents such as alcohol etc., and acids such as fluoric acid and nitric acid, etc., or alkalis such as potassium hydroxide, etc., and others including fluids which operate to implement selective etching the separation regions on can be used. Cool fluids with low temperatures, extremely cool liquid, a photon beam, and an electron beam can be used.

Moreover, as a fluid, gases such as air, nitrogen gas, oxygen gas, carbon dioxide gas, and a rare gas, etc. may be used. A gas and a plasma which operates for etching onto the separation region can be used. In the case where water is used in a form of jet stream, highly pure water such as pure water, and super pure water, etc. from which impurity metals or particles, etc. were removed can be used.

In addition, the separation step is implemented by complete low temperature process so that after separation with water jet, particles attached on a wafer can sufficiently removed by cleaning.

Of course, the above described various separation methods may be used in a combination.

In the case where residual portions 41 and 42 of the porous layer need to be removed, such removal can be implemented by polishing, grinding, etching, or a combination thereof.

As a method for polishing, chemical-mechanical polishing (CMP) is preferable.

Polishing agent at time of implementing CMP, polishing particles such as borosilicate glass, titanium dioxide, titanium nitride, aluminum oxide, iron nitrate, selenium dioxide, colloidal silica, silicon nitride, silicon carbide, graphite, and diamond, etc., or grading particle liquid obtained by mixing these grading particles and oxidizing agents such as $H_2O_2$, $KIO_3$, etc. and alkali solutions such as NaOH, KOH, etc. can be used.

Figure 3A:
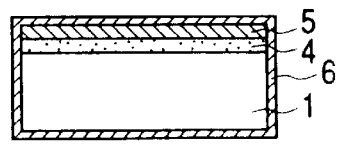
FIGS. 3A and 3B are schematically cross-sectional views showing the steps of producing a semiconductor member according to a basic embodiment of the present invention.

Incidentally, prior to bonding, the wafer undergoes heat treatment under an oxidizing atmosphere so that an insulating layer 6 is formed on a surface of a non-porous layer 5, then as in FIG. 3A, the oxide film 6 can be formed on a back surface as well as a side surface of the first wafer.

Figure 3B:
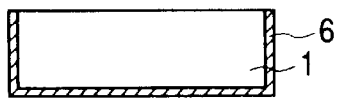

In addition, the first wafer (in FIG. 3B) obtainable through the multilayer structure forming step and the separation step is repetitiously used as a first wafer in the process for producing SOIs, the oxide film 6 can be formed gradually thicker.

Incidentally, in case of forming the separation layer by anodization, an oxide film is peeled off once. Even in this case, an oxide film is formed again in the process for producing SOIs.

In addition, one bulk wafer, which is obtainable concurrently with manufacturing n sheets of SOI wafer, has an oxide film on its side and/or surface, and therefore can be used as a bulk wafer with a back seal in a device process for a CMOS, etc.

Back seal is to prevent an impurity in a wafer from diffusing outward due to heat treatment during device forming onto the wafer.

Of course, in some cases a back seal formed at one time of SOI manufacturing process on a side surface or a back surface of the first wafer could be sufficient, but it is preferably used for two times or more of SOI manufacturing steps.

Accordingly, for determining repeating times "n", it can be standardized for the determination whether or not thickness of a back seal to be formed on a side surface and back surface of the first wafer is the desired thickness. In case of forming the separation layer by ion implatation, since there is not necessarily need for removing an oxide film already formed on the surface of a wafer, the thickness of back seal becomes larger as the above-described "n".

Incidentally, what is described in detail in the present embodiment so far will be of course applicable to a second embodiment onward.

Embodiment 2

Figure 4:
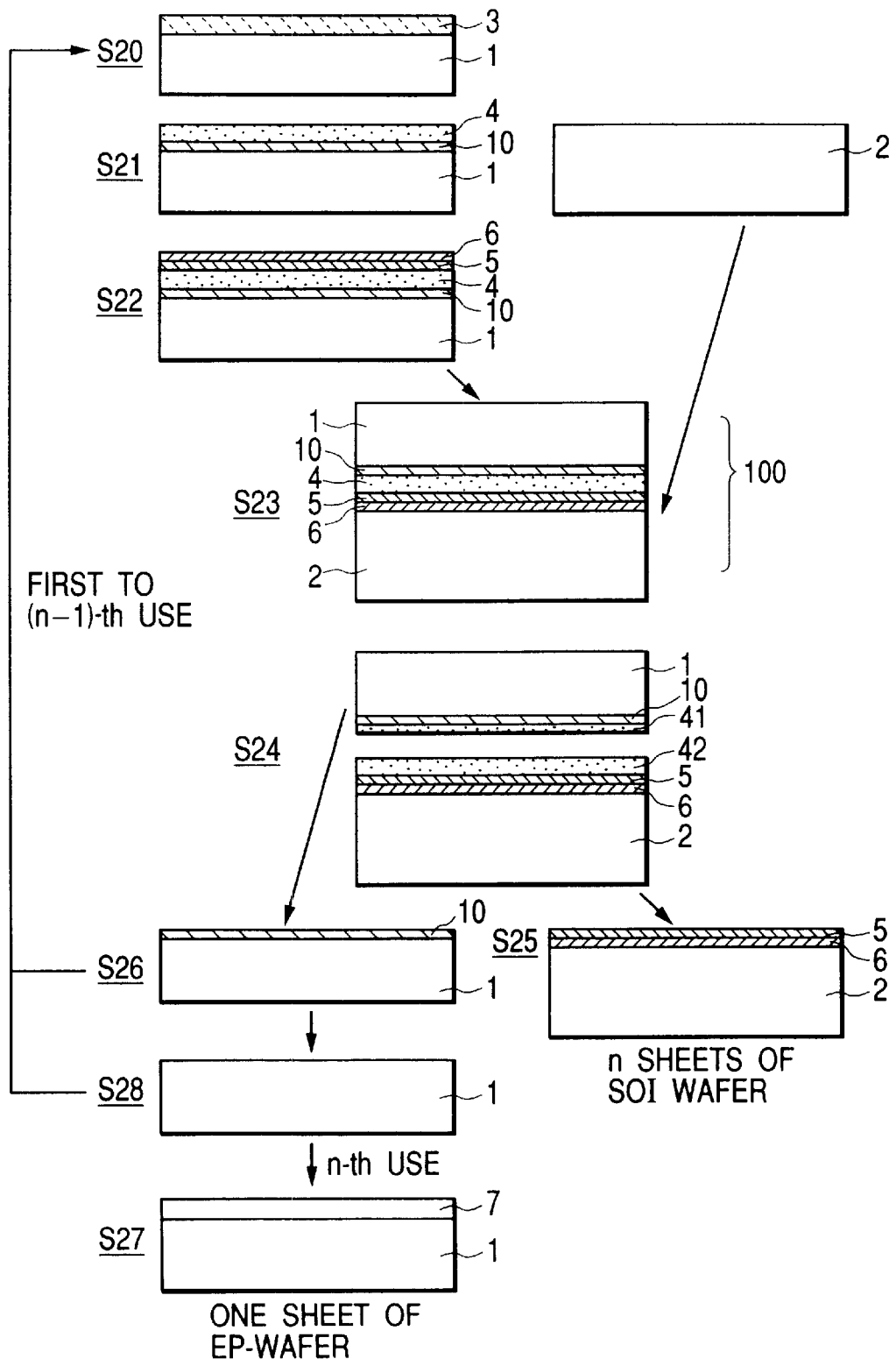
FIG. 4 is a schematically cross-sectional view showing the steps of producing a semiconductor member according to a basic embodiment of the present invention.

FIG. 4 is a flow chart showing steps of process for producing wafers according to the second embodiment of the present invention.

At first in step S20, a first wafer 1 comprising a bulk wafer such as a CZ silicon wafer and an FZ silicon wafer, etc. is prepared, and a front layer of the first wafer undergoes diffusion method or ion implantation method so that a single-crystalline semiconductor layer 3 to which a dopant is added is formed thereon. As this single-crystalline semiconductor layer 3, $P^+$ layer preferably has a boron density approximately of $1 \times 10^{17}$ $cm^{-3}$ to $1 \times 10^{20}$ $cm^{-3}$.

In step S21, a second wafer 2 made of a bulk wafer, etc. such as CZ silicon wafer, FZ silicon wafer, etc., to become a second member is prepared.

The second wafer may be a wafer from which a semiconductor is exposed or may have an insulating film formed on a surface thereof, or in stead of the second wafer, an insulating light-transmissive substrate such as quartz glass may be used.

In addition, a surface of the first wafer 1 of the single-crystalline semiconductor layer 3 undergoes anodization, etc. and made porous to form a porous layer 4. At this time, only a surface layer of the single-crystalline semiconductor layer 3 preferably is made porous so that a non-porous layer 10 approximately of 100 nm to 20 $\mu$m is left under the porous layer 4.

Subsequently, in step S22, a non-porous layer 5 is formed on a porous layer 4 so that the first member is formed. As a forming method of the non-porous layer 5, there is a method in which holes of the porous layer 4 are closed by hydrogen annealing so as to make the surface layer non-porous, or a method in which non-porous single-crystalline layer is formed by epitaxial growth.

In addition, in accordance with necessity a surface of the non-porous layer 5 is oxidized and the like so that an insulating layer 6 is formed on the non-porous layer 5. In stead of heat-oxidizing, the insulating layer 6 may be formed by CVD, sputtering, etc. In the present embodiment, the porous layer 4 will become a separation layer.

In step S23, a multilayer structure 100 is formed by bonding a surface of the insulating layer 6 of the first wafer 1 and a surface of the second wafer 2. At the time of bonding, the both wafer may be caused to come in contact under room temperature, and thereafter undergo heat treatment to increase bonding strength, or may be bonded by anodic bonding. Otherwise, heat treatment may be implemented at the time when contact takes place. Moreover, in the bonding step, heat treatment, etc. may be implemented while the both wafers are placed under high pressure so as to come in tighter contact.

In addition, it is also preferable that at least one of a pair of bonding surfaces is subjected to plasma treatment with oxygen, nitrogen, silicon, hydrogen, a rare gas, etc. so that the bonding surface is activated in advance. Moreover, bonding may take place by interposing an adhesive layer between them.

In addition, in step S24, in the separation layer (the porous layer 4), a multilayer structure 100 is separated by the aforementioned method. The non-porous portion of the peeled first wafer maintains a wafer shape, and in some cases there exists a residual portion 41 of the porous layer on the separation surface. On the other hand, onto the second wafer 2, the non-porous layer 5 together with the insulating layer 6 are transferrred from the first wafer, and in some cases the second wafer has the residual portion 42 of the porous layer on its surface.

In step S25, in accordance with necessity the residual portion 42 of the porous layer is removed. In the case where thickness of the residual portion 42 is comparatively thick, the residual portion 42 undergoes wet etching to be selectively removed by using a mixed liquid of fluoric acid, hydrogen peroxide, and alcohol as an etchant, and thereafter a surface is smoothed by hydrogen annealing. In the case where thickness of the residual portion 42 is thin, the portion may undergo hydrogen annealing for smoothing treatment simultaneously with removal of the residual portion 42 without conducting wet etching. Thus, highly value-added SOI wafers can be obtained. Of course, when practically any residual portion is absent, a step for removing the residual portion 42 can be omitted.

In step S26, the residual portion 41 on the wafer 1 (semiconductor substrate) after peeling off is removed by polishing, wet etching, hydrogen annealing, etc., and is smoothed. At this time, a non-porous layer 10 is left on the wafer 1. Steps S20 through S24 may be implemented subsequently.

In addition, a non-porous layer 10 of the wafer 1 having this non-porous layer 10 is removed (Step S28) to give rise to a bulk wafer, and the wafer 1 of a bulk wafer is used as a first wafer 1 of step S20, and again a process for producing SOI wafers in step S20 through step S25 can be implemented.

Reintroduction of the wafer obtainable in step S26 or step S28 takes place (n−1) times and step S20 through step S25 are repeated "n" times and "n" seets of SOI wafer are obtained.

In step S26 for the "n"-th use, the residual portion 41 on the wafer 1 (semiconductor substrate) after peeled off is removed by polishing, wet etching, hydrogen annealing, etc., and is smoothed so that a wafer having a non-porous layer 10 can be obtained. In addition, moreover, if the non-porous layer 10 is removed, the same bulk wafer as that in the first case will be obtained (Step S28).

Moreover, gin accordance with necessity, as shown in step S27, a surface of the wafer 1 after peeling may undergo epitaxial growth treatment to cause the epitaxial layer 7 made of a non-porous P-type single-crystalline semiconductor to be formed. Thus, an epitaxial wafer is obtained.

Embodiment 3

Next, with reference to FIG. 4 again, a process for producing a wafer according to a third embodiment of the present invention will be described.

At first in step S20, a first wafer 1 comprising a bulk wafer such as a CZ silicon wafer, an FZ silicon wafer, etc. is prepared, and a surface layer thereof is subjected to epitaxial growth treatment so that a single-crystalline semiconductor layer 3 is formed thereon. This single-crystalline semiconductor layer 3 is preferably $P^+$ layer with a boron density of approximately $1\times10^{17}$ cm$^{-3}$ to $1\times10^{20}$ cm$^{-3}$.

In step S21, a second wafer 2 made of a bulk wafer, etc. such as CZ silicon wafer, and FZ silicon wafer, a wafer treated with hydrogen annealing, etc., to become a second member is prepared.

The second wafer may be a wafer from which a semiconductor is exposed or may have an insulating film formed on a surface thereof, or in stead of the second wafer, an insulating light-transmissive substrate such as quartz glass may be used.

In addition, a surface of an epitaxial layer 3 of the first wafer undergoes anodization, etc. and made porous to form a porous layer 4. At this time, only a surface of the epitaxial layer 3 preferably is made porous so that an epitaxial layer 10 of approximately 100 nm to 20 μm is left under the porous layer 4. Of course, all the epitaxial layer 3 can be made porous or the epitaxial layer can be made porous in the depth of a thickness not smaller than that of the epitaxial layer.

Subsequently, in step S22, a non-porous layer 5 is formed on a porous layer 4 so that the first member is formed. As a forming method of the non-porous layer 5, there is a method in which holes of the porous layer 4 are closed by hydrogen annealing so as to make the surface layer non-porous, or a method in which a non-porous single-crystalline layer is formed by epitaxial growth. In addition, in accordance with necessity a surface of the non-porous layer 5 is oxidized and the like so that an insulating layer 6 is formed on the non-porous layer 5. In stead of heat-oxidizing, the insulating layer 6 may be formed by CVD and sputtering, etc. In the present embodiment, the porous layer 4 will become a separation layer.

In step S23, a multilayer structure 100 is formed by bonding a surface of the insulating layer 6 of the first wafer 1 and a surface of the second wafer 2. At the time of bonding, the both wafers may be caused to come in contact under the room temperature, and thereafter undergo heat treatment to increase bonding strength, or may be bonded by anode bonding. Further heat treatment may be implemented at the time when contact takes place. Moreover, in the bonding step, heat treatment, etc. may be implemented while the both wafers are placed under high pressure so as to come in tighter contact.

In addition, it is also preferable that either of a pair of bonding surfaces undergoes plasma treatment with oxygen, nitrogen, nitrogen, silicon, hydrogen, a rare gas, etc. so that the bonding surface is activated in advance. Moreover, bonding may take place by interposing an adhesive layer between them.

In addition, in step S24, at the separation layer (the porous layer 4), a multilayer structure 100 is separated by the aforementioned method. The non-porous portion of the peeled first wafer maintains a wafer shape, and in some cases there exists a residual portion 41 of the porous layer on the separation surface. On the other hand, onto the second wafer 2, the non-porous layer 5 together with the insulating layer 6 are tranferred from the first wafer, and in some cases have the residual portion 42 of the porous layer on its surface.

In step S25, in accordance with necessity the residual portion 42 of the porous layer is removed. In the case where thickness of the residual portion 42 is comparatively thick, the residual portion 42 undergoes wet etching and is selectively removed by using a mixed liquid of fluoric acid, hydrogen peroxide, and alcohol as an etchant, and thereafter a surface is smoothed with hydrogen annealing. In the case where a thickness of the residual portion 42 is thin, the portion may undergo hydrogen annealing for smoothing treatment simultaneously with removal of the residual portion 42 without undergoing wet etching. Thus, highly value-added SOI wafers can be obtained.

In step S26, the residual portion 41 on the wafer 1 (semiconductor substrate) after peeling is removed by polishing, wet etching, hydrogen annealing, etc., and is smoothed. At this time, an epitaxial layer 10 is left on the wafer 1. In addition, a wafer 1 having this epitaxial layer 10, or a wafer 1 from which a the epitaxial layer 10 is removed (Step S28) to give rise to a bulk wafer, is used as a first wafer 1 or a second wafer 2 of step S20, and again a process for producing SOI wafers in step S20 through step S25 is implemented. Reintroduction of the wafer obtainable in step S26 or step S28 takes place (n–1) times and step S20 through step S25 are repeated "n" times and "n" sheets of SOI wafer are obtained.

In step S26 for the "n"-th use, the residual portion 41 on the wafer 1 (semiconductor substrate) after peeling is removed by polishing, wet etching, hydrogen annealing, etc., and is smoothed so that a wafer having an epitaxial layer 10 can be obtained. Under this condition, the wafer undergoes hydrogen annealing so that a surface thereof is smoothed and the concentration of boron contained therein decreases due to outward diffusion and the layer 10 will become a $P^-$-type single-crystalline semiconductor layer. This is a wafer with the same quality as that for so called $P^-$ epitaxial wafer. If there is no needs of actively diffusing outward, surface smoothing by way of polishing or short-time hydrogen annealing will give rise to a wafer with the same quality as that of a $P^-$ epitaxial wafer.

In addition, when the epitaxial layer 10 being removed, the same bulk wafer as that in the first case will be obtained (Step S28).

Moreover, in accordance with necessity, as shown in step S27, a surface of the wafer 1 after peeling may undergo epitaxial growth treatment to cause the epitaxial layer 7 made of non-porous P-type single-crystalline semiconductor to be formed. Thus, an epitaxial wafer is obtained. The epitaxial layer inclues $P^-$ epitaxial layer, N epitaxial layer, etc.

Embodiment 4

Figure 5:
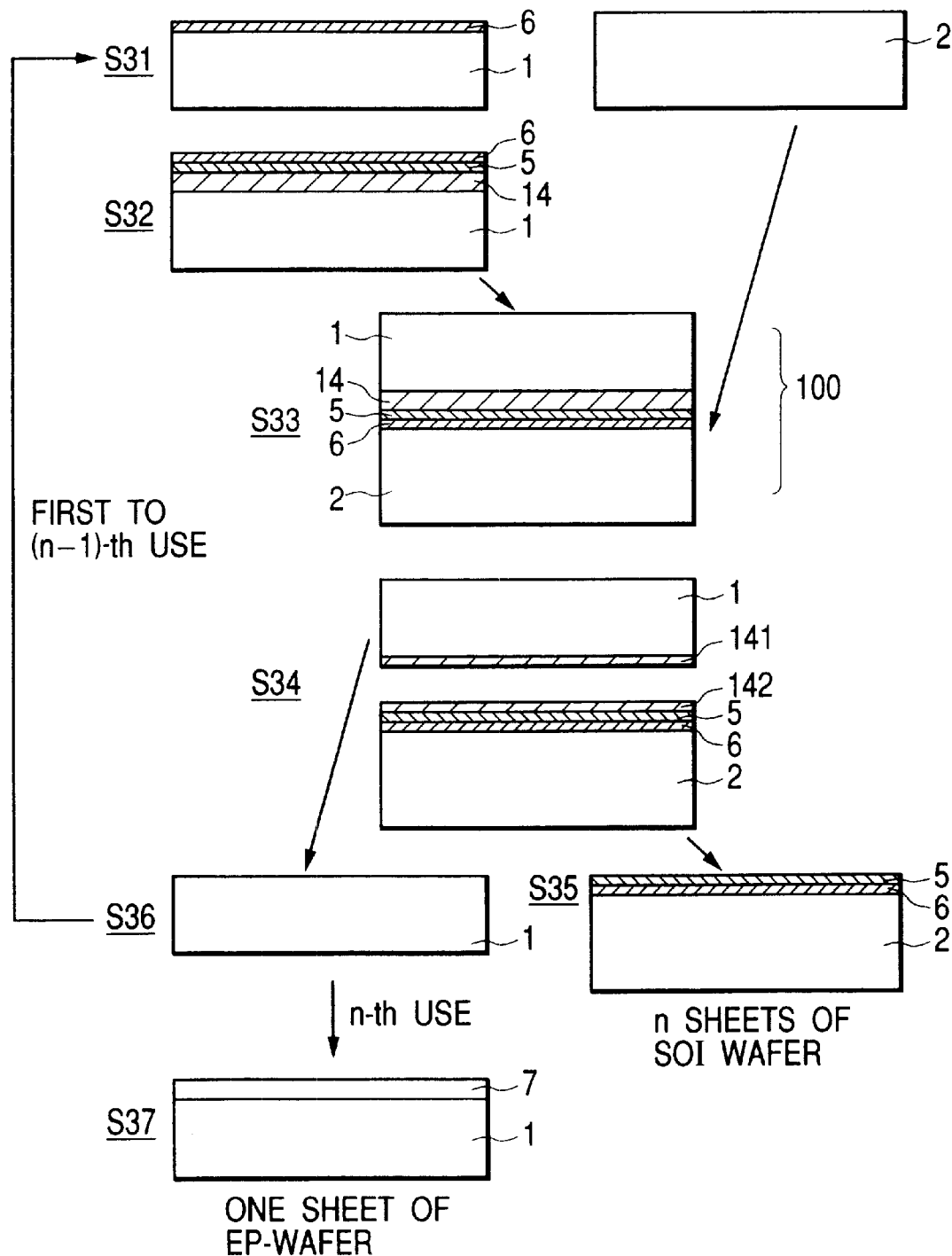
FIG. 5 is a schematically cross-sectional view showing the steps of producing a semiconductor member according to a basic embodiment of the present invention.

FIG. 5 is a is a flow chart showing the steps of process for producing wafers according to the fourth embodiment of the present invention.

At first, in step S31, a first wafer 1 comprising a bulk wafer such as a CZ silicon wafer and an FZ silicon wafer, etc., and a second wafer 2 to become a second member are prepared.

In this context, an insulating layer 6 is desirably formed by oxidizing and the like, a surface of the first wafer. The second wafer may be a wafer from which a semiconductor is exposed or may have an insulating film formed on a surface thereof, or in stead of the second wafer, an insulating light-transmissive substrate such as quartz glass may be used. A sapphire substrate or SiC or diamond thin film will do as well.

Subsequently, in step S32, ions selected from hydrogen, nitrogen, a rare gas such as He, Ar or the like, water vapor, methane, hydrogenated-compound, etc. are implanted so that a layer 14 including a potential microcavities as a separation layer is formed at a predetermined-depth position. Thus, a non-porous layer 5 of a single-crystaline semiconductor is left on the separation layer 14. Thus, the first member is formed. An ion-implanted layer denotes a layer forming microcavities due to aggregation. The separation using ion-implanted layer is described in, for example, U.S. Pat. No. 5,374,564.

In step S33, a multilayer structure 100 is formed by bonding a surface of the insulating layer 6 of the first wafer 1 and a surface of the second wafer 2. At the time of bonding, the both wafers may be caused to come in contact at the room temperature throughout the treatment or to come in contact first at the room temperature and thereafter undergo heat treatment to increase bonding strength, or may be bonded by anode bonding. The heat treatment may be implemented at the same time when contact takes place. Moreover, in the bonding step, heat treatment, etc. may be implemented while the both wafers are placed under high pressure so as to come in tighter contact. In addition, bonding may take place by interposing an adhesive layer between them. In addition, it is also preferable that any of a pair of bonding surfaces undergoes plasma treatment with oxygen, nitrogen, nitrogen, silicon, hydrogen, rare gas (Ar, Ne), anmonia, water vapor, etc. so that the bonding surface is activated in advance.

In addition, in step S34, at the separation layer 14, a multilayer structure is separated by the aforementioned method. In the method of the present embodiment, at a temperature of not less than 500° C. at the time of heat treatment in step S33, separation phenomena could take place concurrently with bonding.

The non-porous portion of the peeled first wafer maintains a wafer shape, and in some cases there exists a residual portion 141 of the separation layer 14 on the separation surface. On the other hand, onto the second wafer 2, the non-porous layer 5 together with the insulating layer 6 are transferred from the first wafer, and in some cases there is the residual portion 142 of the separation layer 14 on that separation surface.

In step S35, the residual portion 142 is removed. At this time, polishing may take place with low polishing rate, and thereafter hydrogen annealing may take place. The portion may undergo hydrogen annealing without polishing for smoothing treatment and simultaneously the residual portion 142 may be removed. Thus, highly value-added SOI wafers can be obtained.

In step S36, the residual portion 141 on the wafer 1 (semiconductor substrate) after peeling is removed by polishing, wet etching, hydrogen annealing, etc., and is smoothed. Thus, a bulk wafer is obtained.

This bulk wafer is used as a first wafer 1 or a second wafer 2 of step S31, and again a process for producing SOI wafers in step S31 through step S35 is implemented. Reentry into a process for producing SOI wafers of the bulk wafer obtainable in step S36 takes place (n–1) times and step S31 through step S35 are repeated "n" times and n sheets of SOI wafer are obtained.

In step S36 for the "n"-th use, the residual portion 141 on the wafer 1 (semiconductor substrate) after peeling is removed by polishing, wet etching, hydrogen annealing, etc., and is smoothed to obtain a bulk wafer.

Moreover, in accordance with necessity, as shown in step S37, a surface of the wafer 1 after peeling may undergo epitaxial growth treatment to cause the epitaxial layer 7 made of a non-porous P-type single-crystalline semiconductor to be formed. Thus, an epitaxial wafer is obtained.

A high-concentration P-type wafer is used as the first wafer 1, and a $P^-$ single-crystallne layer is used as the epitaxial layer 7 so that a $P^-$ epi-/$P^+$ substrate is formed in step S37, and hydrogen annealing is conducted in step S35 and then the high-concentration $P^+$ layer 5 is less concentrated due to outward diffusion to form an SOI wafer ($P^-$ layer).

Formation of a separation layer 14 will be described in detail as follows.

Ion implantation can be implemented by usage of a beam line ion implantation apparatus and a process of plasma immersion ion implantation (PIII) which is described in International Publication Nos. W98/52216, WO99/06110, and Proceedings 1998 IEEE International SOI Conference, Oct. 1998.

As ion seeds to be implanted, hydrogen, water vapor, methane, hydrogenated-compound and rare gas such as He, Ar, Kr, Xe, etc. are used.

In the case where hydrogen used, in addition to $H^+$, $H_2^+$ and $H_3^+$ may be used. Not only positive ions but also negative ions such as $H^-$ are preferably used. In addition, these may be used in combinations.

Dosage to be implanted could amount to not less than $10^{15}$ and not more than $10^{18}$ $atm^s/cm^2$, and preferably not less than $10^{16}$ and not more than $10^{17}$ $atm^s/cm^2$.

Energy for implantation within a range of 1 KeV to 1 MeV may be used.

Implantation can take place under a temperature within a range of −200° C. to 600° C., but the temperature is desirably a low temperature lower than 400° C. so that blister (convexity in a wafer surface due to microcavities prior to a bonding step, or flaking (peeling of a surface layer of a wafer) will not take place.

Accordingly, also in the case where a multilayer structure 100 is formed, a temperature for heat treatment is desirably not more than 400° C.

Heat treatment in the case where a multilayer structure undergoes heat treatment for separation takes place in a range of not less than 400° C. and not more than 1000° C., and more preferably not less than 400° C. and not more than 600° C.

In addition, the multilayer structure can be separated with the already described fluid jet, or in combination of heat treatment and the fluid jet.

As the fluid jet, a fluid such as high pressure water, etc., gases, etc. such as nitrogen gas, etc. and the already described fluid can be used.

In the case where a fluid such as nitrogen gas, etc. is jetted to the vicinity of a separation layer 14, separation can take place even at a room temperature.

Embodiment 5

Figure 6:
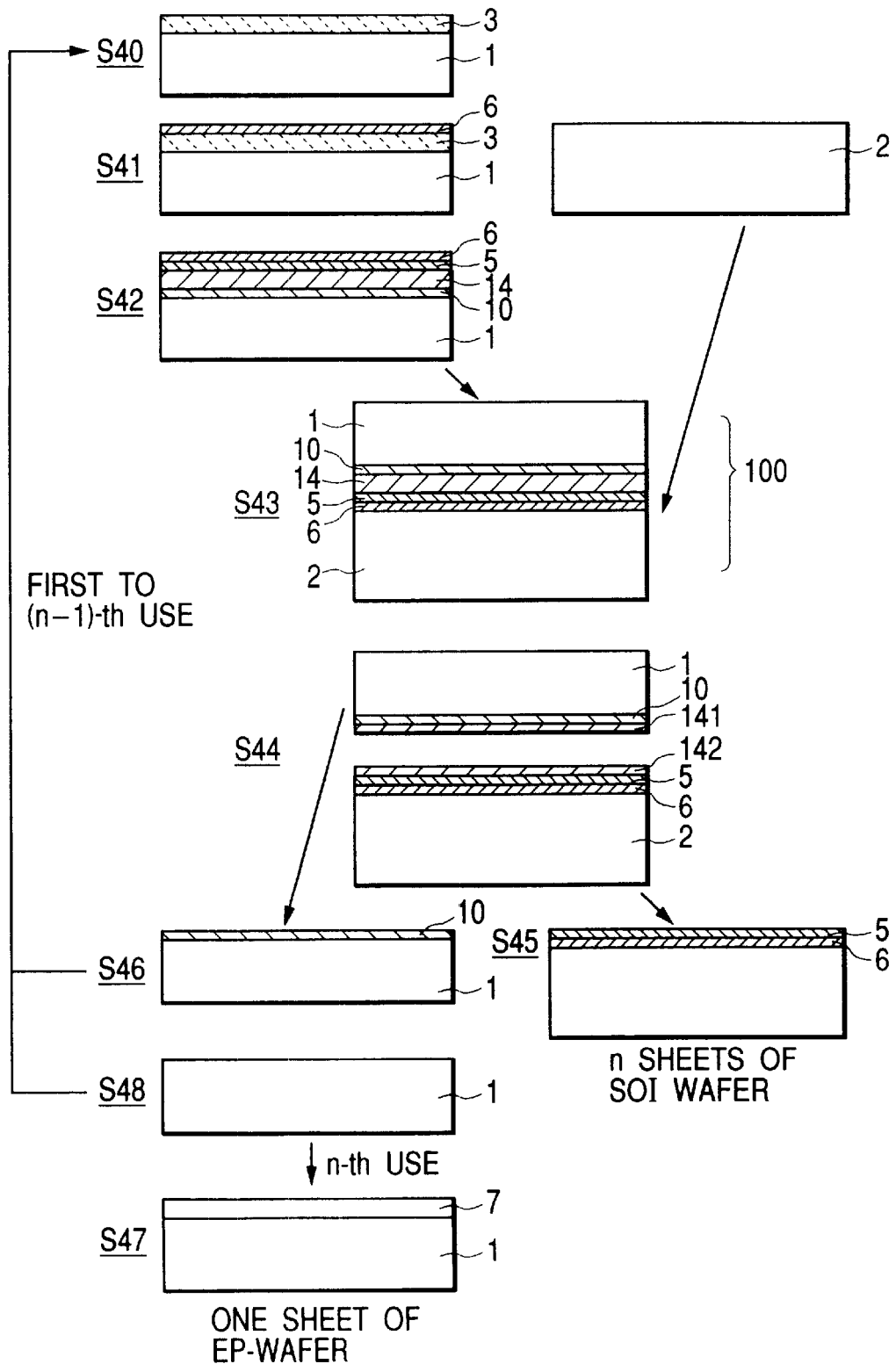
FIG. 6 is a schematically cross-sectional view showing the steps of producing a semiconductor member according to a basic embodiment of the present invention.

FIG. 6 is a flow chart showing steps of process for producing wafers according to the fifth embodiment of the present invention.

At first in step S40, a first wafer 1 comprising a bulk wafer such as a CZ silicon wafer, an FZ silicon wafer, etc. is prepared, and a surface layer thereof undergoes epitaxial growth treatment so that a single-crystal semiconductor layer 3 is formed thereon.

In step S41, a second wafer 2 made of a bulk wafer, etc. such as CZ silicon wafer, FZ silicon wafer, etc., to become a second member is prepared.

The second wafer may be a wafer from which a semi-conductor is exposed or may be have an insulating film formed on a surface thereof, or in stead of the first wafer, may be an insulating light-transmissive substrate such as quartz glass.

In addition, in accordance with necessity a surface of the epitaxial layer 3 is theremally oxidized and the like so that an insulating layer 6 is formed. Subsequently, ions selected from hydrogen, nitrogen, rare gas, etc. are implanted so that a layer 14 including microcavities to become a separation layer is formed at a predetermined-depth position. Thus, non-porous layer 5 of a single-crystalline semiconductor is left on the separation layer 14. Thus the first member is formed. Incidentally, for forming the separation layer 14, the method described in the embodiment 4 can be used.

At this time, ions are preferably implanted into the epitaxial layer 3 so that a non-porous epitaxial layer 10 of approximately 10 nm to 20 μm is left under the separation layer 14.

In step S43, a multilayer structure 100 is formed by bonding a surface of the insulating layer 6 of the first wafer 1 and a surface of the second wafer 2. At the time of bonding, the both wafers may be caused to come in contact under the room temperature throughout the treatment or to come in contact first the room temperature and thereafter undergo heat treatment to increase bonding strength, or may be bonded by anode bonding. The heat treatment may be implemented at the same time when contact takes place. Moreover, in the bonding step, heat treatment, etc. may be implemented while the both wafers are placed under high pressure so as to come in tighter contact. In addition, bonding may take place by interposing an adhesive layer between the first wafer and the second wafer.

In addition, it is also preferable that any of a pair of bonding surfaces undergoes plasma treatment with oxygen, nitrogen, silicon, hydrogen, rare gas, etc. so that the bonding surface is activated in advance.

In addition, in step S44, at the separation layer 14, a multilayer structure is separated by the aforementioned method. In the method of the present embodiment, at a temperature of not less than 500° C. at the time of heat treatment in step S33, separation phenomena could take place concurrently with bonding.

The peeled first wafer 1 maintains a wafer shape without decreasing its thickness, and has a residual portion 141 of the separation layer 14 on the separation surface. On the other hand, onto the second wafer 2, the non-porous layer 5 together with the insulating layer 6 are transfrred from the first wafer, and has the residual portion 142 of the separation layer 14 on that separation surface.

In step S45, the residual portion 142 is removed.

At this time, polishing may take place with low polishing rate, and thereafter hydrogen annealing may take place. Otherwise, the portion may undergo hydrogen annealing for smoothing treatment simultaneously with removal of the residual portion 142 without polishing. Thus, highly value-added SOI wafers can be obtained.

In step S46, the residual portion 141 on the wafer 1 (semiconductor substrate) after peeling is removed by polishing, wet etching, hydrogen annealing, etc., and is smoothed. At this time, an epitaxial layer 10 is left on the wafer 1. In addition, a wafer 1 having this epitaxial layer 10, or a wafer 1, from which the epitaxial layer 10 is removed (Step S48) to give rise to a bulk wafer, is used as a first wafer 1 of step S40, and again a process for producing SOI wafers in step S40 through step S45 is implemented. Reintroduction of the wafer obtainable in step S46 or step S48 takes place (n−1) times and step S40 through step S45 are repeated "n" times and n sheets of SOI wafer are obtained.

In step S46 for the "n"-th use, the residual portion 141 on the wafer 1 (semiconductor substrate) after peeling is removed by polishing, wet etching, hydrogen annealing, etc., and is smoothed so that a wafer having an epitaxial layer 10 can be obtained.

Under this condition, the wafer undergoes hydrogen annealing so that a surface thereof is smoothed and, if boron concentration is high, borons contained therein decreases due to outward diffusion and the layer 10 will become a P⁻-type single-crystalline semiconductor layer.

In addition, if the epitaxial layer 10 is removed, the same bulk wafer as that in the first case will be obtained (Step S48).

Moreover, in accordance with necessity, as shown in step S47, a surface of the wafer 1 after peeling may undergo epitaxial growth treatment to cause the epitaxial layer 7 made of non-porous P-type single-crystalline semiconductor to be formed. Thus, an epitaxial wafer is obtained.

A high-concentration P-type wafer is used as the first wafer 1 and a P⁻ single-crystalline layer is used as the epitaxial layer 7 so that a P⁻ epi-/P⁺ substrate is formed in step S47, and undergoes hydrogen annealing in step S45 and then the high-concentration P⁺ layer 5 decreases in boron concentration due to outward diffusion of borons to give rise to an SOI wafer (P⁻ layer). Incidentally, in the present invention, a high-concentration P-type semiconductor wafer has a resistivity (specific resistance) of 0.001–0.5 Ωcm and a boron concentration of approximately not less than $1\times10^{17}$ cm⁻³ and not more than $1\times10^{20}$ cm⁻³.

Embodiment 6

As a first-substrate, a semiconductor substrate such as a silicon wafer is prepared. A semiconductor layer comprising other semiconductors which undergoes hetero-epitaxial growth is formed by way of a method such as CVD or molecule beam epitaxial growth on the semiconductor substrate. This semiconductor is SiGe or Ge.

On the other hand, as a second substrate, a silicon wafer is prepared. An insulating film such as an oxide film is formed on at least any one of a surface of the semiconductor layer and/or the second substrate surface The first substrate and the second substrate is bonded to obtained a multilayer structure.

In the thus obtained multilayer structure, stress is concentrated on a hetero intersurface, that is, an intersurface between the first substrate and the semiconductor layer, and therefore the multilayer structure is configured to be apt to undergo peeling on this intersurface.

Accordingly, energy, which is given for the above-described separation, triggers separation of the multilayer structure, and the semiconductor layer is transferred onto the second substrate. Incidentally, the separation surface can fluctuate more or less, and, in accordance with necessity, undergoes flattening. The hetero-epitaxial layer is caused to grow again on the separated first substrate so that transference of the hetero-epitaxial layer onto the second substrate is repeated a plurality of times and thereafter, the first substrate is diverted as a bulk wafer or an epi-wafer.

(Manufacturing System)

A manufacturing system (a manufacturing plant) appropriate for implementing a process for producing wafers of the present invention will be described as follows.

Figure 7:
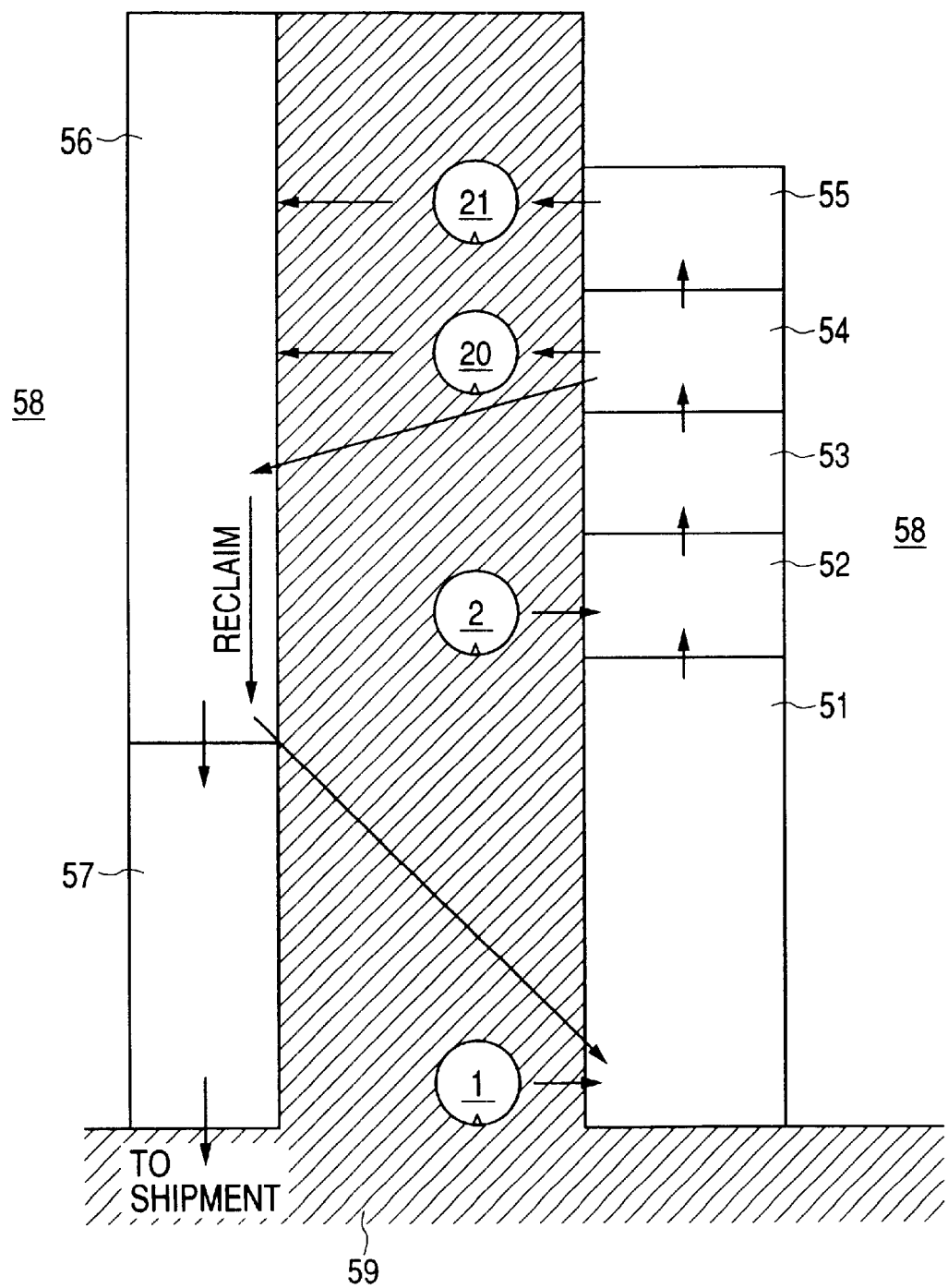
FIG. 7 is an explanation diagram for showing one example of production system according to a basic embodiment of the present invention.

FIG. 7 is a schematic diagram showing an embodiment of a manufacturing system. As shown in FIG. 7, a first substrate (a wafer) 1 is conveyed to a process apparatus group 51 comprising an anodization apparatus, an epitaxial growth apparatus, an ion implantation apparatus, an oxidizing apparatus, etc. so as to undergo the aforementioned step S2, etc.

The first substrate 1 on which a separation layer is formed is conveyed to a bonding apparatus group 52, and undergoes bonding with a second substrate (a wafer) 2 there so that a multilayer structure is obtained.

The multilayer structure is conveyed to a separation apparatus group 53 including, for example, a water jet apparatus, a heat treatment apparatus, a wedge inserting apparatus, etc. and is separated there.

The second substrate after separation is conveyed to a separation layer removing and surface smoothing apparatus group 54 including an etching apparatus, a polishing apparatus, a heat treatment apparatus, etc. and is treated to complete an SOI wafer 20.

On the other hand, the separated first substrate undergoes smoothing treatment with the apparatus group 54, and then becomes a bulk wafer, or as a first substrate again, it is conveyed to the process apparatus group 51.

Thus manufacturing of SOI wafers are implemented required times ("n" times), and n sheets of SOI wafer are manufactured.

After the "n"-th separation, the separated first substrate undergoes smoothing treatment with the apparatus group 54, and is conveyed to the bulk ware or epitaxial apparatus 55 to undergo epitaxial growth treatment so that an epitaxial wafer 21 is completed.

Incidentally, in the case where epitaxial growth treatment is implemented, operation of the epitaxial apparatus 55 can coincide with operation of an epitaxial apparatus in the process apparatus group 51 so that operation efficiency of epitaxial apparatuss can be improved.

These SOI wafer 20 and epitaxial wafer 21 (or bulk wafer) are conveyed to an inspection analyzing apparatus group 56 to undergo film thickness distribution measurement, foreign matter particle density measurement, defect density measurement, etc., and then are packed in boxes by a packing-for-shipment apparatus group 57 for shipment. Reference numeral 58 denotes a maintenance area, and reference numeral 59 denotes a clean area for wafers to be conveyed.

Figure 8:
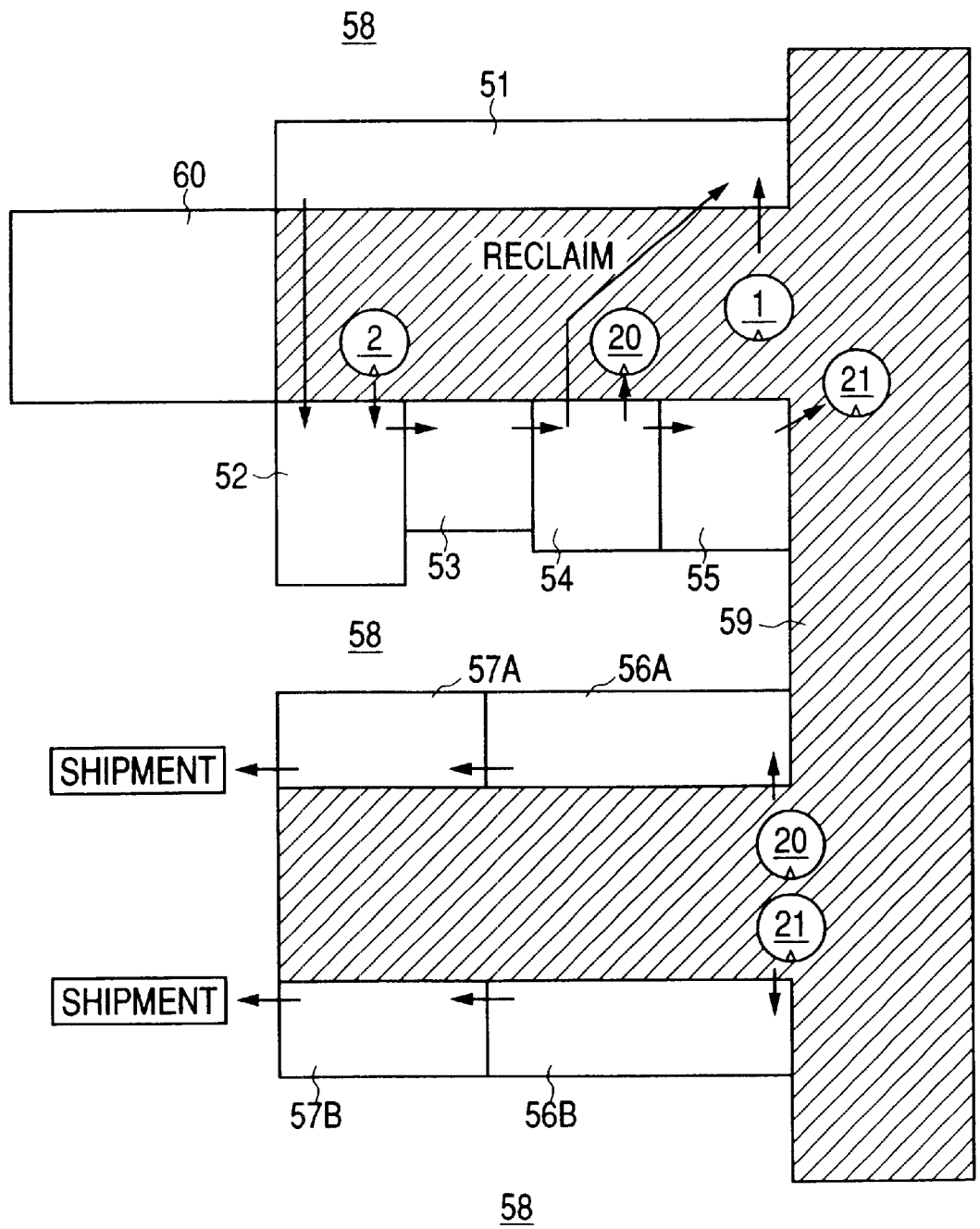
FIG. 8 is an explanation diagram for showing one example of production system according to the present invention.

FIG. 8 shows a system to which a system in FIG. 7 is partially altered so that an SOI wafer 20 and an epitaxial wafer 21 (or a bulk wafer) to be obtained respectively undergo inspection and packing into boxes.

FIG. 9 is a flow chart showing the inspection step of determining a destination of diversion of a first wafer after the "n"-th separation (that is, one wafer is subjected to, "n" times of use for the SOI manufacturing step).

As shown in FIG. 9, at first after the "n"-th separation the first wafer undergoes surface foreign matter measurement (Step S50). If light point deffects (for example, particles) on a wafer surface are not measured or are not more than a reference value, next surface roughness measurement is implemented based on a first standard (a low-level standard) (Step S51).

When the first standard of surface roughness is fulfilled, surface roughness measurement is implemented based on a second standard (a standard higher-level than the first standard) (Step S52).

When the second standard of surface roughness is fulfilled, determination on edge portions is implemented (Step S53). If there is no problem with respect to the edge portions, wafers are outputted as products for use as wafers for device fabrication, epi-wafers, high quality dummy wafers (Step S54).

In the case where the surface foreign matter exceeds a reference value in step S50 or in the case where in step S51 surface roughness does not fulfill the first standard, re-surface-treatment inclusive of recleaning and repolishing, etc. is implemented (Step S55).

After re-surface-treatment, in accordance with necessity, the wafer undergoes inspections in steps S50 through S54 are implemented again, or is used as a wafer for dummy (Step S56).

In addition, in the case where surface roughness does not fulfill the second standard in step S52, the wafer is used as a wafer for dummy (Step S56).

If there is any problem with respect to edge determination in step S53, re-edge-treatment inclusive of edge polishing, etc. is implemented (Step S57). When specifications on edges do not matter, wafers are outputted as a product line as are, and are used as device wafers, epi-wafers, and high quality dummy wafers (Step S54).

With reference to the drawings, embodiments of the present invention will be described in further detail as follows.

Embodiment 7

Figure 13:
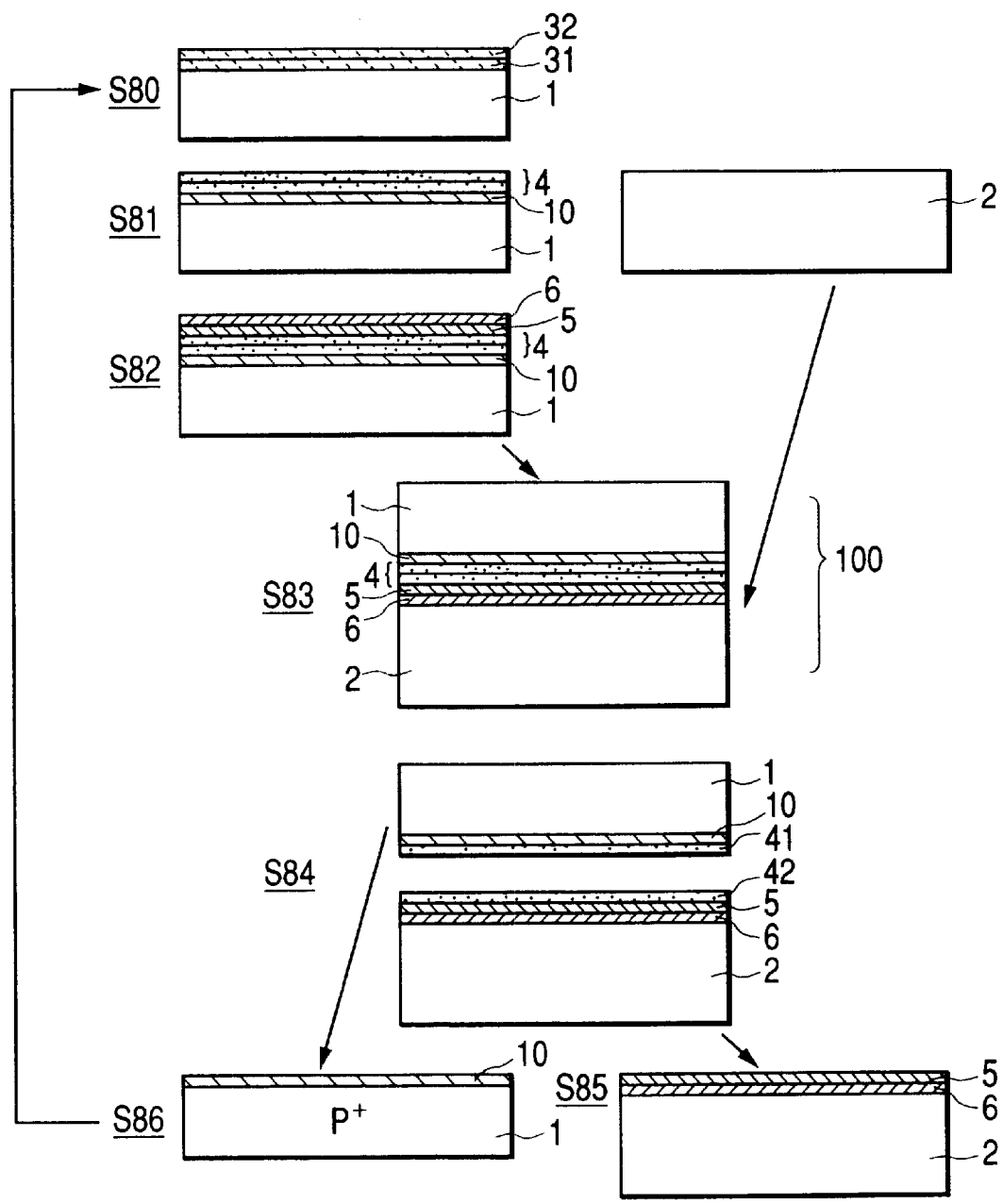
FIG. 13 is a schematically cross-sectional view showing the steps of producing a semiconductor member according to a basic embodiment of the present invention.

FIG. 13 is a flow chart showing steps of process for producing wafers according to the seventh embodiment of the present invention.

At first, in step S80, a first wafer 1 made of high-concentration P-type silicon wafer is prepared, and undergoes epitaxial growth to form a first epitaxial layer 31 and a second epitaxial layer 32 which has higher density of impurity than the epitaxial layer 31.

In the present embodiment, high-concentration P-type silicon wafer is used as a first wafer, which, of course, is not limited thereto. If steps described below can be implemented, an N-type silicon wafer can be used.

It will be good if density of impurity of the epitaxial layer 32 is higher than density of impurity of the epitaxial layer 31, and in particular a resistivity of the first epitaxial layer 31 falls within the range of 0.02 to 10000 $\Omega$cm, more preferably 0.1 to 100 $\Omega$cm, and a resistivity of the second epitaxial layer 32 falls within the range of 0.001 to 0.1 $\Omega$cm, more preferably 0.005 to 0.02 $\Omega$cm so that the resistivity of the epitaxial layer 32 is lower than the resistivity of the epitaxial layer 31. Specifying on basis of density of impurity, density of impurity of $1.3 \times 10^{12}$ cm$^{-3}$ to $3.2 \times 10^{18}$ cm$^{-3}$ specifies conductivity type of the first epitaxial layer and $2.5 \times 10^{17}$ cm$^{-3}$ to $1.2 \times 10^{20}$ cm$^{-3}$ specifies that of the second epitaxial layer.

In step S81, a second wafer 2 to become a second member made of a bulk wafer, etc. such as CZ silicon wafer, FZ silicon wafer, etc. is prepared. The second wafer may be a wafer from which a semiconductor is exposed or may be one on a surface of which an insulating film is formed, or in stead of the second wafer, an insulating light-transmissive substrate such as quartz glass may be used.

In addition, the epitaxial semiconductor layer 32 of the first wafer 1 and a portion of the epitaxial layer 31 thereof undergo anodization, etc. is made porous to form a porous layer 4.

In spite that a current is constant at the time of anodization, the epitaxial layers 31 and 32, which are thus mutually different in terms of density of impurity, can form porous layers having different porosity.

In a porous layer 4, a portion where a porous portion of the first epitaxial semiconductor layer 31 has a higher porosity than a porous portion of the second epitaxial semiconductor layer 32 and become vulnerable. At this time, porosity treatment is also preferably implemented so that a non-porous layer 10 of approximately 100 nm to 20 $\mu$m is left under the porous layer 4.

Forming epitaxial layers with different densities of impurity will be described further as follows.

An epitaxial growth layer is caused to be configured by two or more layers with at least one of composition, density of impurity, and kinds of an epitaxial growth layer being changed (density of impurity is changed in the present embodiment) so that a porous layer to be formed in such epitaxial growth layer is caused-to have a structure with two or more layers mutually different in terms of porosity. Thus if porosity in a porous layer can be controlled, a separation position in the porous layer may be specified in a separation step after the later described bonding.

It is desirable that a porous layer configuration comprises a layer with low porosity being disposed in a surface side and a porous layer with high porosity being disposed inside. The layer with low porosity in the surface side is necessary for a crystal property of non-porous single-crystalline layer being formed later to be improved. The layer with high porosity disposed inside, which is mechanically vulnerable, is a layer undergoing separation in a priotized fashion inside the layer with high porosity, or in an interface of a layer in the vicinity of the layer with high porosity in the separation step.

In addition, the first semiconductor layer itself may be divided into two layers and made porous so that a layer to operate as a separation layer and a layer not made porous being left on the first substrate are formed. In that case, this formation is conducted by varying an anodization current and the composition and concentration of an anodization solution.

In the case where a plurality of the first substrates are disposed in an anodization solution to form a porous layer, in some cases a silicon wafer is disposed in the anode side as a shield wafer. This is to prevent metal ions being melted out from the anode from being attached on a rear surface of the first substrate. In the case where two or more porous layers are formed with different current densities, in some cases a similar configuration is formed on a surface of the shield wafer.

If the shield wafer is used "m" times, 2 m porous layers will be formed in the shield wafer and the porous layer will become extremely unstable. Accordingly, for example, a porous layer being formed in the shield wafer at (m+1)-th use is peeled off so as to scatter in a container, which is a problem.

Especially, in the case where a layer with low porosity and a layer with high porosity are alternately formed, mechanical intensity will remarkably decrease compared with a case where porous layer with the same thickness are formed under a certain anodization conditions. That is, the times of use of the shield wafer are limited.

Prior to formation of a porous layer, a layer having different composition, and different density of impurity, and of different kind, etc. is formed in the epitaxial growth layer, and therefore, at least such a layer with low porosity and a layer with high porosity as described above can be formed without forming conditions (e.g. current density) of a porous layer during anodization being changed on purpose during formation of a porous layer.

According to the present invention, configurations of a second and upper porous layers of the first substrate are determined by configurations of the epitaxial growth layer formed on a surface of the first substrate in advance, and therefore, a current density applied to the shield wafer can be fixed, and life of the shield wafer can be extended.

For example, from the side of the first wafer 1, a first porous layer having a first porosity, a second porous layer being disposed on the first porous layer and having a second porosity larger than the first porosity, and a third porous layer being disposed on the second porous layer and having a third porosity smaller than the second porosity are formed in this order. That is, among three porous layers, porosity in the middle porous layer (the second porous layer) is made the largest.

In such a case, the separation surface can be specified inside the second porous layer or in the vicinity thereof so that defects entry to a non-porous layer 5 and the first wafer 1 can be prevented.

In the case where three layers or more of porous structure are formed, layers having different compositions, densities of impurity, and kinds matching with these porous layers should be formed and get ready for use.

Subsequently, in step S82, a non-porous layer 5 is formed on a porous layer 4 so that the first member is formed. As a forming method of the non-porous layer 5, there is a method in which holes of the porous layer 4 are closed by hydrogen annealing to make the surface layer non-porous, or a method in which non-porous single-crystalline layer is formed by epitaxial growth.

In addition, in accordance with necessity a surface of the non-porous layer 5 is oxidized and the like so that an insulating layer 6 is formed on the non-porous layer 5. In stead of heat-oxidizing, the insulating layer 6 may be formed by CVD and sputtering, etc. In the present embodiment, the porous portion of the epitaxial semiconductor layer 31 will become a separation layer.

In step S83, a multilayer structure 100 is formed by bonding a surface of the insulating layer 6 of the first wafer 1 and a surface of the second wafer 2. At the time of bonding, the both wafers may be caused to come in contact at the room temperature, and thereafter undergo heat treatment to increase bonding intensity, or may be bonded by anode bonding. Or, contact may coincide with heat treatment. Moreover, in the bonding step, heat treatment, etc. may be implemented while the both wafers are placed under high pressure so as to come in tighter contact. Heat treatment is preferably implemented in an oxidizing atmosphere or an inert gas atmosphere ($N_2$, Ar, etc.).

In addition, it is also preferable that any one of a pair of bonding surfaces undergoes plasma treatment with oxygen, nitrogen, silicon, hydrogen, and rare gas, etc. so that the bonding surface is activated in advance. Moreover, bonding may take place by interposing an adhesive layer between them.

In addition, in step S84, at the separation layer (the porous portion of the epitaxial semiconductor layer 31), a multilayer structure 100 is separated by the aforementioned method. The non-porous portion of the peeled first wafer maintains a wafer shape, and in some cases there exists a residual portion 41 (a part of a porous portion of the epitaxial semiconductor layer 31) of the porous layer on the separation surface. On the other hand, onto the second wafer 2, the non-porous layer 5 together with the insulating layer 6 are transferred from the first wafer, and, in some cases, there is the residual portion 42 (a porous portion of the epitaxial layer 32 and a part of a porous portion of the epitaxial semiconductor layer 31) of the porous layer on its surface.

In step S85, the residual portion 42 is removed. In the case where thickness of the residual portion 42 is comparatively thick, the residual portion 42 undergoes wet etching and is selectively removed by using a mixed liquid of fluoric acid, hydrogen peroxide and alcohol as etchant, and thereafter a surface is smoothed with hydrogen annealing.

In the case where thickness of the residual portion 42 is thin, the portion may undergo hydrogen annealing for smoothing treatment simultaneously with removal of the residual portion 42 without undergoing wet etching. Thus, highly value-added SOI wafers can be obtained.

In step S86, the residual portion 41 on the wafer 1 (semiconductor substrate) after peeling is removed by polishing, wet etching, hydrogen annealing, etc., and is smoothed. At this time, a low-concentration P-type epitaxial layer 10 is left on the wafer 1. The wafer 1 having this epitaxial layer 10 is introduced into step S80 (after the low-concentration P-type epitaxial layer being formed in accordance with necessity) and a high-concentration epitaxial layer 32 is formed. And again a process for producing SOI wafers in step S80 through step S85 is implemented. Reentry of the wafer obtainable in step S86 takes place (n−1) times and step S80 through S85 are repeated "n" times and n sheets of SOI wafer are obtained.

In step S86 for the "n"-th use, the residual portion 41 on the wafer 1 (semiconductor substrate) after peeling is removed by polishing, wet etching, hydrogen annealing, etc., and is smoothed so that an epitaxial wafer having a low-concentration P-type epitaxial layer 10 can be obtained.

In particular, if a high-concentration P-type silicon wafer is used as the first wafer, and the epitaxial layer 31 has a concentration of an impurity controlling P-type conductivity lower than the first wafer, step S86 will give rise to a p⁻ epitaxial layer on the so-called P⁺ substrate. Incidentally, a high-concentration P-type semiconductor wafer has a boron density of approximately $1 \times 10^{17}$ to $1 \times 10^{20}$ cm$^{-3}$ and a resistivity of 0.001 to 0.5 Ωcm.

Embodiment 8

Figure 14:
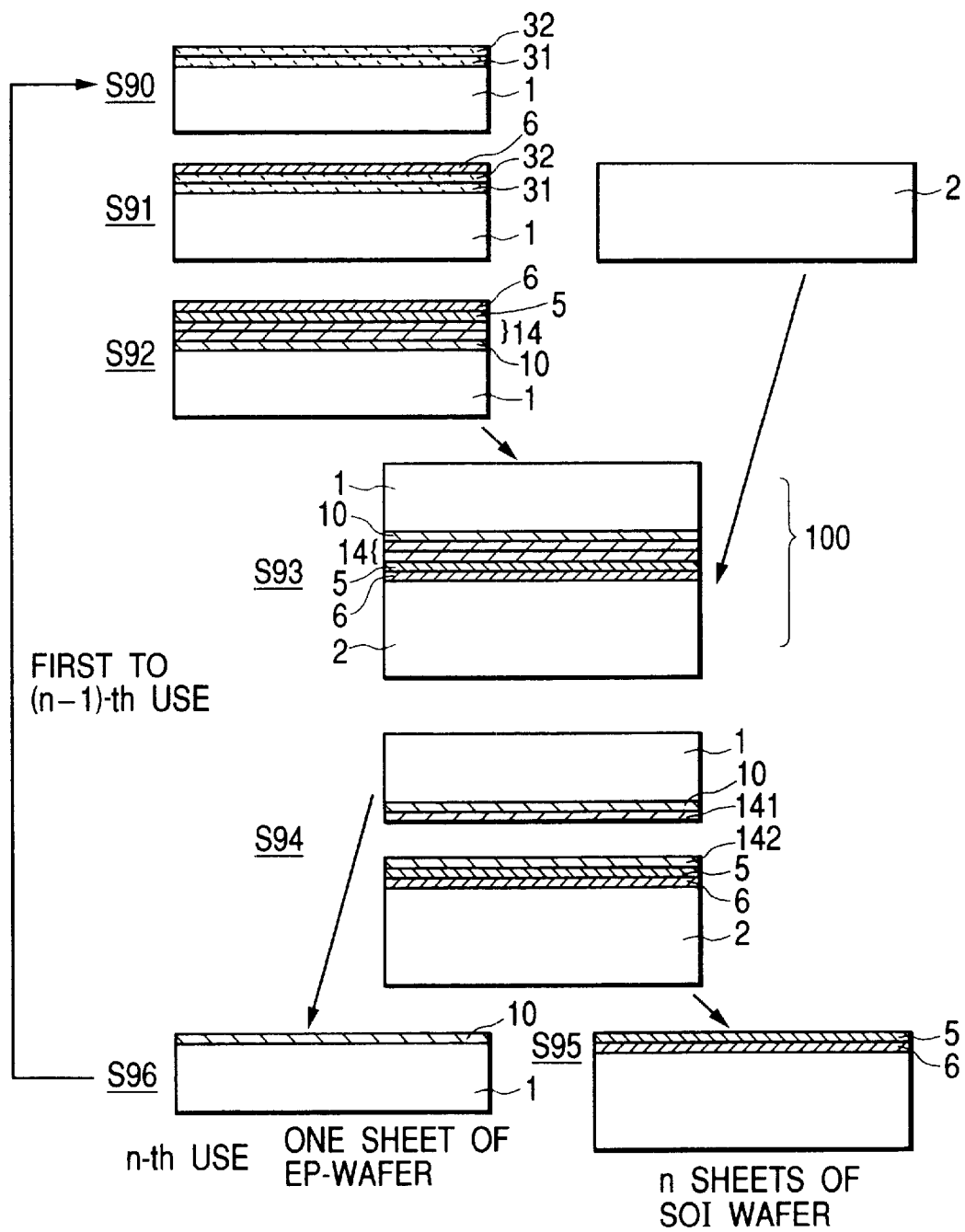
FIG. 14 is a schematically cross-sectional view showing the steps of producing a semiconductor member according to a basic embodiment of the present invention.

FIG. 14 is a flow chart showing steps of process for producing wafers according to the second embodiment of the present invention.

At first in step S90, a first wafer 1 comprising a high-concentration P-type silicon wafer is prepared, and a surface thereof undergoes epitaxial growth treatment so that an epitaxial layer 31 of a first conductive type and having a first resistivity (e.g., P⁻) and an epitaxial layer 32 of a second conductive type and having a second resistivity (n) are formed. In the present embodiment, the epitaxial layer 32 will become an active layer at the side of the SOI wafer, and the epitaxial layer 31 will become an active layer at the side of the epitaxial wafer. The respective active layers can be produced with epitaxial growth in one series of step. The epitaxial layer 31 and the epitaxial layer 32 may have the same conductive type (P type or N type) if their densities of impurity are mutually different.

In step S91, a second wafer 2 made of a bulk wafer, etc. such as CZ silicon wafer, FZ silicon wafer, etc., to become a second member is prepared. The second wafer may be a wafer from which a semiconductor is exposed or may a wafer having an insulating film formed on a surface of thereof, or in stead of the first wafer, may be an insulating light-transmissive substrate such as quartz glass.

In addition, a surface of the epitaxial layer 32 of the first wafer is heat-oxidized and the like so that an insulating layer 6 is formed. Subsequently, ions selected from hydrogen, nitrogen, a rare gas, etc. are implanted so that a layer 14 including microcarities to become a separation layer is formed at a predetermined-depth position. Thus, non-porous layer 5 of a single-crystalline semiconductor is formed on the separation layer 14. Thus the first member is formed.

At this time, ions are preferably implanted into the epitaxial layer 31 or/and the epitaxial layer 32 so that a non-porous epitaxial layer 10 (a part of the epitaxial layer 31) of approximately 10 nm to 20 μm is left under the separation layer 14.

Here, the separation layer 14 is formed so that an intersurface between the epitaxial layer 31 and the epitaxial layer 32 exists in the separation layer 14 (that is, so that the separation layer is formed in the vicinity of the intersurface between the epitaxial layer 31 and the epitaxial layer 32).

In step S93, a multilayer structure 100 is formed by bonding a surface of the insulating layer 6 of the first wafer 1 and a surface of the second wafer 2. At the time of bonding, the both wafers may be caused to come in contact at the room temperature throughout the treatment or to come in contact first at the room temperature and thereafter undergo heat treatment to increase bonding intensity, or may be bonded by anode bonding. The heat treatment may be implemented at the same time when contact takes place. Moreover, in the bonding step, heat treatment, etc. may be implemented while the both wafers are placed under high pressure so as to come in tighter contact. In addition, bonding may take place by displacing an adhesive layer between them. In addition, it is also preferable that any one of a pair of bonding surfaces undergoes plasma treatment with oxygen, nitrogen, silicon, hydrogen, rare gas, etc. so that the bonding surface is activated in advance.

In addition, in step S94, at the separation layer 14, a multilayer structure 100 is separated by the aforementioned method. At a temperature of not less than 500° C. at the time of heat treatment in step S93, separation phenomena could take place concurrently with bonding.

The peeled first wafer 1 maintains a wafer shape without decreasing its thickness. In some cases, there exists a residual portion 141 of the separation layer 14 on the separation surface. On the other hand, in some cases, onto the second wafer 2, the non-porous layer 5 together with the insulating layer 6 are transferred from the first wafer, and there is the residual portion 142 of the separation layer 14 on that separation surface. The residual portion 142 is removed so that an SOI wafer can be obtained.

In step S96, the residual portion 141 on the wafer 1 (semiconductor substrate) after peeling is removed by polishing, wet etching, hydrogen annealing, etc., and is smoothed. At this time, an epitaxial layer 10 formed in step S90 is left. The wafer 1 having this epitaxial layer 10 is introduced into step S90 (after the low-concentration P-type epitaxial layer being formed in accordance with necessity) and the epitaxial layer 32 is formed. Again a process for producing SOI wafers in step S90 through step S95 is implemented. Reentry of the wafer obtainable in step S96 takes place (n-1) times and step S90 through S95 are repeated "n" times and "n" sheet of SOI wafer will be obtained.

In step S96. for the "n"-th use, the residual portion 141 on the wafer 1 (semiconductor substrate) after peeling is removed by polishing, wet etching, hydrogen annealing, etc., and is smoothed so that an epitaxial wafer having a low-concentration P-type epitaxial layer 10 can be obtained.

(Manufacturing System)

A manufacturing system (a manufacturing plant) appropriate for implementing a process for producing wafers of the present invention will be described as follows.

Figure 15:
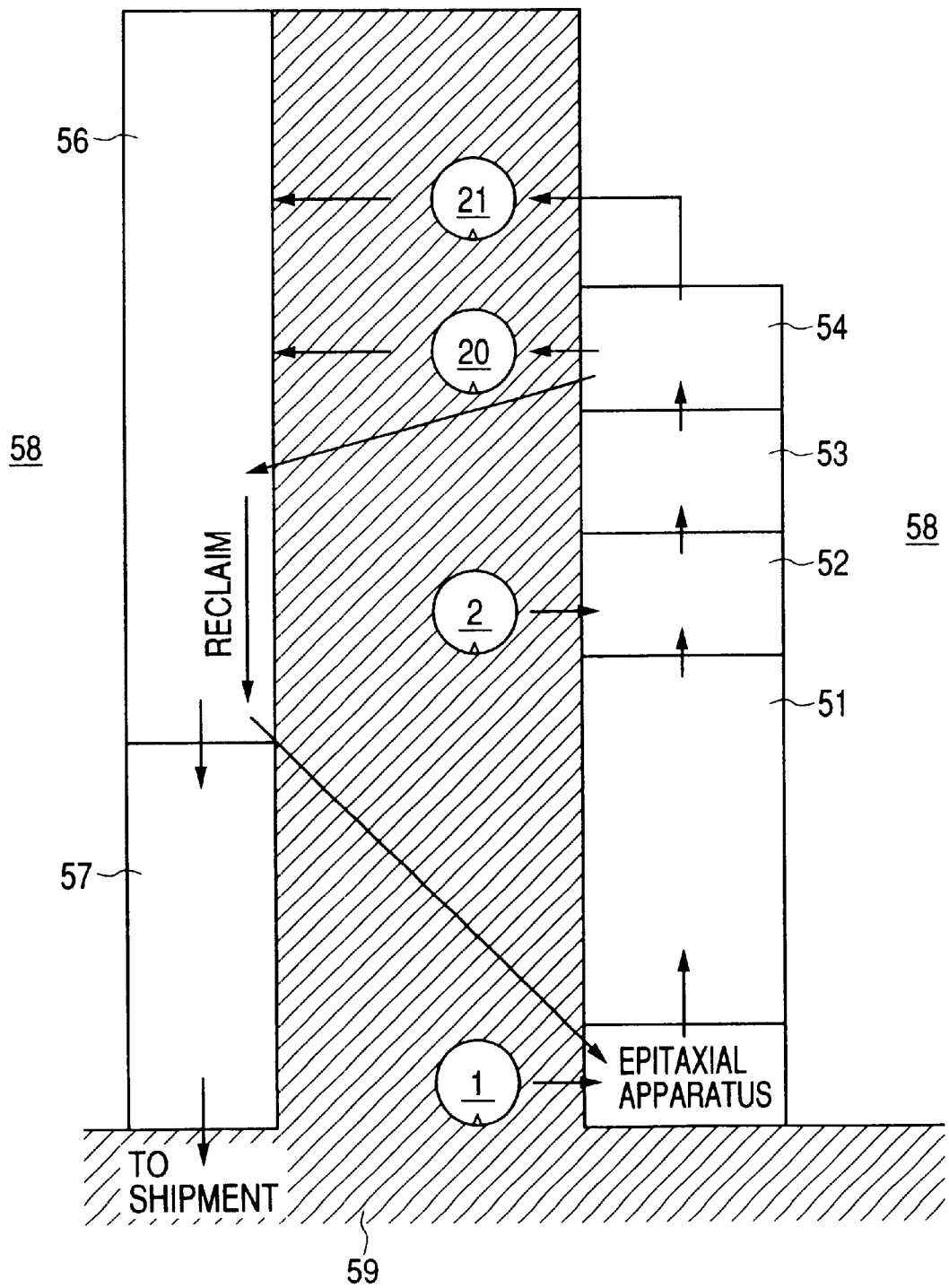
FIG. 15 is an explanation diagram for showing one example of production system according to a basic embodiment of the present invention.

FIG. 15 is a schematic diagram showing an embodiment of a manufacturing system. As shown in FIG. 15, after two or more epitaxial layers are formed on a first substrate (a wafer) 1, the substrate 1 is conveyed to a process apparatus group 51 comprising a anodization apparatus, an epitaxial growth apparatus, an ion implantation apparatus, and an oxidizing apparatus, etc. so as to undergo the aforementioned steps, etc.

The first substrate 1 on which a separation layer is formed is conveyed to a bonding apparatus group 52, and is bonded toga second substrate (a wafer) 2 there so that a multilayer structure is obtained.

The multilayer structure is conveyed to a separation apparatus group 53 including a water jet apparatus, a heat treatment apparatus, a wedge inserting apparatus, etc. and is separated there.

The second substrate after separation is conveyed to a separation layer removal and surface smoothing apparatus group 54 including an etching apparatus, a polishing apparatus, a heat treatment apparatus, etc. to undergo treatment so that an SOI wafer 20 is completed.

On the other hand, the separated first substrate undergoes smoothing treatment in the apparatus group 54, and then a bulk wafer as a first substrate again is conveyed to the process apparatus group 51 after the epitaxial layer is formed in the epitaxial apparatus. Thus manufacturing of SOI wafers are implemented for required times ("n" times), and "n" sheets of SOI wafer are manufactured.

After the "n"-th separation, the separated first substrate undergoes smoothing treatment with the apparatus group 54, and an epitaxial wafer 21 is completed (there is no need to newly implement epitaxial growth).

These SOI wafer 20 and epitaxial wafer 21 are conveyed to an inspection analyzing apparatus group 56 to undergo film thickness distribution measurement, foreign matter particle density measurement, defect density measurement, etc., and then are packed in boxes by a packing-for-shipment apparatus group 57 for shipment. Reference numeral 58 denotes a maintenance area, and reference numeral 59 denotes a clean area for wafers to be conveyed.

Figure 16:
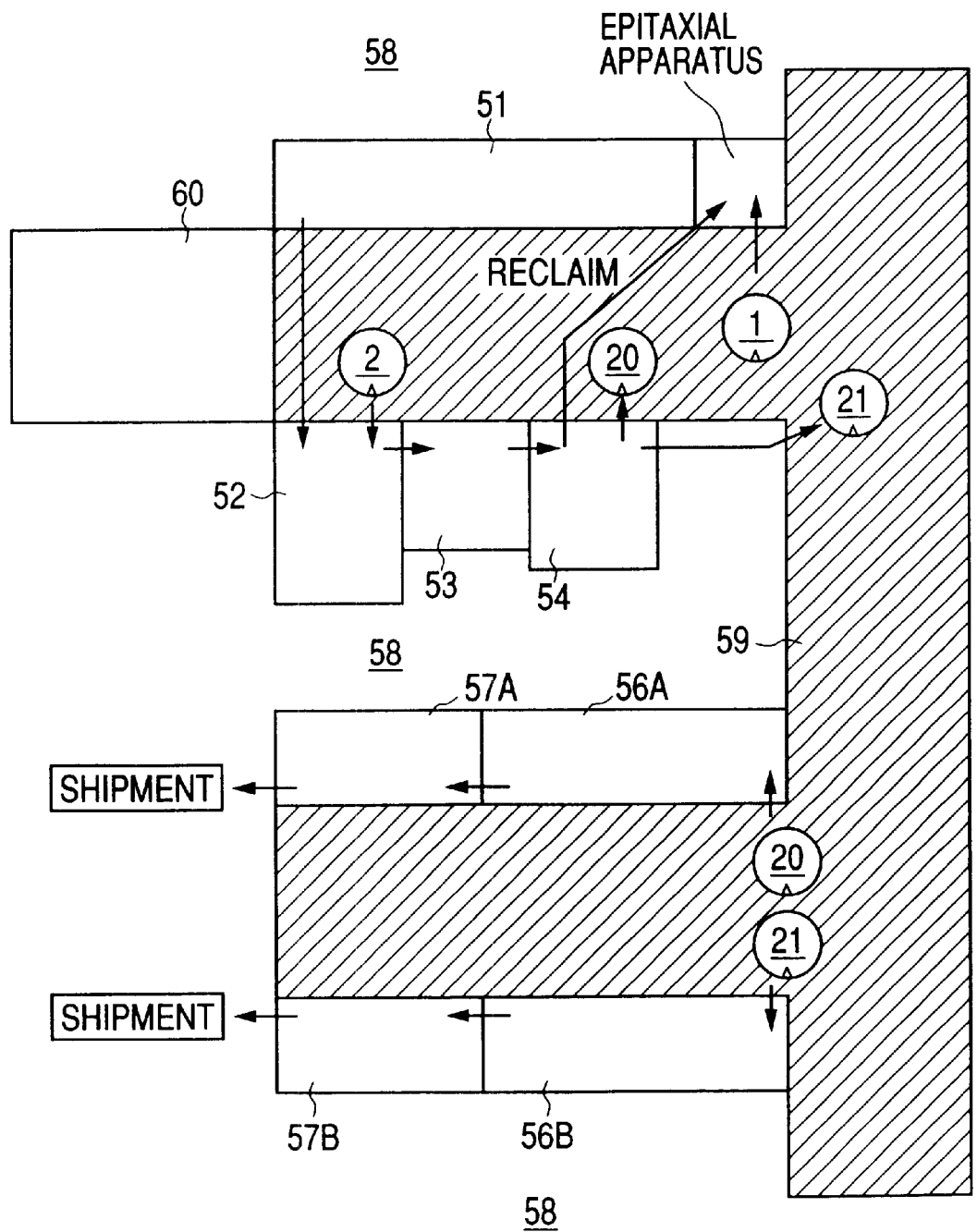
FIG. 16 is an explanation diagram for showing one example of production system according to the present invention.

FIG. 16 shows a system to which a system in FIG. 15 is partially altered and in which an SOI wafer 20 and an epitaxial wafer 21 to be obtained respectively undergo inspection and packaging into boxes.

Figure 17:
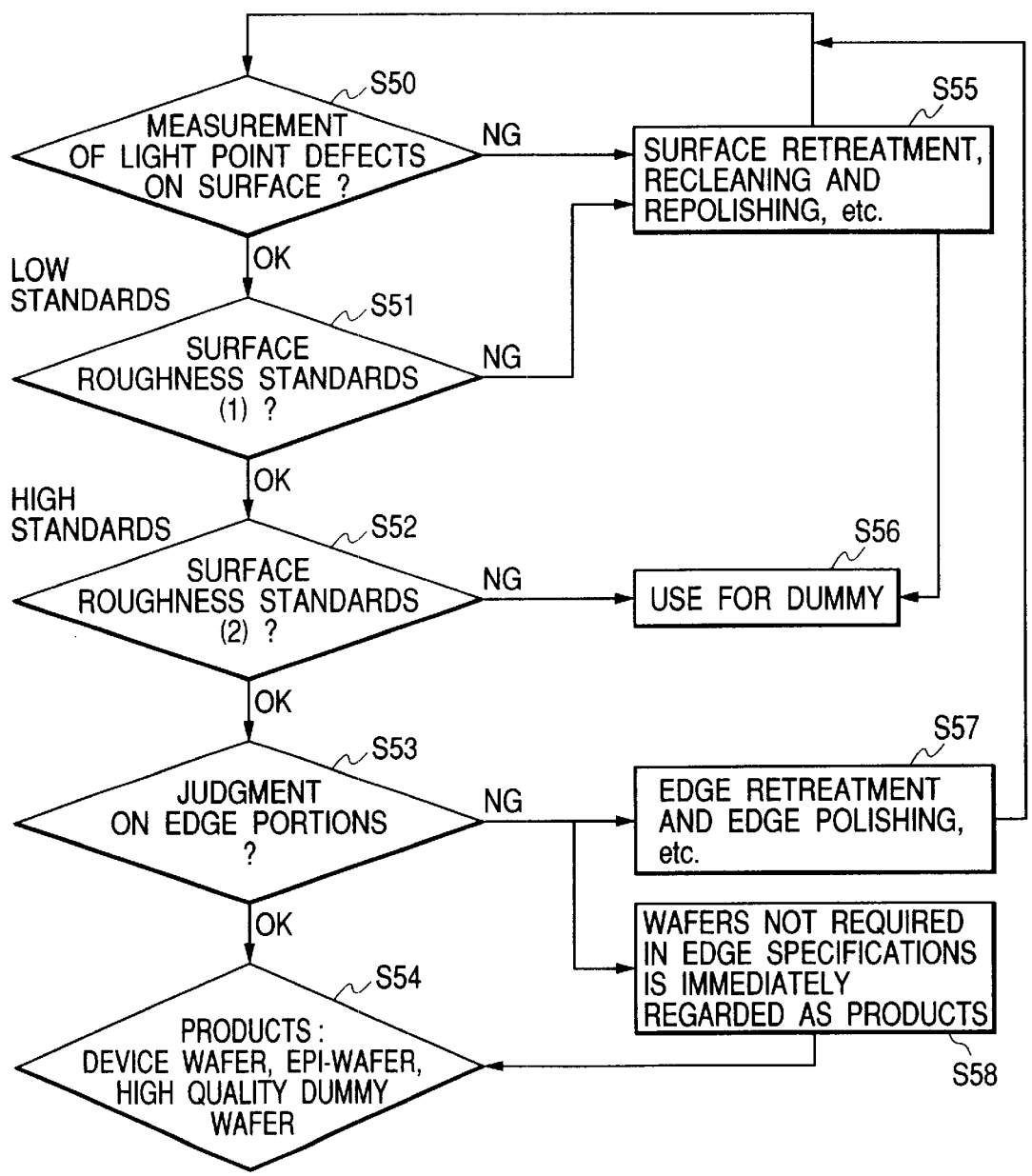
FIG. 17 is a flow chart showing an inspection step according to the present invention.

FIG. 17 is a flow chart showing an inspection step of determining a destination of diversion of a first wafer after separation.

As shown in FIG. 17, at first after separation the first wafer undergoes surface foreign matter measurement (Step S50). If surface foreign matter is not measured or is not more than a reference value, next surface roughness measurement is implemented based on a first standard (a low standard) (Step S51). When the first standard of surface roughness is fulfilled, surface roughness measurement is implemented based on a second standard (a stanstandard higher than the first standard) (Step S52). When the second standard of surface roughness is fulfilled, determination on edge portions is implemented (Step S53). If there is no problem with respect to the edge portions, wafers are outputted as products and the first wafers are used as device wafers, epi-wafers, high quality dummy wafers (Step S54).

In the case where the surface foreign matter exceeds a reference value in step S50 or in the case where surface roughness does not fulfill the first standard in step S51, re-surface-treatment inclusive of recleaning, repolishing, etc. is implemented (Step S55). After re-surface-treatment, in accordance with necessity, the wafer undergoes inspections in steps S50 through S54 are implemented again, or is used as a wafer for dummy (Step S56). In addition, in the case where surface roughness does not fulfill the second standard in step S52, the wafer is used as a wafer for dummy (Step S56).

If there is any problem with respect to edge determination in step S53, re-edge-treatment inclusive of edge polishing, etc. is implemented (Step S57). When specifications on edges do not matter, wafers are outputted as a product line as such, and are used as device wafers, epi-wafers, and high quality dummy wafers (Step S54).

Incidentally, in the embodiments described so far, a device (such as an MOS devices, a capacitor, resistant, etc.) may be formed on a non-porous layer 5 on the separation layer 4 of step S12 in FIG. 2 (or a non-porous layer 5 on the separation layer 14 of step S32 in FIG. 4). That is, a device forming layer may be transferred onto the second wafer. It is preferable to transfer the device forming layer onto the second wafer after an insulating layer is formed on the device forming layer.

The examples of the present invention will be described as follows.

EXAMPLE 1

A P-type first single-crystalline Si substrate with a resistivity of 0.01 to 0.02 Ω.cm was subjected to anodization in an HF solution.

| Anodization conditions were as follows: | |
| --- | --- |
| Current density: | 7 (mA · cm$^{-2}$) |
| Anodization solution: | HF:H$_2$O:C$_2$H$_5$OH = 1:1:1 |
| Time: | 11 (minutes) |
| Thickness of porous Si: | 12 ($\mu$m) |

The porous Si is further used as a separation layer in order to form a high-quality epitaxial Si layer, and thus respective functions are shared by one layer. Incidentally, the thickness of the porous Si layer can be suitably selected from an range of about 0.1 micron to about 600 micron.

This substrate was oxidized under oxygen atmosphere at 400° C. for one hour. This oxidization caused internal walls of pores of the porous Si to be covered with thermally oxidized film. Single-crystalline Si was epitaxially grown by 0.3 $\mu$m thick on the porous Si.

| Growth conditions were as follows: | |
| --- | --- |
| Source gas: | SiH$_2$Cl$_2$/H$_2$ |
| Gas flow rate: | 0.5/180 l/min |
| Gas pressure: | 80 Torr |
| Temperature: | 950° C. |
| Growth rate: | 0.15 $\mu$m/min |

Incidentally, prior to epitaxial growth, the already described (2) hydrogen baking step, (3) minute amount-raw material supplying step, and (4) high temperature-baking step may be of course implemented.

This can be applied to other examples conducting anodization.

Moreover, this epitaxial Si layer surface was thermally oxidized to form SiO$_2$ layer of 100 nm thereon.

In addition, the wafer was brought into contact with another silicon wafer with the same diameter from which a native oxidized film was removed, and heat treatment was conducted for bonding to form a multilayer structure.

A wedge made of a rigid body was inserted into a side surface of the multilayer structure to peel off the first substrate from the multilayer structure. After peeling off, an epitaxial layer was transferred onto the second substrate.

The residual porous layer on epitaxial layer was removed by wet etching, and the epitaxial layer was treated with hydrogen annealing to obtain an SOI wafer.

On the other hand, the peeled surface of the peeled first substrate was etched and/or polished to remove the residual porous layer, and a bulk wafer was obtained. Using this bulk wafer as a first single-crystalline Si substrate, again the process for producing SOI wafers is implemented. Thus the process for producing SOI wafers is repeated five times and five SOI wafers are obtained. For example, by using this SOI wafer, a fully depletion-type thin film MOS transistor can be produced.

After the fifth peeling, the peeled surface of the first substrate (semiconductor substrate) was polished to remove the residual porous layer and a bulk wafer was obtained. For example, by using this bulk wafer, a CMOS logic circuit can be produced.

Of course, without forming a device, in addition to sale of the produced SOI wafer, sale of the above-described bulk wafer may be conducted. Further, an epitxial wafer produced on the basis of the bulk wafer may be sold. The same is applied to the other examples as described below.

EXAMPLE 2

A P-type first single-crystalline Si substrate with a resistivity of 0.01 to 0.02 Ωcm was subjected to anodization in an HF solution.

| Anodization conditions (1) and (2) were as follows: | |
| --- | --- |
| (1): | |
| Current density: | 7 (mA · cm$^{-2}$) |
| Anodization solution: | HF:H$_2$O:C$_2$H$_5$OH = 1:1:1 |
| Time: | 5 (minutes) |
| Thickness of porous Si: | 5.5 ($\mu$m) |
| (2): | |
| Current density: | 30 (mA · cm$^{-2}$) |
| Anodization solution: | HF:H$_2$O:C$_2$H$_5$OH = 1:1:1 |
| Time: | 10 (seconds) |
| Thickness of porous Si: | 0.2 ($\mu$m) |

While the porous Si layer is caused to have two-layer configuration, the porous Si in the surface layer which first underwent anodization with low current (1) is used for forming a high quality epitaxial Si layer, and later, the porous Si in the lower layer which underwent anodization with high current (2) is used as a separation layer so that their functions are separated respectively.

Incidentally, a thickness of the low current porous Si layer is not limited hereto, and 600 $\mu$m to about 0.1 $\mu$m can be used. In addition, a third layer and onward may be formed in advance after the second porous Si layer is formed.

This substrate was oxidized under oxygen atmosphere at 400° C. for one hour. This oxidization caused internal walls of pores of porous Si to be covered with a thermally oxidized film. Single-crystalline Si was epitaxially grown by 0.2 $\mu$m thick on the porous Si by way of CVD.

| Growth conditions were as follows: | |
| --- | --- |
| Source gas: | SiH$_2$Cl$_2$/H$_2$ |
| Gas flow rate: | 0.5/180 l/min |
| Gas pressure: | 80 Torr |

-continued

Growth conditions were as follows:

| | |
|---|---|
| Temperature: | 950° C. |
| Growth rate: | 0.3 μm/min |

Moreover, this epitaxial Si layer surface underwent thermal oxidation so that $SiO_2$ layer of 200 nm was formed thereon.

In addition, the layer was brought into contact with a silicon wafer with the same diameter from which a native oxidized film was removed, and underwent heat treatment under an oxidizing atmosphere for bonding to form a multilayer structure.

Highly pressured water was jetted onto a side surface of the multilayer structure using a water jet apparatus so that the water was caused to insert into the multilayer structure like a wedge made of fluid and that the first substrate was peeled off from the multilayer structure.

After peeling off, an epitaxial layer was transferred onto the second substrate.

The epitaxial layer underwent wet etching so that the residual porous layer thereon was removed, and underwent hydrogen annealing treatment so that an SOI wafer was obtained.

On the other hand, the residual porous layer remaining on the separation surface of the first substrate which was separated was removed and a bulk wafer was obtained. Using this bulk wafer as a first single-crystalline Si substrate or a silicon wafer as a counter part for bonding, again the process for producing SOI wafers is implemented. Thus the process for producing SOI wafers is repeated ten times and ten SOI wafers are obtained. Using this SOI wafer, a fully depletion-type thin film transistor was produced.

The residual porous layer remaining on the separation surface of the first substrate (semiconductor substrate) after the tenth peeling was removed and a bulk wafer was obtained. Moreover, epitaxial growth was implemented so that an epitaxial wafer was obtained.

Incidentally, in the case where an epitaxial wafer is used for producing a device, a rear surface-oxidized film for back shielding is normally formed on an opposite surface against the epitaxial layer side and on its side surfaces so that duffusion of impurity from the wafer to outside is prevented.

In the present example, at the time when separation from the multilayer structure takes place, the back shield has already been formed on the rear surface and side surfaces of the epitaxial wafer, a forming step on a back seal during a device process may be omitted. The reason is that the step of oxidizing a surface of an epitaxial layer prior to a bonding step and a heat treatment on the occasion of bonding form a back shield on the rear surface and side surfaces of a wafer. For other examples, similar back shield effects can be obtained as well.

Using this epitaxial wafer, a CMOS logic circuit was produced.

Incidentally, epitaxial growth on the porous Si and epitaxial growth on the first substrate after the separation step may be implemented with the same CVD apparatus so that operation efficiency of an extremely expensive CVD apparatus is improved.

EXAMPLE 3

P-type single-crystalline Si having a resistivity of 0.015 Ω.cm was subjected to epitaxial growth by 15 μm thick on the first single-crystalline Si substrate by way of CVD. Anodization was conducted on a surface of that substrate in an HF solution Anodization conditions were as follows:

| (1): | |
|---|---|
| Current density: | 7 (mA · cm$^{-2}$) |
| Anodization solution: | HF:H$_2$O:C$_2$H$_5$OH = 1:1:1 |
| Time: | 11 (minutes) |
| Thickness of porous Si: | 12 (μm) |
| (2): | |
| Current density: | 22 (mA · cm$^{-2}$) |
| Anodization solution: | HF:H$_2$O:C$_2$H$_5$OH = 1:1:1 |
| Time: | 2 (minutes) |
| Thickness of porous Si: | 3 (μm) |

While the porous Si layer is caused to have two-layer configuration, the porous Si in the surface layer which first underwent anodization with low current (1) is used to form high quality epitaxial Si layer, and the porous Si in the lower layer which later underwent anodization with high current (2) is used as a separation layer so that functions are separated respectively. This substrate was oxidized under oxygen atmosphere at 400° C. for one hour. This oxidization caused internal walls of pores of porous Si to be covered with a thermally oxidized film. Single-crystalline Si was epitaxially grown by 0.3 μm thick on the porous Si by way of CVD.

Growth conditions were as follows:

| | |
|---|---|
| Source gas: | SiH$_2$Cl$_2$/H$_2$ |
| Gas flow rate: | 0.5/180 l/min |
| Gas pressure: | 80 Torr |
| Temperature: | 950° C. |
| Growth rate: | 0.3 μm/min |

Moreover, this epitaxial Si layer surface underwent thermal oxidation so that $SiO_2$ layer of 200 nm was formed thereon.

In addition, the layer was brought into contact with a silicon wafer with the same diameter from which a natural oxidized film was removed, and underwent heat treatment for bonding to form a multilayer structure.

Highly pressured water was jetted onto a side surface of the multilayer structure by using a water jet apparatus so that the water was caused to insert into the multilayer structure like a wedge made of fluid and that the first substrate was peeled off from the multilayer structure.

After peeling, an epitaxial layer was transferred onto the second substrate.

The epitaxial layer underwent wet etching so that the residual porous layer thereon was removed, and underwent hydrogen annealing treatment so that an SOI wafer was obtained.

On the other hand, the residual porous layer remaining on the separation surface of the first substrate which was separated was removed and hydrogen annealing was implemented so that a bulk wafer was obtained. Using this bulk wafer as a first single-crystalline Si substrate or as a silicon wafer for a counter part to be bonded, again the process for producing SOI wafers is implemented. Thus the process for producing SOI wafers is repeated 20 time and 20 SOI wafers are obtained. Using this SOI wafer, a partially depletion-type thin film transistor was produced.

The residual porous layer remaining on the separation surface of the first substrate (semiconductor substrate) after the twentieth peeling was removed and hydrogen annealing was implemented so that a bulk wafer was obtained.

Figure 18A:
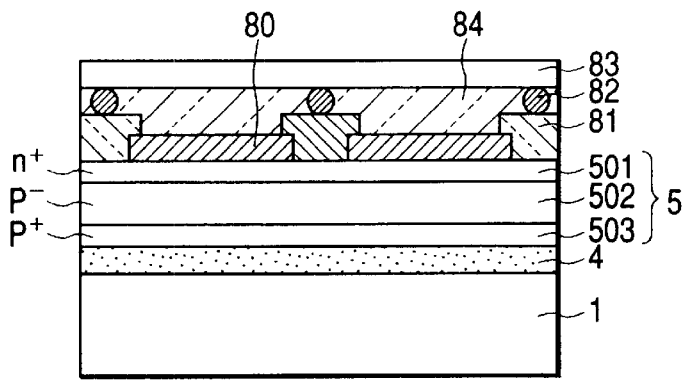
FIGS. 18A, 18B and 18C are schematically cross-sectional views for explaining a solar cell according to the present invention.

Using the obtained bulk wafer, a solar cell also could be formed. At first as shown in FIG. 18A, as that embodiment, a porous layer 4 was formed by way of anodization and thereafter an epitaxial layer 5 was caused to grow.

Epitaxial growth of this semiconductor film 5 was implemented as follows. In an atmospheric pressure Si epitaxial growth apparatus, epitaxial growth was conducted for three minutes using $SiH_4$ gas and $B_2H_6$ gas, a first semiconductor layer 503 by $p^+Si$ in which $10^{19}$ atoms/cm$^3$ of Boron (B) was doped was formed.

Next, Si epitaxial growth with altered $B_2H_6$ gas flow rate was implemented for ten minutes so that a second semiconductor layer 502 by low-concentration $p^-Si$ in which $10^{16}$ atoms/cm$^3$ of Boron (B) was doped was formed.

Moreover, supplying with $PH_3$ gas in stead of $B_2H_6$ gas, epitaxial growth was implemented for four minutes so that a third semiconductor layer 501 by $n^+Si$ in which $10^{19}$ atoms/cm$^3$ of phosphorous was highly densely doped was formed on the $P^-$ epitaxial semiconductor layer 502.

A semiconductor film 5 having $p^+/p^-/n^+$ configuration comprising the first through third epitaxial semiconductor layers 501 through 503 was formed.

Next, in this example, an $SiO_2$ film, that is, a transparent insulating film 80 was formed by surface thermal oxidation on the semiconductor film 5, and pattern etching by way of photolithography was implemented so that contact with electrodes or wiring 81 was implemented. This wiring 81 keeps required intervals, and is formed in an extended stripes arranged in parallel, in the direction perpendicular to the paper surface of the drawing.

Metal film forming this electrode or wiring 81 can be configured by a multilayer structure film formed by, for example, Ti film with 30 nm thickness, Pd with 50 nm thickness, and Ag with 100 nm thickness being subsequently evaporated, and further Ag being plated thereon. Thereafter, annealing was implemented at 400° C. for 20 to 30 minutes.

Next, respectively on stripe-shaped electrodes or wiring 81, metal wires are connected along them as a conductive line 82, to which a transparent substrate 83 is bonded with a transparent adhesive 84. Joint of conductive line 82 with the electrode or wiring 81 can be attained by soldering. And, one ends or the other ends of these conductive lines 82 are respectively extended from the electrode or wiring 81 to be lead out to outside.

Figure 18B:
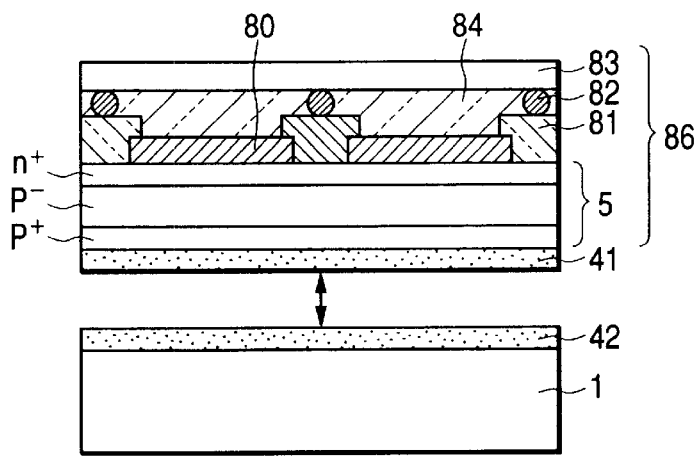

Thereafter, external force is given to the bulk wafer 1 and the transparent substrate 83 to set them mutually apart. Thin film semiconductor 86, which is separated by the porous layer 4, and has an epitaxial semiconductor film 5 jointed onto the transparent substrate 83, is obtained (FIG. 18B).

Figure 18C:
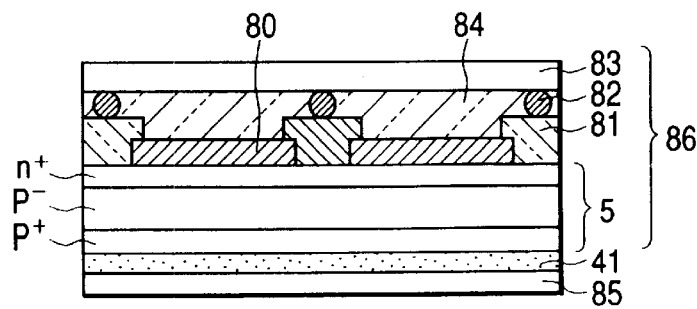
Figure 19A:
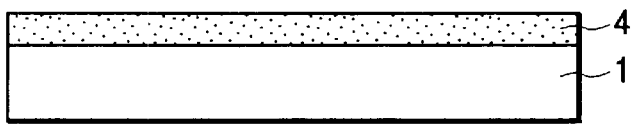
FIGS. 19A, 19B, 19C, 19D and 19E are schematically cross-sectional views for explaining a conventional method of transferring an epitaxial layer
Figure 19B:
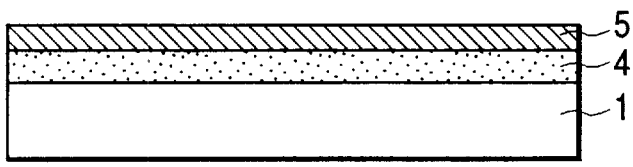
Figure 19C:
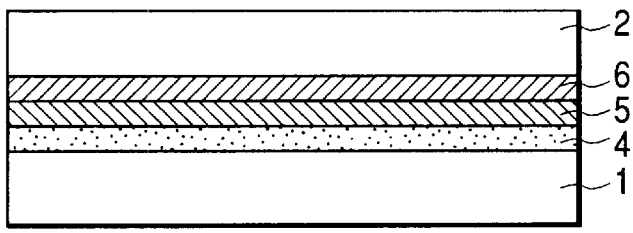
Figure 19D:
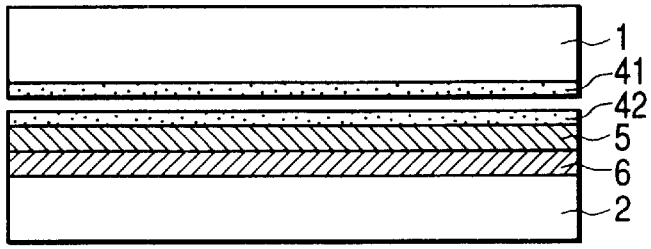
Figure 19E:
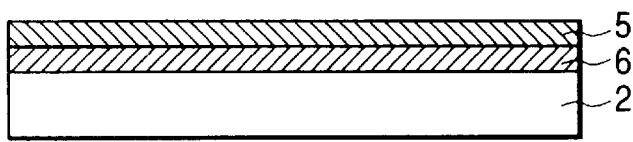

In this case, a porous layer 41 remains on the rear surface, and silver paste is pained on this, and moreover a metal plate is bonded to form the other rear electrode 85. Thus, the solar cell in which the thin film semiconductor 86 having $p^+/p^-/n^+$ configuration is formed on the transparent substrate 83 (FIG. 18C). This metal electrode 85 also functions as an element protecting film for a rear surface of a solar cell.

Incidentally, a porous layer 4 can be the already described layers having different porosity.

EXAMPLE 4

P-type single-crystalline Si having a resistivity of 0.015 Ω.cm was subjected to epitaxial growth by 16 μm thick on the first single-crystalline Si substrate by way of CVD.

Anodization was conducted on a surface of that substrate in an HF solution.

| Anodization conditions were as follows: | |
| --- | --- |
| (1): | |
| Current density: | 7 (mA · cm$^{-2}$) |
| Anodization solution: | HF:H$_2$O:C$_2$H$_5$OH = 1:1:1 |
| Time: | 11 (minutes) |
| Thickness of porous Si: | 12 (μm) |
| (2): | |
| Current density: | 22 (mA · cm$^{-2}$) |
| Anodization solution: | HF:H$_2$O:C$_2$H$_5$OH = 1:1:1 |
| Time: | 2 (minutes) |
| Thickness of porous Si: | 3 (μm) |

While the porous Si layer is caused to have two-layer configuration, the porous Si in the surface layer which first underwent anodization with low current (1) is used to form high quality epitaxial Si layer, and the porous Si in the lower layer which later underwent anodization with high current (2) is used as a separation layer so that functions are separated respectively.

This substrate was oxidized under oxygen atmosphere at 400° C. for one hour. This oxidization caused internal walls of pores of porous Si to be covered with a thermally oxidized film. Single-crystalline Si was epitaxially grown by 0.3 μm thick on the porous Si by way of CVD.

| Growth conditions were as follows: | |
| --- | --- |
| Source gas: | SiH$_2$Cl$_2$/H$_2$ |
| Gas flow rate: | 0.5/180 l/min |
| Gas pressure: | 80 Torr |
| Temperature: | 950° C. |
| Growth rate: | 0.3 μm/min |

Moreover, this epitaxial Si layer surface underwent thermal oxidation so that $SiO_2$ layer of 200 nm was formed thereon.

In addition, the layer was brought into contact with a silicon wafer with the same diameter from which a native oxidized film was removed, and underwent heat treatment for bonding to form a multilayer structure.

Highly pressured water was jetted onto a side surface of the multilayer structure by using a water jet apparatus so that the water was caused to insert into the multilayer structure like a wedge made of fluid and that the first substrate was peeled off from the multilayer structure. After peeling, an epitaxial layer was transferred onto the second substrate.

The epitaxial layer underwent wet etching so that the residual porous layer thereon was removed, and underwent hydrogen annealing treatment so that an SOI wafer was obtained.

On the other hand, since there existed a remaining epitaxial layer not made porous and a residual portion of the porous layer on the peeled first substrate, the residual porous layer was removed and hydrogen annealing was implemented so that the surface was flattened. Using this bulk wafer as a first single-crystalline Si substrate or as a silicon wafer of a counter part for bonding, again the process for producing SOI wafers is implemented. Since an epi-layer of 1 μm still remains, in the case where the wafer is used as a first substrate, the epi-thickness of 0.015 Ωcm by CVD may be 15 μm. Thus the process for producing SOI wafers is repeated 20 times and 20 SOI wafers are obtained. Using this SOI wafer, a complete depletion-type film transistor was produced.

The residual porous layer remaining on the separation surface of the first substrate (semiconductor substrate) after the twentieth peeling was removed and hydrogen annealing was implemented so that boron in the residual epitaxial layer of one micron was diffused outward and a bulk wafer showing approximately the same performance as an epitaxial wafer was obtained.

Using this bulk wafer, a CMOS logic circuit was produced.

EXAMPLE 5

A first single-crystalline Si substrate was subjected to heat-oxidization and SiO$_2$ layer of 200 nm thick was formed.

Here, ion implantation of H$^+$ in 5×10$^{16}$ cm$^{-2}$ with 40 keV was implemented from the first substrate surface so that a projection range of ions covers Si substrate. Thus, the layer to operate as a separation layer was formed at the depth of projection range as a microcabity layer or a strain layer being an implanted-ion high-concentration layer.

In addition, the layer was brought into contact with a silicon wafer with the same diameter from which a native oxidized film was removed, and underwent heat treatment at 500° C. for bonding to form a multilayer structure, and at the same time the first substrate and the second substrate were separated.

A single-crystalline semiconductor layer was transferred onto the second substrate.

The residual separation layer on the surface of the single-crystalline semiconductor layer transferred onto the second substrate underwent hydrogen annealing treatment to be removed and underwent smoothing so that an SOI wafer was obtained. On the other hand, since there existed a residual portion of the separation layer on the peeled first substrate, the wafer underwent hydrogen annealing treatment for removal of these and underwent smoothing so that a bulk wafer was obtained. Using this bulk wafer as a first single-crystalline Si substrate or as a silicon wafer of a counter part for bonding, again the process for producing SOI wafers is implemented. Thus the process for producing SOI wafers is repeated ten times and ten SOI wafers are obtained. Using this SOI wafer, a fully depletion-type thin film transistor was produced.

Since there existed a residual portion of the separation layer on the first substrate (semiconductor substrate) after the tenth peeling, the wafer underwent hydrogen annealing treatment for removal of this and underwent smoothing so that a bulk wafer was obtained.

Using this bulk wafer, a CMOS logic circuit was produced.

EXAMPLE 6

A single-crystalline Si was epitaxially grown by 1 μm thick on the first single-crystalline Si substrate by way of CVD.

Growth conditions are as follows:

| | |
|---|---|
| Source gas: | SiH$_2$Cl$_2$/H$_2$ |
| Gas flow rate: | 0.5/180 1/min |
| Gas pressure: | 80 Torr |
| Temperature: | 950° C. |
| Growth rate: | 0.30 μm/min |

Moreover, this epitaxial Si layer surface underwent thermal oxidation so that SiO$_2$ layer of 200 nm was formed thereon.

Here, ion implantation of H$^+$ in 5×10$^{16}$ cm$^{-2}$ with 40 keV was implemented from the first substrate surface so that a projection range of ions covers the epitaxial layer. Thus, the layer to operate as a separation layer was formed at the depth of projection range as a microcavity layer or a strain layer being an implanted-ion high-concentration layer.

In addition, the bonding surface of a silicon wafer (second substrate) having the same diameter on the surface of which an oxidized film was formed underwent nitrogen plasma treatment, and the first and the second substrates were brought into contact to bond them so that a multilayer structure was formed. In addition, water jet was jetted onto the side face of this multilayer structure so that the first substrate and the second substrate were separated from the side surface to the center.

A single-crystalline semiconductor layer was transferred onto the second substrate.

The residual separation layer on the surface of the epitaxial layer transferred onto the second substrate underwent hydrogen annealing treatment to be removed and underwent smoothing so that an SOI wafer was obtained.

On the other hand, since there existed the epitaxial layer and a residual portion of the separation layer on the epitaxial layer in the peeled first substrate, the wafer underwent hydrogen annealing treatment for removal of these and underwent smoothing so that a bulk wafer was obtained. Using this bulk wafer as a first single-crystalline Si substrate or as a silicon wafer of a counter part for bonding, again the process for producing SOI wafers is implemented. Thus the process for producing SOI wafers is repeated 20 times and 20 SOI wafers are obtained. Using this SOI wafer, a fully depletion-type thin film transistor was produced.

Since there existed the epitaxial layer and a residual portion of the separation layer on the epitaxial layer on the first substrate (semiconductor substrate) after the twentieth peeling, the wafer underwent hydrogen annealing treatment for removal of this and underwent smoothing so that a bulk wafer was obtained. This bulk wafer has on its surface the epitaxial layer treated with hydrogen annealing, and therefore shows approximately the same performance as an epitaxial wafer.

Using this bulk wafer, a CMOS logic circuit was produced.

EXAMPLE 7

A first single-crystalline Si substrate was subjected to heat-oxidization and SiO$_2$ layer of 100 nm thick was formed.

Here, ion implantation of H$^+$ in 5×10$^{16}$ cm$^{-2}$ with 30 keV was implemented from the first substrate surface so that a projection range of ions covers Si substrate. Thus, the layer to operate as a separation layer was formed at the depth of projection range as a mcrocavity layer or a strain layer being an implanted-ion high-concentration layer.

Thereafter, the surface oxidized film was removed and on a surface of a single-crystalline Si, non-crystalline or polycrystalline Si or amorphous Si was grown by 0.30 µm thick with CVD, or bias-sputtering, etc.

| For example, growth conditions were as follows: | |
| --- | --- |
| Source gas: | SiH$_4$ |
| Gas pressure: | 760 Torr |
| Temperature: | 400° C. |

Thereafter, SiO$_2$ was deposited by 200 nm thick on its surface by way of CVD.

In addition, the layer was brought into contact with a silicon wafer with the same diameter from which a native oxidized film was removed, and underwent heat treatment at 600° C. for bonding to form a multilayer structure, and thereafter the first substrate and the second substrate were separated.

A single-crystalline or polycrystalline semiconductor layer as a result of epitaxial growth was transferred onto the second substrate.

The residual separation layer on the surface of the single-crystalline semiconductor layer transferred onto the second substrate was treated with hydrogen annealing to be removed and smoothed so that an SOI wafer was obtained.

On the other hand, since there existed a residual portion of the separation layer in the peeled first substrate, the wafer underwent hydrogen annealing treatment for removal of this and underwent smoothing so that a bulk wafer was obtained. Of course, in the present invention, prior to hydrogen annealing, a part or all of the residual portion may undergoes polishing or etching for removal. Using this bulk wafer as a first single-crystalline Si substrate or as a silicon wafer of a counter part for bonding, again the process for producing SOI wafers is implemented. Thus the process for producing SOI wafers is repeated ten times and ten SOI wafers are obtained. Using this SOI wafer, a fully depletion-type thin film transistor was produced.

Since there existed a residual portion of the separation layer in the first substrate (semiconductor substrate) after the tenth peeling, the wafer underwent hydrogen annealing treatment for removal of this and underwent smoothing so that a bulk wafer was obtained. Of course, in the present invention, prior to hydrogen annealing, a part or all of the residual portion may undergoes polishing or etching for removal.

Using this bulk wafer, a CMOS logic circuit was produced.

EXAMPLE 8

A P-type first single-crystalline Si substrate with a resistivity of 0.01 to 0.02 Ω.cm was subjected to anodization in an HF solution.

| Anodization conditions were as follows: | |
| --- | --- |
| Current density: | 7 (mA · cm$^{-2}$) |
| Anodization solution: | HF:H$_2$O:C$_2$H$_5$OH = 1:1:1 |
| Time: | 11 (minutes) |
| Thickness of porous Si: | 12 (µm) |

This substrate underwent oxidization under oxygen atmosphere at 400° C. for one hour. This oxidization caused internal walls of pores of porous Si to be covered with a thermally oxidized film.

Here, ion implantation was implemented from the first substrate surface so that a projection range of ions covers porous Si layer (or porous Si/substrate intersurface may be fine). Thus, the layer to operate as a separation layer was formed at the depth of projection range as a microcavity layer or a strain layer being an implanted-ion high-concentration layer.

A single-crystalline Si was epitaxially grown by 0.2 µm thick on the porous Si by way of CVD.

| Growth conditions were as follows: | |
| --- | --- |
| Source gas: | SiH$_2$Cl$_2$/H$_2$ |
| Gas flow rate: | 0.5/180 1/min |
| Gas pressure: | 80 Torr |
| Temperature: | 950° C. |
| Growth rate: | 0.3 µm/min |

Moreover, this epitaxial Si layer surface was subjected to thermal oxidation so that SiO$_2$ layer of 200 nm thick was formed thereon.

In addition, the layer was brought into contact with a silicon wafer with the same diameter from which a native oxidization film was removed, and underwent heat treatment for bonding to form a multilayer structure.

Highly pressured water was jetted onto a side surface of the multilayer structure by using a water jet apparatus so that the water was caused to insert into the multilayer structure like a wedge made of fluid and that the first substrate was peeled off from the multilayer structure.

After peeling, an epitaxial layer was transferred onto the second substrate.

The epitaxial layer underwent wet etching so that the residual porous layer thereon was removed, and underwent hydrogen annealing treatment so that an SOI wafer was obtained.

On the other hand, the residual porous layer remaining of the peeled surface of the first substrate which is peeled is removed so that a bulk wafer is obtained. Using this bulk wafer as a first single-crystalline Si substrate or as a silicon wafer of a counter part for bonding, again the process for producing SOI wafers is implemented. Thus the process for producing SOI wafers is repeated 5 times and 5 SOI wafers are obtained. Using this SOI wafer, a fully depletion-type thin film transistor was produced.

The peeled surface of the first substrate (semiconductor substrate) after the fifth peeling underwent epitaxial growth so that a bulk wafer was obtained. In this case, epitaxial growth may be implemented after the residual porous layer is once removed. Using this epitaxial wafer, a CMOS logic circuit was produced.

EXAMPLE 9

A P-type first single-crystalline Si substrate with a resistivity of 0.01 Ω.cm was subjected to anodization in an HF solution.

Anodization conditions were as follows:

| | |
|---|---|
| Current density | 7 (mA · cm$^{-2}$) |
| Anodization solution: | HF:H$_2$O:C$_2$H$_5$OH = 1:1:1 |
| Time: | 12 (minutes) |
| Thickness of porous Si: | 11 ($\mu$m) |

This substrate was oxidized under oxygen atmosphere at 400° C. for one hour. This oxidization caused internal walls of pores of porous Si to be covered with a themally oxidized film. Single-crystalline Si was epitaxially grown by 0.2 $\mu$m thick on the porous Si by way of CVD.

Growth conditions were as follows:

| | |
|---|---|
| Source gas: | SiH$_2$Cl$_2$/H$_2$ |
| Gas flow rate: | 0.5/180 1/min |
| Gas pressure: | 80 Torr |
| Temperature: | 950° C. |
| Growth rate: | 0.3 $\mu$m/min |

Moreover, this epitaxial Si layer surface was subjected to thermal oxidiation to form SiO$_2$ layer of 200 nm thick thereon.

Here, ion implantation was implemented from the first substrate surface so that a projection range of ions covers epitaxial layer/porous Si intersurface (or porous Si/substrate intersurface or inside of porous Si layer may be good). Thus, the layer to operate as a separation layer was formed at the depth of projection range as a microcavity layer or a strain layer being an implanted-ion high-concentration layer.

In addition, the layer was brought into contact with a silicon wafer with the same diameter from which a native oxidized film was removed, and underwent heat treatment at 1000° C. for bonding to form a multilayer structure, and thereafter the multilayer structure was separated.

After peeling, the epitaxial layer was transferred onto the second substrate.

Since there was little porous layer left on the epitaxial layer, the wafer did not undergo wet etching, but underwent only hydrogen annealing treatment so that an SOI wafer was obtained.

On the other hand, the peeled surface of the peeled first substrate was polished so that a bulk wafer was obtained. Using this bulk wafer as a first single-crystalline Si substrate or as a silicon wafer of a counter part for bonding, again the process for producing SOI wafers is implemented. Thus the process for producing SOI wafers is repeated ten times and ten SOI wafers are obtained. Using this SOI wafer, a fully depletion-type thin film transistor was produced.

The peeled surface of the first substrate (semiconductor substrate) after the tenth peeling underwent polishing so that a bulk wafer was obtained. Using this bulk wafer, a CMOS logic circuit was produced.

In stead of bonding the second substrates in these Examples, rolycrystalline silicon with about 200 micron to about 800 micron by way of deposition method such as CVD, etc. may be formed on the outermost surface of the first substrate. Other than these Examples, an integrated structure is divided into a plurality of members, which may be diverted, and caused to function respectively as unique wafers.

EXAMPLE 10

P$^-$-type single-crystalline Si of 18 Ω.cm was epitaxially grown by 1 $\mu$m thick on the so-called P$^+$ first single-crystalline Si substrate of a resistivity 0.01 to 0.02 Ω.cm by way of CVD.

Growth conditions were as follows:

| | |
|---|---|
| Source gas: | SiH$_2$Cl$_2$/H$_2$ |
| Gas flow rate: | 0.5/180 1/min |
| Gas pressure: | 80 Torr |
| Temperature: | 950° C. |
| Growth rate: | 0.30 $\mu$m/min |

Moreover, this epitaxial Si layer surface underwent heat-oxidization so that SiO$_2$ layer of 200 nm thick was formed thereon.

Here, ion implantation of H$^+$ in 5×10$^{16}$ cm$^{-2}$ with 40 keV was implemented from the first substrate surface so that a projection range of ions covers the epitaxial layer. Thus, the layer to operate as a separation layer was formed at the depth of projection range as a microcavity layer or a strain layer being an implanted-ion high-concentration layer.

In addition, the bonding surface of a silicon wafer (second substrate) having the same diameter on the surface of which an oxidized film was formed underwent nitrogen plasma treatment, and the first and the second substrates were brought into contact to bond them so that a multilayer structure was formed. In addition, water jet was jetted onto the side surface of this multilayer structure so that the first substrate and the second substrate were separated from the side surface to the center.

A single-crystalline semiconductor layer was transferred onto the second substrate. Incidentally, bonded substrates may undergo heat treatment at about 400 to about 600° C. and be separated.

The residual separation layer on the surface of the epitaxial layer transferred onto the second substrate underwent hydrogen annealing treatment to be removed and underwent smoothing so that an SOI wafer was obtained.

On the other hand, since there existed the epitaxial layer and a residual portion of the separation layer on the peeled first substrate, the wafer underwent hydrogen annealing treatment to remove these and the first substrate is smoothed so that a bulk wafer was obtained. Using this bulk wafer as a first single-crystalline Si substrate or as a silicon wafer of a counter part for bonding, again the process for producing SOI wafers is implemented. Thus the process for producing SOI wafers is repeated 20 times and 20 SOI wafers are obtained. Using this SOI wafer, a fully depletion-type thin film transistor was produced. Thus, by way of the above described method of ion implantation, P$^+$ substrate could be used also in the case where an SOI substrate is produced.

Since there existed the epitaxial layer and a residual portion of the separation layer on the epitaxial layer on the first substrate (semiconductor substrate) after the twentieth peeling, the wafer underwent hydrogen annealing treatment to remove this and was smoothed so that a bulk wafer was obtained. This bulk wafer has on its surface the epitaxial layer underwent hydrogen annealing, and therefore shows approximately the same performance as an epitaxial wafer.

EXAMPLE 11

On the surface of a first P-type single-crystalline Si substrate, an epitaxial growth layer of 3 $\mu$m thick was formed by way of CVD. At that time, the density of diborane to be added as dopant was made to be variable, and a p$^{++}$Si layer with a resistivity of 0.015 Ωcm was formed by 2 $\mu$m at the surface side, and immediately thereunder a p+Si layer with a resistivity of 0.5 Ωcm was formed.

The layer in which this epitaxial layer was formed was subjected to anodization in a mixed solution of an HF solution and ethanol.

| Anodization conditions were as follows: | |
|---|---|
| Current density: | 7 (mA · cm$^{-2}$) |
| Anodization solution: | HF:H$_2$O:C$_2$H$_5$OH = 1:1:1 |
| Time: | 3 (minutes) |

Section observation by scan-type electronic microscope having highly resolution capability confirmed that this anodization served to form a porous layer with a low porosity of approximate 20% in 2 μm depth from the surface and a porous thin layer which was vulnerable in structure with a porosity of approximately 50% in 0.5 μm depth from the surface among layers corresponding to p+ Si layer thereunder.

This wafer was treated under oxygen atmosphere at 400° C. for one hour, and thereafter dipped into the HF solution of 1.25% for 30 seconds, then the extremely thin silicon film formed on the surface was removed, and the wafer was conveyed into the epitaxial growth apparatus so that the single-crystalline Si was epitaxially grown by 0.3 μm thick with CVD (Chemical Vapor Deposition) method.

| Growth conditions were as follows: | |
|---|---|
| Source gas: | SiH$_2$Cl$_2$/H$_2$ |
| Gas flow rate: | 0.2/180 1/min |
| Gas pressure: | 760 Torr |
| Temperature: | 1060° C. |
| Growth rate: | 0.15 μm/min |

Incidentally, prior to epitaxial growth, the already described (2) hydrogen baking step, (3) minute amount-raw material supplying step, and (4) high temperature-baking step may be of course implemented.

Moreover, this epitaxial Si layer surface underwent thermal oxidation so that SiO$_2$ layer of 200 nm thick was formed thereon.

The SiO$_2$ layer surface was overlapped with a surface of a separately prepared Si substrate (a supporting substrate) so that they came in contact, and thereafter underwent annealing at 1180° C. for 5 minutes, whereby bonding become intensive.

When the bonded wafers were separated, separation took place in the high porous layer. Separation method includes a method to apply external pressure with such as pressing, tension, shearing, wedge, etc., a method applying ultrasonic wave, a method applying heat, a method causing the porous Si to expand by oxidization from circumference to apply internal pressure to inside the porous Si, a method injecting water jet and a method to heating in a pulse-like fashion to apply thermal stress or give rise to softness, etc. Any of those methods could cause separation.

Subsequently, the supporting substrate side was dipped into a mixed solution of HF, hydrogen peroxide and water, the residual porous silicon layer on the surface of the substrate was removed in about 60 minutes so that an SOI wafer was formed.

Moreover, in hydrogen atmosphere, heat treatment was implemented at 1100° C. for four hours.

Assessing surface roughness with an atomic force microscope, root-mean-square roughness in a square region of 50 μm was 0.2 nm, which was equivalent to the Si wafers normally put on the market. Similarly crystal defect density was measured, and stacking faults density was 50 cm$^2$.

That is, a low defect density single-crystalline Si layer could be formed on the Si oxidized film.

When the oxidized film was formed not on an epitaxial layer surface, but on a second substrate surface or on the both of them, similar results were obtained.

The residual porous layer on the first substrate side was dipped into a mixed solution of HF, hydrogen peroxide, and water, and was removed in about 30 minutes, and the first substrate having an epitaxial layer not made porous was obtained. Onto this substrate, in accordance with necessity, p++Si layer is formed after p+Si layer is formed. And again, the process for producing SOI wafers is implemented. Thus the process for producing SOI wafers is repeated 20 times and 20 SOI wafers are obtained.

The residual porous layer remaining on the peeling surface of the first substrate (semiconductor substrate) after the twentieth peeling was removed and an epitaxial wafer was obtained.

Using this epitaxial wafer, a CMOS logic circuit was produced.

EXAMPLE 12

A single-crystalline Si was epitaxially grown by 1 μm thick on the first single-crystalline Si substrate by way of CVD.

| Growth conditions were as follows: | |
|---|---|
| Source gas: | SiH$_2$Cl$_2$/H$_2$ |
| Gas flow rate: | 0.5/180 1/min |
| Gas pressure: | 80 Torr |
| Temperature: | 950° C. |
| Growth rate: | 0.30 μm/min |

A P$^-$ layer of 1 Ωcm was formed with B$_2$H$_6$ as dopant at the initial 0.5 micron thick, and an N$^-$ layer of 1 Ωcm was formed with PH$_3$ as dopant by 0.5 micron thick at the surface side.

Moreover, this epitaxial Si layer surface underwent thermal oxidation so that SiO$_2$ layer of 200 nm thick was formed thereon.

Here, ion implantation of H$^+$ in 5×10$^{16}$ cm$^{-2}$ with 70 keV was implemented from the first substrate surface so that a projection range of ions covers epitaxial layer. Thus, the layer to operate as a separation layer was formed at the depth of the projection range, in this case in the vicinity of P$^-$/N$^-$ intersurface, as a microcavity layer or a strain layer being an implanted ion high-concentration layer.

In addition, the bonding surface of a silicon wafer (a second substrate) having the same diameter on the surface underwent nitrogen plasma treatment, and the first and the second substrates were brought into contact for bonding so that a multilayer structure was formed. Here, heat treatment may be implemented at about 200° C.

In addition, water jet was jetted onto the side surface of this multilayer structure so that the first substrate and the second substrate were separated from the side surface to the center.

For the separation method, otherwise even by using heat treatment at 500° C., separation also took place due to crystal rearranging operation or pressure operation inside microcavities.

N⁻ single-crystalline semiconductor layer was transferred onto the second substrate.

The residual separation layer on the surface of the epitaxial layer transferred onto the second substrate underwent hydrogen annealing treatment to be removed and underwent smoothing so that an SOI wafer was obtained. In stead of hydrogen annealing, touch polishing could produces similar SOI wafers. Using this SOI wafer, a partially depletion-type thin film transistor was produced.

On the other hand, since there existed the P⁻ epitaxial layer and a residual portion of the separation layer on its surface in the peeled first substrate, the residual separation layer was removed, and again N⁻ layer was epitaxially grown, and the process for producing SOI wafers was implemented. This process for producing SOI wafers was repeated five times and five SOI wafers are obtained. After the fifth separation, the residual separation layer on the separation surface of the first single-crystalline Si substrate was removed so that an epi-wafer having P⁻ epitaxial layer was obtained. While the surface roughness was removed with hydrogen annealing, the surface was smoothed so that an epi-wafer was obtained. In stead of hydrogen annealing, touch polishing could provide a similar epi-wafer. Since this bulk wafer has the epitaxial layer treated with hydrogen annealing on its surface, it shows approximately the same performance as an epitaxial wafer. Using this epi-wafer, DRAM, etc. was formed and improvement in quality, yield, and reliability could be confirmed. Here, if P⁺ substrate is used as the first Si wafer, the product will become a most widely used epi-wafer as P⁻ epitaxial/P⁺ epitaxial wafer. Using this epi-wafer, a CMOS logic circuit was produced.

EXAMPLE 13

A surface of a first single-crystalline Si substrate was subjected to anodization in an HF solution. Anodization conditions were as follows

| Forming conditions of the top surface layer of a first porous layer to be produced first: | |
|---|---|
| Current density: | 1 (mA · cm⁻²) |
| Anodization solution: | HF:H₂O:C₂H₅OH = 1:1:1 |
| Time: | 0.1 (minutes) |
| Thickness of porous Si: | 0.2 (μm) |

| Forming conditions of a second porous layer to be produced next: | |
|---|---|
| Current density: | 50 (mA · cm⁻²) |
| Anodization solution: | HF:H₂O:C₂H₅OH = 1:1:1 |
| Time: | 15 (seconds) |
| Thickness of porous Si: | 0.3 (μm) |

| Forming conditions of a third porous layer to be produced last: | |
|---|---|
| Current density: | 7 (mA · cm⁻²) |
| Anodization solution: | HF:H₂O:C₂H₅OH = 1:1:1 |
| Time: | 1 (minute) |
| Thickness of porous Si: | 1 (μm) |

By the above anodization, the porosity of the second porous Si layer thicker than the first porous layer becomes larger than that of other porous Si layers, and will become vulnerable in structure.

This substrate underwent oxidization under oxygen atmosphere at 400° C. for one hour. This oxidization caused internal walls of pores of porous Si to be covered with a heat-oxidized film. After the wafer was disposed in hydrogen atmosphere of an epitaxial apparatus, this wafer was baked at 1040° C. for 5 minutes. This heat treatment (baking) served to fill surface cavities of the porous Si. And, the top surface layer, that is the first porous Si layer formed under current density of 1 mA.cm⁻² became non-porous due to migration of Si atoms.

Subsequently, on the porous Si having a non-porous surface, single-crystaline Si was epitaxially grown by 0.3 μm thick with CVD (Chemical Vapor Deposition). The growth conditions were as follows. Incidentally, prior to growth of single-crystalline Si, the already described hydrogen baking step, minute amount-raw material supplying step, and high-temperature baking step may be implemented.

| | |
|---|---|
| Source gas: | SiH₂Cl₂/H₂ |
| Gas flow rate: | 0.0083/3 L/S (0.5/180 1/min) |
| Gas pressure: | 1.07 × 10⁴ Pa (80 Torr) |
| Temperature: | 950° C. |
| Growth rate: | 0.30 μm/min |

Incidently, the epitaxial growth step conducted under the above conditions may be omitted.

Moreover, this epitaxial Si layer surface underwent thermal exidation so that SiO₂ layer of 200 nm thick was formed thereon.

The SiO₂ layer surface was overlapped with a surface of a separately prepared Si substrate (a second substrate) so that they came in contact, and thereafter underwent heat treatment at 1180° C. for 5 minutes, whereby bonding became intensive.

Applying external force onto the bonded substrates for separation, the second porous layer with a larger porosity collapsed and separation took place at the interface between the non-porous layer and the porous layer.

Consequently, an SOI substrate having a single-crystalline Si layer of 0.2 μm thickness could be formed on the Si oxidized film of the second substrate. As described above, when the epitaxial growth step is omitted, the thickness of a single-crystalline layer becomes 0.1 μm or less. No porous Si remained on the surface (separation surface) of the single-crystalline Si layer. Thus, separation of the non-porous layer and the porous layer at the interface can make it possible to omit various steps for obtaining an SOI layer having a smooth surface.

The intersurface separation like this can take place since stress can be concentrated in the vicinity of the interface. Otherwise, in such cases of hetero epitaxial films such s SiGe, etc. on silicon, stress can be concentrated in the vicinity of the interface.

The porous Si remained on the first substrate was selectively etched with a mixed solution of 49% fluoric acid and 30% hydrogen peroxide which were being stirred. This bulk wafer was used repetitiously three times as the first single-crystalline Si substrate. Thus four SOI wafers and one bulk wafer was obtained.

An epitaxial layer was formed on this bulk wafer and was used as an epi-wafer.

EXAMPLE 14

A P-type first single-crystalline Si substrate with a resistivity of 0.01 to 0.02 Ω.cm was subjected to anodization in an HF solution.

| Anodization conditions were as follows: | |
| --- | --- |
| Current density: | 7 (mA · cm$^{-2}$) |
| Anodization solution: | HF:H$_2$O:C$_2$H$_5$OH = 1:1:1 |
| Time: | 11 (minutes) |
| Thickness of porous Si: | 12 ($\mu$m) |

The porous Si is further used so as to have a function of a separation layer in addition to a function of forming a high-quality epitaxial Si layer, and thus respective functions are shared by one layer. Incidentally, the thickness of the porous Si layer can be suitably selected from an range of 0.1 micron to about 600 micron.

This substrate was oxidized under oxygen atmosphere at 400° C. for one hour. This oxidization caused internal walls of pores of the porous Si to be covered with a thermally oxidized film. Single-crystalline Si was epitaxially grown by 0.3 $\mu$m thick on the porous Si. Growth conditions are as follows:

| | |
| --- | --- |
| Source gas: | SiH$_2$Cl$_2$/H$_2$ |
| Gas flow rate: | 0.5/180 1/min |
| Gas pressure: | 80 Torr |
| Temperature: | 950° C. |
| Growth rate: | 0.15 $\mu$m/min |

Incidentally, prior to epitaxial growth, the already described (2) hydrogen baking step, (3) minute amount-raw material supplying step, and (4) high temperature-baking step may be of course implemented.

This can be applied to other examples conducting anodization.

Moreover, this epitaxial Si layer surface was thermally oxidized to form SiO$_2$ layer of 100 nm thick thereon.

In addition, the wafer was brought into contact with another silicon wafer with the same diameter from which a native oxidized film was removed, and heat treatment was conducted for bonding to form a multilayer structure.

A wedge made of a rigid body was inserted into a side surface of the multilayer structure to peel off the first substrate from the multilayer structure. After peeling off, an epitaxial layer was transferred onto the second substrate.

The epitaxial layer was subjected to wet etching to remove the residual porous layer thereon, and it was treated with hydrogen annealing to obtain an SOI wafer.

On the other hand, the peeled surface of the peeled first substrate was polished to remove the residual porous layer, and a bulk wafer was obtained. Using this bulk wafer as a first single-crystalline Si substrate, again the process for producing SOI wafers is implemented. Thus the process for producing SOI wafers is repeated five times and five SOI wafers are obtained.

After the fifth peeling, the peeled surface of the first substrate (semiconductor substrate) was polished to remove the residual porous layer and a bulk wafer was obtained. For example, by using this bulk wafer, an epitaxial wafer was produced.

Incidentally, in case where demand for epi-wafers rapidly increases, the above repetition times are set to two times and the production amount of the epitaxial wafers may be adjusted to increase the amount.

As described so far, the present invention enables efficient and economic practical use of semiconductor wafers.

What is claimed is:

1. A method of producing a semiconductor member, said method comprising:

a first step of preparing a first member, the first member having a non-porous layer on a semiconductor substrate to produce an SOI wafer; and a second step of transferring the non-porous layer from the first member onto a second member, wherein reuse of the semiconductor substrate from which the non-porous layer is separated in the second step occurs (n–1) times, where n is a natural number greater than or equal to 2, wherein the first and second steps are repeated n times to produce n sheets of the SOI wafers at maximum output, wherein after the second step in n-th use, the semiconductor substrate is used to produce a non-SOI wafer, and wherein the n is determined according to a demand for the SOI wafer or a demand for the non-SOI wafer, or based on the inspection results of the semiconductor substrate.

2. A method of producing a semiconductor member according to claim 1, wherein the first member has the non-porous layer on the semiconductor substrate through a separation layer, and the second step includes a step of bonding the first and second members to each other while positioning the non-porous layer inside the SOI wafer to form a multilayer structure and separating the multilayer structure at the separation layer.

3. A method of producing a semiconductor member according to claim 1, wherein the use other than that of the first and second steps is selling the semiconductor substrate separated from the non-porous layer in the second step.

4. A method of producing a semiconductor member according to claim 1 or 2, wherein the semiconductor substrate has an epitaxial layer on a surface thereof.

5. A method of producing a semiconductor member according to claim 4, wherein the semiconductor substrate has a different resistivity than the epitaxial layer.

6. A method of producing a semiconductor member according to claim 1 or 2, wherein the semiconductor substrate has a first epitaxial layer and a second epitaxial layer on a surface thereof in this order from the semiconductor substrate side.

7. A method of producing a semiconductor member according to claim 1 or 2, wherein the semiconductor substrate has a semiconductor layer doped with a dopant on a surface thereof.

8. A method of producing a semiconductor member according to claim 2, wherein the separation layer is a porous layer formed by anodization of a non-porous region, or an ion-implanted layer formed by implanting ions into a non-porous region.

9. A method of producing a semiconductor member according to claim 1 or 2, wherein the non-porous layer is a non-porous single-crystalline silicon layer.

10. A method of producing a semiconductor member according to claim 2, wherein after forming an insulating layer on the non-porous layer, the insulating layer and the second-member are bonded to each other to form the multilayer structure.

11. A method of producing a semiconductor member according to claim 1 or 2, wherein a device is formed on the non-porous layer and the device is transferred onto the second member.

12. A method of producing a semiconductor member according to claim 1 or 2, wherein the non-porous layer comprises a plurality of layers.

13. A method of producing a semiconductor member according to claim 1 or 2, wherein the step of preparing the first member includes: a step of forming a first epitaxial semiconductor layer on the semiconductor substrate; a step of making at least a part of the first epitaxial semiconductor layer porous to a porous layer; and a step of forming the non-porous layer on the porous layer, therein preparing the first member.

14. A method of producing a semiconductor member according to claim 13, wherein the porous layer is formed so that a thickness of a portion not made porous in the first epitaxial semiconductor layer is 100 nm to 20 μm.

15. A method of producing a semiconductor member according to claim 13, wherein the semiconductor substrate is a high-concentration p-type semiconductor substrate.

16. A method of producing a semiconductor member according to claim 13, wherein the first epitaxial semiconductor layer has a boron concentration of $1 \times 10^{17}$ cm$^{-3}$ to $1 \times 10^{20}$ cm$^{-3}$.

17. A method of producing a semiconductor member according to claim 1 or 2, wherein the step of preparing the first member includes: a step of forming, on the semiconductor substrate, a first semiconductor layer which is an epitaxial layer, a second semiconductor layer different in impurity concentration and/or conductivity type from the first semiconductor layer in this order from the semiconductor substrate side; a step of making at least a part of the first and second semiconductor layers porous to form a porous layer; and a step of forming the non-porous layer on the porous layer, thereby preparing the first member.

18. A method of producing a semiconductor member according to claim 17, wherein the semiconductor substrate is a p-type semiconductor substrate, and wherein the first semiconductor layer has a concentration of an impurity for controlling a p-type conductivity smaller than that of the semiconductor substrate, and the second semiconductor layer has a concentration of an impurity for controlling a p-type conductivity larger than that of the first semiconductor layer.

19. A method of producing a semiconductor member according to claim 17, wherein the porous layer comprises a plurality of layers having different porosities from each other.

20. A method of producing a semiconductor member according to claim 1 or 2, wherein the step of preparing the first member includes: a step of forming a first epitaxial semiconductor layer on the semiconductor substrate; and a step of forming an ion-implanted layer inside the first epitaxial semiconductor layer, thereby preparing the first member.

21. A method of producing a semiconductor member according to claim 20, wherein a position of the ion-implanted layer is determined to be a position of 100 nm to 20 μm away from the semiconductor substrate side inside the first epitaxial semiconductor layer.

22. A method of producing a semiconductor member according to claim 20, wherein the first epitaxial semiconductor layer has a boron concentration of $1 \times 10^{17}$ cm$^{-3}$ to $1 \times 10^{20}$ cm$^{-3}$.

23. A method of producing a semiconductor member according to claim 1 or 2, wherein the step of preparing the first member includes: a step of forming, on the semiconductor substrate, a first semiconductor layer which is an epitaxial layer, a second semiconductor layer different in impurity concentration or conductivity type from the first semiconductor layer in this order from the semiconductor substrate side; and a step of forming an ion-implanted layer inside the first semiconductor layer and/or the second semiconductor layer, thereby preparing the first member.

24. A method of producing a semiconductor member according to claim 23, wherein the semiconductor substrate is a p-type semiconductor substrate, and wherein the first semiconductor layer has a concentration of an impurity for controlling a p-type conductivity smaller than that of the semiconductor substrate, and the second semiconductor layer has a concentration of an impurity for controlling a p-type conductivity larger than that of the first semiconductor layer.

25. A method of producing a semiconductor member according to claim 1 or 2, wherein the second step includes a step of bonding the non-porous layer to the second member and separating the non-porous layer from the first member.

26. A method of producing a semiconductor member according to claim 1 or 2, wherein the second step comprises flattening and/or smoothing a surface of the semiconductor substrate obtained by separating the non-porous layer from the first member in the second step.

27. A method of producing a semiconductor member according to claim 26, wherein the flattening and/or smoothing is conducted by surface-polishing, etching and heat-treating of the semiconductor substrate.

28. A method of producing a semiconductor member according to claim 27, wherein the heat-treating is hydrogen annealing.

29. A method of producing a semiconductor member according to claim 28, wherein a temperature of the hydrogen annealing is not lower than 800° C. but not higher than a melting point of a material constituting the semiconductor substrate.

30. A method of producing a semiconductor member according to claim 26, further comprising a step of forming an epitaxial layer on the flattened and/or smoothed semiconductor substrate.

31. A method of producing a semiconductor member according to claim 1 or 2, further comprising an inspection step of conducting at least one of surface particle inspection, thickness distribution, defect density inspection, surface shape inspection or edge inspection, after a surface flattening and/or smoothing treatment of the semiconductor substrate used n times in production of the semiconductor member.

32. A method of producing a semiconductor member according to claim 31, wherein in the inspection step, the semiconductor substrate is selected for use as a dummy wafer, a monitor wafer, a prime wafer or an epitaxial wafer.

33. A method of producing a semiconductor member according to claim 1, wherein the value n can be determined by subjecting the semiconductor substrate, which is obtained by separating the non-porous layer from the first member in the second step, to an inspection step of conducting at least one of surface particle inspection, thickness distribution, defect density inspection, surface shape inspection or edge inspection.

34. A method of producing a semiconductor member according to claim 33, wherein the semiconductor member is an SOI wafer, and wherein after the semiconductor substrate is used in the first and second steps two times or more, the semiconductor substrate is used to produce an epitaxial wafer for an use other than that of the method of producing the semiconductor member.

35. A method of producing a semiconductor member according to claim 1, wherein the use other than that of the first and second steps is conducted for production of epitaxial wafer, and wherein n is defined by the number of ordered sheets of epitaxial wafer which is recorded in a computer.

36. A method of producing a semiconductor member according to claim 35, wherein the epitaxial wafer has an epitaxial layer with a concentration of an impurity for controlling a p-type conductivity smaller than that of the semiconductor substrate on a high-concentration p-type semiconductor substrate.

37. A method of producing a semiconductor member according to claim 1, wherein the semiconductor substrate is a high-concentration p-type semiconductor substrate, and wherein the use other than that of the first and second steps is an epitaxial wafer.

38. A method of producing a semiconductor member according to claim 37, wherein the epitaxial wafer has an epitaxial layer with a concentration of an impurity for controlling a p-type conductivity smaller than that of the semiconductor substrate on a high-concentration p-type semiconductor substrate.

39. A method of producing a semiconductor member according to claim 1, wherein the use other than that of the first and second steps is a dummy wafer, a monitor wafer, or a wafer for producing a device.

40. A system of producing two kinds of semiconductor members, said system comprising:

a first step of preparing a first semiconductor member, the first semiconductor member having a non-porous layer on a semiconductor substrate to produce an SOI wafer; and a second step of transferring the non-porous layer from the first semiconductor member onto a second semiconductor member, wherein reuse of the semiconductor substrate from which the non-porous layer is separated in the second step occurs (n−1) times, where n is a natural number greater than or equal to 2, wherein the first and second steps are repeated n times to produce n sheets of the SOI wafers at maximum output, wherein after the second step in n-th use, the semiconductor substrate is used to produce a non-SOI wafer, and wherein the n is determined according to a demand for the SOI wafer or a demand for the non-SOI wafer, or based on the inspection results of the semiconductor substrate.

41. A method of controlling the production of a semiconductor member, said method comprising:

a first step of preparing a first semiconductor member, the first semiconductor member having a non-porous layer on a semiconductor substrate to produce an SOI wafer; and a second step of transferring the non-porous layer from the first semiconductor member onto a second semiconductor member, wherein reuse of the semiconductor substrate from which the non-porous layer is separated in the second step occurs (n−1) times, where n is a natural number greater than or equal to 2, wherein the first and second steps are repeated n times to produce n sheets of the SOI wafers at maximum output, wherein after the second step in n-th use, the semiconductor substrate is used to produce a non-SOI wafer, and wherein the n is determined according to a demand for the SOI wafer or a demand for the non-SOI wafer, or based on the inspection results of the semiconductor substrate.

* * * * *

UNITED STATES PATENT AND TRADEMARK OFFICE
CERTIFICATE OF CORRECTION

PATENT NO. : 6,468,923 B1
DATED : October 22, 2002
INVENTOR(S) : Takao Yonehara et al.

It is certified that error appears in the above-identified patent and that said Letters Patent is hereby corrected as shown below:

<u>Title Page,</u>
Item [57], ABSTRACT,
Line 12, "an" should read -- a --.

<u>Drawings,</u>
Sheet 8, FIG. 9, "IS" should read -- ARE --.
Sheet 16, FIG. 17, "IS" should read -- ARE --.

<u>Column 1,</u>
Line 5, "OR" should read -- OF --;
Line 24, "kind" should read -- kinds --; and
Line 46, "another supporting substrate material" should be deleted.

<u>Column 2,</u>
Line 37, "are" should read -- be --;
Line 40, "is" should read -- be --;
Line 47, "the,wafer" should read -- the wafer --; and
Line 50, "the," should read -- the --.

<u>Column 3,</u>
Lines 22 and 38, "an" should read -- a --;
Line 23, "formed" should read -- formed having --;
Line 43, "the-non-porous" should read -- the non-porous --; and
Lines 47 and 50, "sale" should read -- sell --.

<u>Column 4,</u>
Line 31, "comprises" should read -- comprise --;
Lines 37 and 47, "a" should read -- an --; and
Lines 55 and 66, "an" should read -- a --.

UNITED STATES PATENT AND TRADEMARK OFFICE
CERTIFICATE OF CORRECTION

PATENT NO. : 6,468,923 B1
DATED : October 22, 2002
INVENTOR(S) : Takao Yonehara et al.

It is certified that error appears in the above-identified patent and that said Letters Patent is hereby corrected as shown below:

Column 5,
Line 13, "(n24 2)," should read -- ($n \geq 2$), --;
Line 14, "an" should read -- a --;
Line 20, "n > 2)" should read -- ($n \geq 2$) --;
Line 22, "an" should read -- a --;
Line 33, "an" should read -- a --;
Lines 44, 47, 50, 53 and 56, "schematically" should read -- schematic --; and
Lines 59 and 62, "explanation" should read -- explanatory --.

Column 6,
Lines 10, 13, 25 and 28, "schematically" should read -- schematic --;
Lines 16 and 20, "explanation" should read -- explanatory --;
Line 30, "layer" should read -- layer. --; and
Line 35, "on" should read -- of --.

Column 7,
Line 35, "are" should read -- have --; and "of" should be deleted.

Column 8,
Line 23, "Incidently," should read -- Incidentally, --;
Line 45, "be" should read -- to be --; and
Line 63, "processes" should read -- process --.

Column 9,
Line 9, "much," should read -- great, --;
Line 28, "Incidently," should read -- Incidentally, --;
Line 50, "is" (second occurrence) should read -- be --;
Line 51, "is" should read -- be --; and
Line 61, "of an use" should be deleted.

UNITED STATES PATENT AND TRADEMARK OFFICE
CERTIFICATE OF CORRECTION

PATENT NO.    : 6,468,923 B1
DATED         : October 22, 2002
INVENTOR(S)   : Takao Yonehara et al.

It is certified that error appears in the above-identified patent and that said Letters Patent is hereby corrected as shown below:

Column 10,
Line 29, "of" should be deleted;
Line 37, "about" should be deleted;
Line 40, "science"" should read -- Science" --;
Line 54, "about" should be deleted;
Line 56, "is proceeded" should read -- proceeds --;
Line 57, "super-highly" should read -- super-high --;
Line 65, "is" should read -- be --; and
Line 66, "are" should read -- be --.

Column 11,
Line 4, "is" should read -- be --;
Line 14, "outward" should read -- outwardly --;
Line 30, "limitation" should read -- limitations --;
Line 41, "a" should read -- also --; and
Line 45, "Incidently," should read -- Incidentally, --.

Column 12,
Line 22, "P+" should read -- $P^+$ --;
Line 66, "is con-" should read -- consists --; and
Line 67, "sisted" should be deleted.

Column 13,
Line 23, "above described" should read -- above-described --;
Line 38, "with" (first occurrence) should be deleted;
Line 44, "is" should read -- be --; and
Line 56, "necessary," should read -- necessity, --.

UNITED STATES PATENT AND TRADEMARK OFFICE
CERTIFICATE OF CORRECTION

PATENT NO. : 6,468,923 B1
DATED : October 22, 2002
INVENTOR(S) : Takao Yonehara et al.

It is certified that error appears in the above-identified patent and that said Letters Patent is hereby corrected as shown below:

Column 14,
Line 17, "in" should read -- in- --;
Line 35, "necessity" should read -- necessity, --;
Line 37, "In" should read -- In- --;
Line 61, "undergoes" should read -- undergo --; and
Line 65, "a" should read -- an --.

Column 15,
Line 9, "trasnferred" should read -- transferred --;
Line 11, "surface of couse," should read -- surface. Of course, --;
Line 19, "removed" should read -- be removed --;
Line 52, "needs not" should read -- does not need --;
Line 53, "becouse" should read -- because --; and
Line 60, "and however it" should read -- but --.

Column 16,
Line 6, "porosity." should read -- porosities. --;
Line 8, "porousilayer" should read -- porous layer --;
Line 47, "above described" should read -- above-described --; and
Line 48, "can not" should read -- cannot --.

Column 17,
Line 3, "the separation regions on" should read -- on the separation regions --;
Line 16, "removed" should read -- be removed --;
Line 17, "above described" should read -- above-described --;
Line 53, "outward" should read -- outwardly --; and
Line 64, "implatation," should read -- implantation, --.

Column 18,
Line 23, "in stead" should read -- instead --;
Line 42, "In" should read -- In- --;
Line 49, "the both wafer" should read -- both wafers --; and
Line 58, "is" should read -- be --.

UNITED STATES PATENT AND TRADEMARK OFFICE
CERTIFICATE OF CORRECTION

PATENT NO. : 6,468,923 B1
DATED : October 22, 2002
INVENTOR(S) : Takao Yonehara et al.

It is certified that error appears in the above-identified patent and that said Letters Patent is hereby corrected as shown below:

Column 19,
Line 35, "seets" should read -- sheets --; and
Line 44, "gin" should read -- in --.

Column 20,
Line 1, "in stead" should read -- instead --;
Line 1, "In stead" should read -- Instead --; and
Line 38, "undergoes" should read -- undergo --.

Column 21,
Line 4, "a" (second occurrence) should be deleted;
Line 22, "needs of" should read -- need for --;
Line 23, "outward," should read -- outwardly, --;
Line 25, "P$^-$" should read -- P$^+$ --;
Line 38, "is a" (second occurrence) should be deleted;
Line 49, "in stead" should read -- instead --; and
Line 56, "a" (second occurrence) should be deleted.

Column 22,
Line 11, "undergoes" should read -- undergo --;
Line 13, "anmomia," should read -- ammonia, --;
Line 57, "single-crystallne" should read -- single-crystalline --; and Column 23,
Line 50, "single-crystal" should read -- single-crystalline --; and
Line 56, "be" should be deleted.

Column 24,
Line 13, "first" should read -- first at --;
Line 23, "undergoes" should read -- undergo --;
Line 37, "transfrred" should read -- transferred --; and
Line 67, "decreases" should read -- decrease --.

Column 25,
Line 25, "undergoes" should read -- undergo --;
Line 33, "is" should read -- are --; and
Line 34, "obtained" should read -- obtain --.

UNITED STATES PATENT AND TRADEMARK OFFICE
CERTIFICATE OF CORRECTION

PATENT NO. : 6,468,923 B1
DATED : October 22, 2002
INVENTOR(S) : Takao Yonehara et al.

It is certified that error appears in the above-identified patent and that said Letters Patent is hereby corrected as shown below:

Column 26,
Line 17, "ware" should read -- wafer --;
Line 40, "to," should read -- to --;
Line 44, "deffects" should read -- defects --; and
Line 65, "through S54" should read -- through S54, which --.

Column 27,
Line 8, "as are," should be deleted;
Line 45, "in stead" should read -- instead --; and
Line 59, "and become" should read -- becomes --.

Column 28,
Line 4, "caused-to" should read -- caused to --;
Line 9, "comprises" should read -- comprise --; and
Line 16, "priotized" should read -- prioritized --.

Column 29,
Line 22, "In" should read -- In- --; and
Line 40, "undergoes" should read -- undergo --.

Column 30,
Line 13, "step" should read -- steps --;
Line 23, "$p^-$" should read -- $P^-$ --;
Line 43, "step." should read -- steps. --;
Line 52, "in stead" should read -- instead --; and
Line 59, "microcarities" should read -- microcavities --.

Column 31,
Line 20, "undergoes" should read -- undergo --;
Line 47, "step" should read -- steps --;
Line 48, "sheet" should read -- sheets --;
Line 50, "step S96." should read -- step S96 --; and
Line 64, "a" should read -- an --.

UNITED STATES PATENT AND TRADEMARK OFFICE
CERTIFICATE OF CORRECTION

PATENT NO.    : 6,468,923 B1
DATED         : October 22, 2002
INVENTOR(S)   : Takao Yonehara et al.

It is certified that error appears in the above-identified patent and that said Letters Patent is hereby corrected as shown below:

Column 32,
Line 3, "toga" should read -- to a --;
Line 47, "stanstandard" should read -- standard --; and
Line 60, "through S54" should read -- through S54, which --.

Column 33,
Line 4, "devices, a capacitor, resistant," should read -- device, a capacitor, a resistor, --;
Line 31, "an" should read -- a --;
Line 32, "micron." should read -- microns. --; and
Line 36, "by" should be deleted.

Column 34,
Line 8, "fully-depletion-type" should read -- full depletion-type --; and
Line 58, "by" should be deleted.

Column 35,
Line 18, "caused to insert" should read -- inserted --;
Line 31, "counter part" should read -- counterpart --;
Line 34, "fully" should read -- full --; and
Line 66, "by" should be deleted.

Column 36,
Line 29, "by" should be deleted;
Line 50, "caused to insert" should read -- inserted --; and
Line 67, "time" should read -- times --.

Column 37,
Line 1, "partially" should read -- partial --;
Line 20, "in stead" should read -- instead --;
Line 33, "an" should be deleted;
Line 46, "ends" (both occurrences) should read -- end --;
Line 55, "pained" should read -- painted --.

Column 38,
Line 30, "by" should be deleted.

UNITED STATES PATENT AND TRADEMARK OFFICE
CERTIFICATE OF CORRECTION

PATENT NO. : 6,468,923 B1
DATED : October 22, 2002
INVENTOR(S) : Takao Yonehara et al.

It is certified that error appears in the above-identified patent and that said Letters Patent is hereby corrected as shown below:

Column 39,
Lines 1 and 48, "counter part" should read -- counterpart --;
Line 13, "outward" should read -- outwardly --;
Line 28, "microcabity" should read -- microcavity --;
Line 52, "fully" should read -- full --.

Column 40,
Line 41, "counter part" should read -- counterpart --; and
Line 44, "fully" should read -- full --.

Column 41,
Line 3, "by" should be deleted;
Lines 34 and 48, "undergoes" should read -- undergo --;
Line 37, "counter part" should read -- counterpart --; and
Line 40, "fully" should read -- full --.

Column 42,
Line 12, "by" should be deleted;
Line 34, "caused to insert" should read -- inserted --;
Line 49, "counter part" should read -- counterpart --; and
Line 52, "fully" should read -- full --.

Column 43,
Line 13, "by" should be deleted;
Line 25, "oxidiation" should read -- oxidization --; and "thick" should read -- thickness --;
Line 47, "counter part" should read -- counterpart --;
Line 50, "fully" should read -- full --;
Line 56, "In stead" should read -- Instead --;
Line 57, "rolycrystalline" should read -- polycrystalline --; and "micron" should read --microns--;
Line 58, "micron" should read -- microns --; and
Line 66, "by" should be deleted.

UNITED STATES PATENT AND TRADEMARK OFFICE
CERTIFICATE OF CORRECTION

PATENT NO. : 6,468,923 B1
DATED : October 22, 2002
INVENTOR(S) : Takao Yonehara et al.

It is certified that error appears in the above-identified patent and that said Letters Patent is hereby corrected as shown below:

Column 44,
Lines 14 and 64, "thick" should read -- thickness --;
Line 45, "counter part" should read -- counterpart --;
Line 48, "fully" should read -- full --;
Line 49, "above" should read -- above- --; and
Line 59, "underwent" should read -- having undergone --.

Column 45,
Line 15, "highly" should read -- high --;
Line 17, "approximate" should read -- approximately --;
Line 26, "by" should be deleted;
Line 48, "become" should read -- became --;
Line 52, "with" should be deleted;
Line 57, "to" (first occurrence) should be deleted; and
Line 63, "in" should read -- after --.

Column 46,
Line 12, "in" should read -- after --;
Line 26, "Si" should read -- Si substrate --; and "by" should be deleted;
Line 40, "thick," should read -- thickness, --;
Line 41, "by" should be deleted, and
Line 44, "thick" should read -- thickness --.

Column 47,
Lines 5 and 21, "In stead" should read -- Instead --;
Line 6, "produces" should read -- produce --; and
Line 7, "partially" should read -- partial --.

Column 48,
Line 14, "by" should be deleted;
Line 29, "Incidently," should read -- Incidentally, --;
Line 33, "exidation" should read -- oxidation --; and "thick" should read -- thickness --;
Line 56, "s" should read -- as --; and
Line 59, "remained" should read -- remaining --.

UNITED STATES PATENT AND TRADEMARK OFFICE
CERTIFICATE OF CORRECTION

PATENT NO. : 6,468,923 B1
DATED : October 22, 2002
INVENTOR(S) : Takao Yonehara et al.

It is certified that error appears in the above-identified patent and that said Letters Patent is hereby corrected as shown below:

Column 49,
Line 18, "an" should read -- a --;
Line 19, "micron." should read -- microns. --;
Line 23, "by" should be deleted;
Line 41, "thick" should read -- thickness --; and
Line 66, "Incidently," should read -- Incidentally, --.

Column 50,
Line 64, "second-member" should read -- second member --.

Column 51,
Line 29, "layer different in" should read -- layer, the second semiconductor layer having a different --;
Line 30, "type from" should read -- type as compared to --;
Line 31, "layer in this order" should read -- layer, and in this order, --; and
Line 35 and 54, "thereby" should read -- therein --.

Column 52,
Line 2, "layer different in" should read -- layer, the second semiconductor layer having a different impurity --;
Line 3, "or conductivity type from" should read -- and/or conductivity type as compared to --;
Line 4, "layer" should read -- layer, and --;
Line 5, "side;" should read -- side --; and
Line 66, "an" should read -- a --.

Signed and Sealed this

Twenty-first Day of October, 2003

JAMES E. ROGAN
*Director of the United States Patent and Trademark Office*